United States Patent
Kozaki et al.

(10) Patent No.: US 7,496,124 B2
(45) Date of Patent: Feb. 24, 2009

(54) NITRIDE SEMICONDUCTOR LASER DEVICE

(75) Inventors: Tokuya Kozaki, Anan (JP); Masahiko Sano, Anan (JP); Shuji Nakamura, Anan (JP); Shinichi Nagahama, Anan (JP)

(73) Assignee: Nichia Corporation, Tokushima (JP)

( * ) Notice: Subject to any disclaimer, the term of this patent is extended or adjusted under 35 U.S.C. 154(b) by 172 days.

(21) Appl. No.: 11/287,339

(22) Filed: Nov. 28, 2005

(65) Prior Publication Data

US 2006/0078022 A1    Apr. 13, 2006

Related U.S. Application Data

(62) Division of application No. 10/700,270, filed on Nov. 4, 2003, now Pat. No. 7,015,053, which is a division of application No. 09/519,440, filed on Mar. 3, 2000, now Pat. No. 6,711,191.

(30) Foreign Application Priority Data

| Mar. 4, 1999 | (JP) | ................................ P 11-057211 |
| Jun. 4, 1999 | (JP) | ................................ P 11-157646 |
| Jun. 10, 1999 | (JP) | ................................ P 11-163499 |
| Jun. 10, 1999 | (JP) | ................................ P 11-163500 |

(51) Int. Cl.
*H01S 3/04* (2006.01)
*H01S 3/14* (2006.01)

(52) U.S. Cl. ........................................ 372/39; 372/43.01

(58) Field of Classification Search .................. 372/39, 372/43.01, 45.01, 50.1

See application file for complete search history.

(56) References Cited

U.S. PATENT DOCUMENTS 3,566,215 A    2/1971 Heywang ..................... 317/235

(Continued)

FOREIGN PATENT DOCUMENTS

CA    1325582    12/1993

(Continued)

OTHER PUBLICATIONS

Nakamura et al., "Continuous-wave operation of InGaN/GaN/AlGaN-based laser diodes grown on GaN substrates", Applied Physics Letters, vol. 72, No. 16, Apr. 20, 1998, pp. 2014-2016.

(Continued)

*Primary Examiner*—Armando Rodriguez
(74) *Attorney, Agent, or Firm*—Nixon & Vanderhye P.C.

(57) ABSTRACT

A nitride semiconductor laser device has an improved stability of the lateral mode under high output power and a longer lifetime, so that the device can be applied to write and read light sources for recording media with high capacity. The nitride semiconductor laser device includes an active layer, a p-side cladding layer, and a p-side contact layer laminated in turn. The device further includes a waveguide region of a stripe structure formed by etching from the p-side contact layer. The stripe width provided by etching is within the stripe range of 1 to 3 μm and the etching depth is below the thickness of the p-side cladding layer of 0.1 μm and above the active layer. Particularly, when a p-side optical waveguide layer includes a projection part of the stripe structure and a p-type nitride semiconductor layer on the projection part and the projection part of the p-side optical waveguide layer has a thickness of not more than 1 μm, an aspect ratio is improved in far field image. Moreover, the thickness of the p-side optical waveguide layer is greater than that of an n-side optical waveguide layer.

8 Claims, 14 Drawing Sheets

U.S. PATENT DOCUMENTS

| | | | |
|---|---|---|---|
| 3,593,191 A | 7/1971 | Henker | 331/94.5 |
| 3,655,439 A | 4/1972 | Seiter | 117/212 |
| 3,658,585 A | 4/1972 | Folkmann et al. | 117/201 |
| 3,704,427 A | 11/1972 | Heywang | 331/94.5 |
| 3,705,567 A | 12/1972 | Emels | 118/49 |
| 3,737,737 A | 6/1973 | Heywang et al. | 317/234 R |
| 3,747,559 A | 7/1973 | Dietze | 118/48 |
| 3,793,984 A | 2/1974 | Kasper et al. | 118/48 |
| 3,819,974 A | 6/1974 | Stevenson et al. | 313/499 |
| 3,853,974 A | 12/1974 | Reuschel et al. | 264/81 |
| 3,941,647 A | 3/1976 | Druminski | 156/612 |
| 3,948,693 A | 4/1976 | Weyrich et al. | 148/171 |
| 3,963,537 A | 6/1976 | Kniepkamp et al. | 148/175 |
| 3,965,347 A | 6/1976 | Heywang | 250/211 J |
| 3,974,561 A | 8/1976 | Schnoeller | 29/611 |
| 4,020,791 A | 5/1977 | Reuschel et al. | 118/49.1 |
| 4,062,035 A | 12/1977 | Winstel | 357/17 |
| 4,098,223 A | 7/1978 | Ertl et al. | 118/48 |
| 4,102,298 A | 7/1978 | Dietze et al. | 118/5 |
| 4,108,539 A | 8/1978 | Gort et al. | 350/201 |
| 4,113,381 A | 9/1978 | Epstein | 356/5 |
| 4,133,702 A | 1/1979 | Krimmel | 148/1.5 |
| 4,140,546 A | 2/1979 | Krimmel | 148/1.5 |
| 4,154,625 A | 5/1979 | Golovchenko et al. | 148/1.5 |
| 4,170,018 A | 10/1979 | Runge | 357/17 |
| 4,261,770 A | 4/1981 | Splittgerber et al. | 148/171 |
| 4,351,695 A | 9/1982 | Hieber et al. | 156/603 |
| 4,404,265 A | 9/1983 | Manasevit | 428/689 |
| 4,410,993 A | 10/1983 | Zschauer | 372/44 |
| 4,423,349 A | 12/1983 | Nakajima et al. | 313/487 |
| 4,505,765 A | 3/1985 | Trommer | 148/171 |
| 4,521,448 A | 6/1985 | Sasaki | 427/88 |
| 4,531,142 A | 7/1985 | Weyrich et al. | 357/17 |
| 4,568,206 A | 2/1986 | Imazaike | 384/530 |
| 4,596,998 A | 6/1986 | Krimmel | 357/17 |
| 4,599,244 A | 7/1986 | Falckenberg et al. | 427/74 |
| 4,599,245 A | 7/1986 | Falckenberg et al. | 427/74 |
| 4,604,637 A | 8/1986 | Ruhle et al. | 357/17 |
| 4,615,766 A | 10/1986 | Jackson et al. | 156/662 |
| 4,647,953 A | 3/1987 | Okajima et al. | |
| 4,656,636 A | 4/1987 | Amann et al. | 372/50 |
| 4,661,175 A | 4/1987 | Kuphal et al. | 148/171 |
| 4,670,093 A | 6/1987 | Maerz et al. | 156/649 |
| 4,682,337 A | 7/1987 | Amann | 372/44 |
| 4,683,574 A | 7/1987 | Heinen | 372/44 |
| 4,722,088 A | 1/1988 | Wolf | 372/44 |
| 4,740,259 A | 4/1988 | Heinen | 156/234 |
| 4,742,525 A | 5/1988 | Heinen et al. | 372/44 |
| 4,744,088 A | 5/1988 | Heinen et al. | 372/50 |
| 4,746,195 A | 5/1988 | Auracher et al. | 350/320 |
| 4,763,979 A | 8/1988 | Heywang | 350/96.2 |
| 4,768,199 A | 8/1988 | Heinen et al. | 372/36 |
| 4,792,200 A | 12/1988 | Amann et al. | 350/96.12 |
| 4,792,959 A | 12/1988 | Mueller et al. | 372/46 |
| 4,818,722 A | 4/1989 | Heinen | 437/129 |
| 4,829,188 A | 5/1989 | Shinomiya et al. | 250/483.1 |
| 4,835,575 A | 5/1989 | Plihal | 357/30 |
| 4,841,344 A | 6/1989 | Heinen | 357/17 |
| 4,845,723 A | 7/1989 | Heinen et al. | 372/38 |
| 4,855,118 A | 8/1989 | Ichinose et al. | 423/301 |
| 4,859,903 A | 8/1989 | Minematu et al. | 313/487 |
| 4,864,369 A | 9/1989 | Snyder et al. | 357/17 |
| 4,869,568 A | 9/1989 | Schimpe | 350/96.12 |
| 4,890,033 A | 12/1989 | Ichinomiya et al. | 313/487 |
| 4,904,617 A | 2/1990 | Muschke | 437/129 |
| 4,904,618 A | 2/1990 | Neumark | 437/150 |
| 4,907,044 A | 3/1990 | Schellhorn et al. | 357/17 |
| 4,907,534 A | 3/1990 | Huang et al. | 118/725 |
| 4,911,102 A | 3/1990 | Manabe et al. | 118/719 |
| 4,918,497 A | 4/1990 | Edmond | 357/17 |
| 4,929,907 A | 5/1990 | Berkel | 330/252 |
| 4,944,837 A | 7/1990 | Nishikawa et al. | 156/646 |
| 4,945,394 A | 7/1990 | Palmour et al. | 357/34 |
| 4,946,547 A | 8/1990 | Palmour et al. | 156/643 |
| 4,947,218 A | 8/1990 | Edmond et al. | 357/13 |
| 4,959,174 A | 9/1990 | Nakajima et al. | 252/301.6 R |
| 4,960,728 A | 10/1990 | Schaake et al. | 437/82 |
| 4,966,862 A | 10/1990 | Edmond | 437/100 |
| 4,971,739 A | 11/1990 | Ichinose et al. | 264/61 |
| 4,977,567 A | 12/1990 | Hanke | 372/45 |
| 4,982,314 A | 1/1991 | Miki | 363/16 |
| 4,985,742 A | 1/1991 | Pankove | 357/34 |
| 4,987,576 A | 1/1991 | Heinen | 372/46 |
| 4,990,466 A | 2/1991 | Shieh et al. | 437/129 |
| 4,990,990 A | 2/1991 | Albrecht et al. | 357/30 |
| 5,005,057 A | 4/1991 | Izumiya et al. | 357/17 |
| 5,006,908 A | 4/1991 | Matsuoka et al. | 357/17 |
| 5,008,735 A | 4/1991 | Edmond et al. | 357/74 |
| 5,008,789 A | 4/1991 | Arai et al. | 362/255 |
| 5,019,746 A | 5/1991 | Merg | 313/512 |
| 5,023,686 A | 6/1991 | Helmut et al. | 357/30 |
| 5,027,168 A | 6/1991 | Edmond | 357/17 |
| 5,034,956 A | 7/1991 | Gessner et al. | 372/45 |
| 5,041,334 A | 8/1991 | Nakajima et al. | 428/407 |
| 5,042,043 A | 8/1991 | Hatano et al. | 372/45 |
| 5,045,896 A | 9/1991 | Ash et al. | 357/17 |
| 5,049,779 A | 9/1991 | Itsuki et al. | 313/486 |
| 5,061,972 A | 10/1991 | Edmond | 357/13 |
| 5,065,207 A | 11/1991 | Heinen | 357/30 |
| 5,065,402 A | 11/1991 | Kawano | |
| 5,077,145 A | 12/1991 | Shinomiya et al. | 428/691 |
| 5,093,576 A | 3/1992 | Edmond et al. | 250/370.01 |
| 5,119,540 A | 6/1992 | Kong et al. | 29/25.01 |
| 5,120,619 A | 6/1992 | Nakajima et al. | 428/690 |
| 5,122,845 A | 6/1992 | Manabe et al. | 357/17 |
| 5,128,955 A | 7/1992 | Danielmeyer | 372/94 |
| 5,146,465 A | 9/1992 | Khan et al. | 372/45 |
| 5,155,062 A | 10/1992 | Coleman | 437/100 |
| 5,171,370 A | 12/1992 | Reithmaier et al. | 118/726 |
| 5,182,670 A | 1/1993 | Khan et al. | 359/359 |
| 5,184,247 A | 2/1993 | Schimpe | 359/344 |
| 5,185,207 A | 2/1993 | Furuoka et al. | 428/404 |
| 5,200,022 A | 4/1993 | Kong et al. | 156/612 |
| 5,202,777 A | 4/1993 | Sluzky et al. | 359/50 |
| 5,205,905 A | 4/1993 | Kotaki et al. | 156/662 |
| 5,208,878 A | 5/1993 | Thulke | 385/14 |
| 5,210,051 A | 5/1993 | Carter, Jr. | 437/107 |
| 5,218,216 A | 6/1993 | Manabe et al. | 257/103 |
| 5,229,626 A | 7/1993 | Ebitani et al. | 257/84 |
| 5,233,204 A | 8/1993 | Fletcher et al. | 257/13 |
| 5,239,188 A | 8/1993 | Takeuchi et al. | 257/76 |
| 5,247,533 A | 9/1993 | Okazaki et al. | 372/45 |
| 5,250,366 A | 10/1993 | Nakajima et al. | 428/690 |
| 5,252,499 A | 10/1993 | Rothschild | 437/22 |
| 5,252,839 A | 10/1993 | Fouquet | 257/13 |
| 5,260,960 A | 11/1993 | Amann et al. | 372/46 |
| 5,264,713 A | 11/1993 | Palmour | 257/77 |
| 5,266,503 A | 11/1993 | Wang et al. | 437/24 |
| 5,270,554 A | 12/1993 | Palmour | 257/77 |
| 5,272,108 A | 12/1993 | Kozawa | 437/127 |
| 5,278,433 A | 1/1994 | Manabe et al. | 257/103 |
| 5,281,830 A | 1/1994 | Kotaki et al. | 257/86 |
| 5,290,393 A | 3/1994 | Nakamura | 156/613 |
| 5,306,662 A | 4/1994 | Nakamura et al. | 437/107 |
| 5,312,560 A | 5/1994 | Somatomo et al. | 252/301.4 S |
| 5,323,022 A | 6/1994 | Glass et al. | 257/77 |
| 5,330,791 A | 7/1994 | Aihara et al. | 427/215 |
| 5,334,277 A | 8/1994 | Nakamura | 117/102 |
| 5,336,080 A | 8/1994 | Sumitomo et al. | 428/407 |
| 5,338,944 A | 8/1994 | Edmond et al. | 257/76 |
| 5,341,390 A | 8/1994 | Yamada et al. | 372/45 |
| 5,343,316 A | 8/1994 | Morimoto et al. | 359/50 |
| 5,344,791 A | 9/1994 | Huang | 437/126 |
| 5,359,345 A | 10/1994 | Hunter | 345/102 |

| | | | | | | | |
|---|---|---|---|---|---|---|---|
| 5,363,390 | A | 11/1994 | Yang et al. ............... 372/22 | 5,724,373 | A | 3/1998 | Chang ................... 372/20 |
| 5,366,834 | A | 11/1994 | Yoneda et al. ............. 430/23 | 5,724,376 | A | 3/1998 | Kish, Jr. et al. ........... 372/96 |
| 5,369,289 | A | 11/1994 | Tamaki et al. ............. 257/99 | 5,727,014 | A | 3/1998 | Wang et al. ............... 372/96 |
| 5,376,303 | A | 12/1994 | Royce et al. .......... 252/301.4 R | 5,729,029 | A | 3/1998 | Rudaz ..................... 257/13 |
| 5,376,580 | A | 12/1994 | Kish et al. ............... 437/127 | 5,729,567 | A | 3/1998 | Nakagawa ................ 372/99 |
| 5,381,103 | A | 1/1995 | Edmond et al. ........... 324/753 | 5,733,796 | A | 3/1998 | Manabe et al. ........... 437/127 |
| 5,382,822 | A | 1/1995 | Stein ..................... 257/410 | 5,734,182 | A | 3/1998 | Nakamura et al. .......... 257/96 |
| 5,389,571 | A | 2/1995 | Takeuchi et al. ........... 437/133 | 5,739,552 | A | 4/1998 | Kimura et al. ............. 257/89 |
| 5,390,210 | A | 2/1995 | Fouquet et al. ............ 372/92 | 5,739,554 | A | 4/1998 | Edmond et al. ........... 257/103 |
| 5,393,993 | A | 2/1995 | Edmond et al. ............ 257/77 | 5,741,431 | A | 4/1998 | Shih ..................... 216/65 |
| 5,394,005 | A | 2/1995 | Brown et al. ............. 257/461 | 5,741,724 | A | 4/1998 | Ramdani et al. .......... 437/128 |
| 5,403,774 | A | 4/1995 | Shieh et al. .............. 437/129 | 5,742,133 | A | 4/1998 | Wilhelm et al. ........... 315/291 |
| 5,404,282 | A | 4/1995 | Klinke et al. .............. 362/249 | 5,747,832 | A | 5/1998 | Nakamura et al. ......... 257/103 |
| 5,408,120 | A | 4/1995 | Manabe et al. ............ 257/431 | 5,753,939 | A | 5/1998 | Sassa et al. ............... 257/94 |
| 5,409,859 | A | 4/1995 | Glass et al. ............... 437/187 | 5,758,951 | A | 6/1998 | Haitz .................... 362/259 |
| 5,416,342 | A | 5/1995 | Edmond et al. ............ 257/76 | 5,761,229 | A | 6/1998 | Baldwin et al. ............ 372/31 |
| 5,417,886 | A | 5/1995 | Tateiwa et al. ........ 252/301.4 R | 5,767,581 | A | 6/1998 | Nakamura et al. ......... 257/749 |
| 5,433,169 | A | 7/1995 | Nakamura ............... 117/102 | 5,771,254 | A | 6/1998 | Baldwin et al. ............ 372/31 |
| 5,433,533 | A | 7/1995 | Imazaike ................ 384/488 | 5,776,837 | A | 7/1998 | Palmour .................. 438/767 |
| 5,433,888 | A | 7/1995 | Okada et al. .......... 252/301.4 R | 5,777,350 | A | 7/1998 | Nakamura et al. .......... 257/96 |
| 5,435,938 | A | 7/1995 | Bando et al. ......... 252/301.4 S | 5,777,433 | A | 7/1998 | Lester et al. .............. 313/512 |
| 5,438,198 | A | 8/1995 | Ebitani et al. ............. 250/330 | 5,779,924 | A | 7/1998 | Krames et al. ............ 216/24 |
| 5,459,107 | A | 10/1995 | Palmour ................. 437/238 | 5,780,120 | A | 7/1998 | Belouet et al. ............ 427/554 |
| 5,465,249 | A | 11/1995 | Cooper, Jr. et al. ......... 365/149 | 5,780,876 | A | 7/1998 | Hata |
| 5,467,291 | A | 11/1995 | Fan et al. ................. 364/578 | 5,785,404 | A | 7/1998 | Wiese .................... 362/32 |
| 5,468,678 | A | 11/1995 | Nakamura et al. ......... 437/107 | 5,793,054 | A | 8/1998 | Nido ..................... 257/18 |
| 5,475,241 | A | 12/1995 | Harrah et al. .............. 257/99 | 5,793,062 | A | 8/1998 | Kish, Jr. et al. ............. 257/98 |
| 5,497,012 | A | 3/1996 | Moll ..................... 257/183 | 5,805,624 | A | 9/1998 | Yang et al. ................ 372/45 |
| 5,502,316 | A | 3/1996 | Kish et al. ................ 257/94 | 5,808,323 | A | 9/1998 | Spaeth et al. .............. 257/88 |
| 5,506,421 | A | 4/1996 | Palmour .................. 257/77 | 5,808,592 | A | 9/1998 | Mizutani et al. ............ 345/83 |
| 5,511,084 | A | 4/1996 | Amann ................... 372/20 | 5,809,050 | A | 9/1998 | Baldwin et al. ............ 372/43 |
| 5,514,627 | A | 5/1996 | Lowery et al. ............. 437/209 | 5,811,319 | A | 9/1998 | Koike et al. ............... 438/46 |
| 5,523,018 | A | 6/1996 | Okada et al. .......... 252/301.4 P | 5,811,931 | A | 9/1998 | Mueller-Mach et al. ..... 313/512 |
| 5,523,589 | A | 6/1996 | Edmond et al. ............ 257/77 | 5,812,105 | A | 9/1998 | Van De Ven ............... 345/83 |
| 5,539,217 | A | 7/1996 | Edmond et al. ............ 257/77 | 5,812,570 | A | 9/1998 | Spaeth .................... 372/36 |
| 5,563,422 | A | 10/1996 | Nakamura et al. .......... 257/13 | 5,814,870 | A | 9/1998 | Spaeth ................... 257/433 |
| 5,578,839 | A | 11/1996 | Nakamura et al. .......... 257/96 | 5,818,861 | A | 10/1998 | Tan et al. ................. 372/46 |
| 5,583,879 | A | 12/1996 | Yamazaki et al. ........... 372/45 | 5,828,684 | A | 10/1998 | Van De Walle ............. 372/45 |
| 5,585,648 | A | 12/1996 | Tischler .................. 257/77 | 5,831,288 | A | 11/1998 | Singh et al. ............... 257/77 |
| 5,587,593 | A | 12/1996 | Koide et al. ............... 257/94 | 5,835,514 | A | 11/1998 | Yuen et al. ................ 372/36 |
| 5,592,501 | A | 1/1997 | Edmond et al. ............ 372/45 | 5,835,522 | A | 11/1998 | King et al. ................ 372/97 |
| 5,592,578 | A | 1/1997 | Ruh ..................... 385/31 | 5,837,561 | A | 11/1998 | Kish, Jr. et al. ............. 438/47 |
| 5,596,595 | A | 1/1997 | Tan et al. ................. 372/96 | 5,838,706 | A | 11/1998 | Edmond et al. ............ 372/45 |
| 5,604,135 | A | 2/1997 | Edmond et al. ............ 437/22 | 5,838,707 | A | 11/1998 | Ramdani et al. ........... 372/45 |
| 5,604,763 | A | 2/1997 | Kato et al. ................ 372/45 | 5,838,708 | A | 11/1998 | Lin et al. ................. 372/50 |
| 5,612,260 | A | 3/1997 | Palmour .................. 437/238 | 5,841,156 | A | 11/1998 | Kajikawa et al. |
| 5,614,736 | A | 3/1997 | Neumann et al. ........... 257/102 | 5,846,844 | A | 12/1998 | Akasaki et al. ............. 437/21 |
| 5,616,177 | A | 4/1997 | Yamada .................. 117/102 | 5,847,507 | A | 12/1998 | Butterworth et al. ........ 313/512 |
| 5,620,557 | A | 4/1997 | Manabe et al. ............ 438/507 | 5,850,410 | A | 12/1998 | Kuramata ................ 372/43 |
| 5,621,749 | A | 4/1997 | Baney .................... 372/69 | 5,855,924 | A | 1/1999 | Lumbard .................. 425/116 |
| 5,625,202 | A | 4/1997 | Chai ..................... 257/94 | 5,858,277 | A | 1/1999 | Chau et al. ............ 252/301.4 F |
| 5,627,244 | A | 5/1997 | Sato ...................... 526/92 | 5,859,496 | A | 1/1999 | Murazaki et al. ........... 313/485 |
| 5,629,531 | A | 5/1997 | Palmour .................. 257/77 | 5,861,190 | A | 1/1999 | Greene et al. ............ 427/248.1 |
| 5,631,190 | A | 5/1997 | Negley ................... 438/33 | 5,861,713 | A | 1/1999 | Kondo et al. ............. 313/495 |
| 5,635,146 | A | 6/1997 | Singh et al. ............... 423/65 | 5,862,167 | A | 1/1999 | Sassa et al. ................ 372/45 |
| 5,642,375 | A | 6/1997 | King et al. ................ 372/97 | 5,866,440 | A | 2/1999 | Hata |
| 5,650,641 | A | 7/1997 | Sassa et al. ................ 257/88 | 5,867,516 | A | 2/1999 | Corzine et al. ............. 372/45 |
| 5,652,434 | A | 7/1997 | Nakamura et al. .......... 257/13 | 5,868,837 | A | 2/1999 | Disalvo et al. ............. 117/952 |
| 5,652,438 | A | 7/1997 | Sassa et al. ................ 257/94 | 5,877,558 | A | 3/1999 | Nakamura et al. ......... 257/749 |
| 5,656,832 | A | 8/1997 | Ohba et al. ............... 257/190 | 5,879,587 | A | 3/1999 | Yale .................... 252/301.45 |
| 5,659,568 | A | 8/1997 | Wang et al. ............... 372/96 | 5,879,588 | A | 3/1999 | Yale .................... 252/301.45 |
| 5,661,074 | A | 8/1997 | Tischler .................. 438/32 | 5,880,486 | A | 3/1999 | Nakamura et al. .......... 257/96 |
| 5,661,316 | A | 8/1997 | Kish, Jr. et al. ............. 257/190 | 5,889,802 | A | 3/1999 | Walker ................... 372/31 |
| 5,661,742 | A | 8/1997 | Huang et al. .............. 372/46 | 5,889,806 | A | 3/1999 | Nagai et al. ............... 372/45 |
| 5,670,798 | A | 9/1997 | Schetzina ................. 257/96 | 5,892,784 | A | 4/1999 | Tan et al. ................. 372/43 |
| 5,679,153 | A | 10/1997 | Dmitriev et al. ............ 117/106 | 5,892,787 | A | 4/1999 | Tan et al. ................. 372/96 |
| 5,684,623 | A | 11/1997 | King et al. ................ 359/346 | 5,900,650 | A | 5/1999 | Nitta ..................... 257/94 |
| 5,686,737 | A | 11/1997 | Allen ..................... 257/77 | 5,905,276 | A | 5/1999 | Manabe et al. ............ 257/103 |
| 5,700,713 | A | 12/1997 | Yamazaki et al. ........... 437/129 | 5,907,151 | A | 5/1999 | Gramann et al. .......... 250/214.1 |
| 5,707,139 | A | 1/1998 | Haitz .................... 362/231 | 5,912,477 | A | 6/1999 | Negley ................... 257/95 |
| 5,718,760 | A | 2/1998 | Carter et al. ............... 117/84 | 5,917,202 | A | 6/1999 | Haitz et al. ............... 257/98 |
| 5,719,409 | A | 2/1998 | Singh et al. ............... 257/77 | 5,919,422 | A | 7/1999 | Yamanaka et al. .......... 422/121 |
| 5,724,062 | A | 3/1998 | Hunter ................... 345/102 | 5,920,766 | A | 7/1999 | Floyd .................... 438/35 |

| | | | |
|---|---|---|---|
| 5,923,053 A | 7/1999 | Jakowetz et al. ............... 257/95 |
| 5,923,118 A | 7/1999 | Jennato et al. ............... 313/485 |
| 5,923,690 A | 7/1999 | Kume et al. .................... 372/46 |
| 5,923,946 A | 7/1999 | Negley ............................ 438/4 |
| 5,925,898 A | 7/1999 | Spath ............................ 257/98 |
| 5,927,995 A | 7/1999 | Chen et al. .................. 438/517 |
| 5,935,705 A | 8/1999 | Chen et al. .................. 428/367 |
| 5,936,985 A | 8/1999 | Yamamoto et al. ............. 372/38 |
| 5,945,689 A | 8/1999 | Koike et al. .................... 257/88 |
| 5,953,361 A | 9/1999 | Borchert et al. ............... 372/96 |
| 5,953,581 A | 9/1999 | Yamasaki et al. .............. 438/22 |
| 5,958,295 A | 9/1999 | Yale ...................... 252/301.4 S |
| 5,959,307 A | 9/1999 | Nakamura et al. |
| 5,959,316 A | 9/1999 | Lowery ......................... 257/98 |
| 5,959,401 A | 9/1999 | Asami et al. ................. 313/503 |
| 5,964,943 A | 10/1999 | Stein et al. ..................... 117/88 |
| 5,966,393 A | 10/1999 | Hide et al. ...................... 372/23 |
| 5,968,265 A | 10/1999 | Stein et al. ..................... 117/71 |
| 5,969,378 A | 10/1999 | Singh ............................ 257/77 |
| 5,972,781 A | 10/1999 | Wegleiter et al. ............ 438/460 |
| 5,972,801 A | 10/1999 | Lipkin et al. ................. 438/770 |
| 5,973,336 A | 10/1999 | Hanke et al. ................... 257/94 |
| 5,980,631 A | 11/1999 | Tews et al. ..................... 117/89 |
| 5,981,945 A | 11/1999 | Spaeth et al. ................. 250/239 |
| 5,981,979 A | 11/1999 | Brunner ........................ 257/99 |
| 5,982,970 A | 11/1999 | Schneider ................... 385/125 |
| 5,986,317 A | 11/1999 | Wiese ......................... 257/433 |
| 5,990,496 A | 11/1999 | Kunisato et al. |
| 5,991,160 A | 11/1999 | Lumbard ..................... 361/760 |
| 5,994,722 A | 11/1999 | Averbeck et al. .............. 257/89 |
| 5,998,925 A | 12/1999 | Shimizu et al. .............. 313/503 |
| 5,999,552 A | 12/1999 | Bogner et al. ................. 372/43 |
| 6,072,818 A | 6/2000 | Hayakawa |
| 6,172,382 B1 | 1/2001 | Nagahama et al. |
| 6,252,894 B1 | 6/2001 | Sasanuma et al. |
| 6,377,597 B1 | 4/2002 | Okumura |
| 6,555,403 B1 * | 4/2003 | Domen et al. ................. 438/22 |
| 6,597,716 B1 | 7/2003 | Takatani |

FOREIGN PATENT DOCUMENTS

| | | |
|---|---|---|
| DE | 196 48 955 A1 | 5/1997 |
| EP | 0356059 A2 | 2/1990 |
| EP | 0356059 A3 | 2/1990 |
| EP | 0380340 A2 | 8/1990 |
| EP | 0380340 A3 | 8/1990 |
| EP | 0637069 A1 | 2/1995 |
| EP | 0731512 A2 | 9/1996 |
| EP | 0 772 249 | 5/1997 |
| EP | 0731512 A3 | 7/1997 |
| EP | 0781619 A1 | 7/1997 |
| EP | 0871208 A2 | 10/1998 |
| EP | 0880181 A2 | 11/1998 |
| EP | 0871208 A3 | 12/1998 |
| EP | 0880181 A3 | 1/1999 |
| EP | 0905799 A2 | 3/1999 |
| EP | 0936682 A1 | 8/1999 |
| EP | 1 017 113 A1 | 7/2000 |
| FR | 2613136 | 9/1988 |
| GB | 2322737 A | 3/1998 |
| GB | 2323210 A | 9/1998 |
| JP | 1-184973 | 7/1989 |
| JP | 04144294 | 5/1992 |
| JP | 4-159789 | 6/1992 |
| JP | 05152609 | 6/1993 |
| JP | 0766192 | 3/1995 |
| JP | 7176794 | 7/1995 |
| JP | 7240560 | 9/1995 |
| JP | 8-97502 | 4/1996 |
| JP | 1064854 | 7/1996 |
| JP | 8-293643 | 11/1996 |
| JP | 8-316528 | 11/1996 |
| JP | 9-36430 | 2/1997 |
| JP | 10233529 | 2/1997 |
| JP | 9-148678 | 6/1997 |
| JP | 9-199798 | 7/1997 |
| JP | 09180998 | 7/1997 |
| JP | 09193137 | 7/1997 |
| JP | 9-214051 | 8/1997 |
| JP | 9-232685 | 9/1997 |
| JP | 9-237935 | 9/1997 |
| JP | 09-246651 | 9/1997 |
| JP | 09246651 | 9/1997 |
| JP | 9-266351 | 10/1997 |
| JP | 9-266352 | 10/1997 |
| JP | 09260772 | 10/1997 |
| JP | 09293935 | 11/1997 |
| JP | 10-12922 | 1/1998 |
| JP | 10-32349 | 2/1998 |
| JP | 10-65213 | 3/1998 |
| JP | 10-65271 | 3/1998 |
| JP | 10-75008 | 3/1998 |
| JP | 10-84132 | 3/1998 |
| JP | 10-144612 | 5/1998 |
| JP | 10-223983 | 8/1998 |
| JP | 10-229217 | 8/1998 |
| JP | 10-242512 | 9/1998 |
| JP | 10-242559 | 9/1998 |
| JP | 10-242585 | 9/1998 |
| JP | 10242565 | 9/1998 |
| JP | 10256645 | 9/1998 |
| JP | 10270792 | 10/1998 |
| JP | 10290027 | 10/1998 |
| JP | 10294529 | 11/1998 |
| JP | 10-326943 | 12/1998 |
| JP | 10-335757 | 12/1998 |
| JP | 10321962 | 12/1998 |
| JP | 11-008410 | 1/1999 |
| JP | 11040893 | 2/1999 |
| JP | 11-74621 | 3/1999 |
| JP | 11-251685 | 9/1999 |
| JP | 11-307866 | 11/1999 |
| JP | 11-330552 | 11/1999 |
| JP | 2000-31599 | 1/2000 |
| JP | 2002-124736 | 4/2002 |
| WO | WO9702478 A1 | 1/1997 |
| WO | WO9702610 A1 | 1/1997 |
| WO | WO9717730 A1 | 5/1997 |
| WO | WO9727629 A1 | 7/1997 |
| WO | WO9739485 A1 | 10/1997 |
| WO | WO9750132 A1 | 12/1997 |
| WO | WO9805078 A1 | 2/1998 |
| WO | WO9812757 A1 | 3/1998 |
| WO | WO9834304 A1 | 8/1998 |
| WO | WO9837586 A1 | 8/1998 |
| WO | WO98/39827 | 9/1998 |
| WO | WO98/44606 | 10/1998 |
| WO | WO9842879 A1 | 10/1998 |
| WO | WO9842897 A1 | 10/1998 |
| WO | WO9847185 A1 | 10/1998 |
| WO | WO9849731 A1 | 11/1998 |
| WO | WO9857378 A1 | 12/1998 |
| WO | WO9910936 A2 | 3/1999 |
| WO | WO9910936 A3 | 3/1999 |
| WO | WO9918617 A1 | 4/1999 |

OTHER PUBLICATIONS

Eliseev et al., "Analysis of the Mode Internal Coupling in InGaAs/GaAs Laser Diodes", Laser Physics, vol. 4, No. 3, 1994, pp. 485-492.

Mukai et al., "Characteristics of InGaN-Based UV/Blue/Green/Amber/Red Light-Emitting Diodes", Japanese Journal of Applied Physics, vol. 38, No. 7, pp. 3976-3981, Jul. 1999.

Im et al., "Carrier confinement in GaInN/AlGaN/GaN quantum wells with asymmetric barriers: direction of the piezoelectric field", Materials Science and Engineering, vol. B59, Nos. 1-3, pp. 315-318, May 6, 1999.

"InGaN/GaN/AlGaN-based laser diodes with modulation-doped strained-layer superlattices grown on an epitaxially laterally overgrown GaN substrate," Shuji Nakamura et al., Applied Physics Letter, vol. 72, No. 2, Jan. 12, 1998.

"Novel Metalorganic Chemical Vapor Deposition System for GaN Growth," S. Nakamura, American Institute of Physics, pp. 2021-2023, May 6, 1991.

"Out of the Blue," Forbes Global Magazine, pp. 66-71, Sep. 6, 1999.

"Nitride PN Junctions Grown on SiC Substrates," V.A. Dmitriev, Inst. Phys. Conf., pp. 1019-1022, 1996.

"AlGaN PN Junctions," V.A. Dmitriev, American Inst. of Physics, pp. 115-117, May 11, 1995.

"Effects of Ar Ion Laser Irradiation on MOVPE of ZnSe using DMZn and DMSe as Reactants," A. Yoshikawa, Journal of Crystal Growth, pp. 653-658, 1991.

"Electric Breakdown in GaN P-N Junctions," V.A. Dmitriev, American Inst. of Physics, pp. 229-231, Jan. 8, 1996.

"High Quality GaN Grown Directly on SiC by Halide Vapour Phase Epitaxy," Y.V. Melnik, Inst. Phys. Conf., pp. 863-866, 1996.

"Luminescence Conversion of Blue Light Emitting Diodes," P. Schlotter, Journal of Applied Physics, pp. 12-13, Feb. 27, 1997.

"P-Type Conduction in Mg-Doped GaN Treated with Low-Energy Electron Beam Irradiation (LEEBI)," H. Amano, Japanese Journal of Applied Physics, pp. 2112-2114, Dec. 1989.

"Photoluminescence of Mg-Doped P-Type GaN and Electroluminescence of GaN P-N Junction Led," I. Akasaki, Journal of Luminescence vol. 48-49, pp. 666-670, 1991.

"Recent Progress in AlGaN/GaN Laser Structures on 6H-SiC," G.E. Bulman, SPIE vol. 2693, pp. 57-63, 1996.

"Recent Progress in GaN/SiC LEDs and Photopumped Lasers," G.E. Bulman, pp. 100-101, 19xx.

"Role of Growth Initiation for High-Brightness GaN-Based Light Emitting Diodes," R.S. Kern, 2nd. Intern. Symp. on Blue Laser and Light Emitting Diodes, Chiba, Japan, Sep. 29-Oct. 2, 1998.

"The State of SiC: GaN-Based Blue LEDs," J. Edmond, Inst. Phys. Conf. Ser. No. 142, Chap. 6, pp. 991-994, 1996.

"Wide Bandgap Group-III Nitride Optoelectronics," http://www.phy.duke.edu/research/photon/terahertz/gan/index.html.

"White LED Production at Osram," G. Bogner, Compound Semiconductor, pp. 28-31, May 1999.

Nakamura et al., "InGaN-Based Multi-Quantum-Well-Structure Laser Diodes", Jpn. J. Appl. Phys. vol. 35, No. 1B, pp. L74-L75, Jan. 15, 1996.

US 5,961,723, 10/1999, Roithner et al. (withdrawn)

* cited by examiner

NITRIDE SEMICONDUCTOR LASER DEVICE

This application is a divisional of application Ser. No. 10/700,270, filed Nov. 4, 2003, now U.S. Pat. No. 7,015,053 which is a divisional of U.S. application Ser. No. 09/519,440, filed Mar. 3, 2000, now U.S. Pat. No. 6,711,191, the entire contents of which are hereby incorporated by reference in this application.

TECHNICAL FIELD OF THE INVENTION

This invention relates to a nitride semiconductor laser device and particularly, to a laser device having an effective refractive index type narrow stripe ridge structure, which is used in an optical information processing field and can realize a continuous-wave operation at a high power without a kink.

BACKGROUND OF THE INVENTION

As the information-oriented society has developed in recent years, a $\phi$ device which can store a large amount of information has been required. Particularly, the layer light source having a short wavelength is longed for as a light source for a large amount media such as DVD and as a light source for communication. The applicators reported a nitride semiconductor layer device having a lifetime of ten thousand hours or more under room-temperature continuous-wave operation of in the single mode at the wavelength of 403.7 nm.

As mentioned above, the next problem the nitride semiconductor device which can realize continuous-wave oscillation is to raise the power of the device, in order to put the device to practical use and expand the application fields. And a longer lifetime of stable continuos-wave oscillation must be realized.

Particularly, the semiconductor laser device which is used as a light source for the mass storage optical disk such as DVD requires sufficient optical power to enable recording and regenerating. And in such a semiconductor layer device, the stable lateral mode of oscillation is required. Concretely, the oscillation at 5 mW and 30 mW is required as optical power during recording and regenerating. And under such an oscillation, there is needed no kink in the electric current—optical power characteristics.

However, when the injection current into the laser device is increased and the optical power is increased, there is generally a kink due to the instability of the lateral mode, subsequently to the linear region after the initiation of oscillation, in the current—optical power characteristics. In order to put the laser device to practical use, the stable basic single lateral mode without a kink must be achieved in the optical power region of from the initiation of oscillation to 30 mW and further, a longer lifetime of oscillation must be achieved.

DISCLOSURE OF THE INVENTION

In view of the above-mentioned problems, the first object of the present invention is to provide a semiconductor laser device in which the stable lateral mode of the basic oscillation mode can be achieved in the region of from relatively low optical power to the high optical power and there is no kink in the current-optical power characteristics in such a region. The object can be accomplished by the effective refractive index type nitride semiconductor laser device comprising an active layer and at least a p-side cladding layer and a p-side contact layer which are laminated in turn on the active layer, wherein the waveguide region of a stripe structure is provided by etching from the p-side contact layer to above the active layer, characterized in that the stripe width providing by etching is within the narrow stripe range of 1 to 3 μm and the etching depth is above the active layer and below the remaining thickness of the p-side cladding layer of 0.1 μm.

That is, according to the present invention, the waveguide having such stripe width and depth enables the basic mode emission having a stable lateral mode and there is no kink in the wide light output power range, resulting in a semiconductor laser device having a longer lifetime under continuous-wave operation.

Preferably, the insulating film other than Si oxide is formed on the both side surfaces of the stripe which has been exposed by said etching or the flat surface of the nitride semiconductor continuing with said side surfaces, and an electrode is formed on the p-side contact layer which is the uppermost layer of the stripe via said insulating film. Thereby, in such a nitride semiconductor laser device, the insulating property between the positive electrode and p-side cladding layer is improved and particularly, the light output power is enhanced. That is, the effect tends to be remarkable as the driving current increases. Therefore, the device having less leak current and a high reliability can be obtained.

Preferably, the stripe width is 1.2 to 2 μm. This nitride semiconductor device has a refractive index waveguide structure in which the lateral mode is stable in the high light output power region, for example, in the region exceeding 5 mW, therefore, a basic (single) mode emission is further improved to enable the emission without kink in the wide light output power range.

Concretely, said insulating film other than Si oxide may include at least one among an oxide containing at least one element selected from the group consisting of Ti, V, Zr, Nb, Hf and Ta, and SiN, BN, SiC and AlN. Said insulating film gives the device a high reliability.

The waveguide region having a stripe structure in this laser device is formed by the following steps, resulting in the nitride semiconductor laser device having a extremely good precision and a good yield. The method comprises a first step of laminating a p-side contact layer containing the second p-type nitride semiconductor on the p-side cladding layer containing the first p-type nitride semiconductor and thereafter, forming a first protective film in the stripe structure on the surface of the p-side contact layer; a second step of etching the nitride semiconductor in the part on which the first protective film is not formed via the protective film so as to form a waveguide region having a stripe structure just under the protective film; a third step of, after the second step, forming a second protective film made of the material other than that of the first protective film and having an insulating property on the side surface of the stripe waveguide and the flat surface of the nitride semiconductor layers which has been exposed by etching; and the fourth step of, after the third step, removing the first protective film. In this case, as mentioned below, the first protective film may be formed in the desired shape using the third protective film.

And in order to apply the laser device to the laser light source as mentioned above, it is needed to improve the properties, particularly optical properties of the laser device, that is, to improve the waveguide of the semiconductor laser, for example, to improve the aspect ratio and the far-field pattern and prevent the leakage of light. Concretely, said laser device having a longer lifetime is an effective refractive index waveguide type and it is needed to realize a high-precision control of the lateral mode. In the ridge waveguide structure, the effective refractive index changes depending on the etching depth, stripe height and the like. Such a structure change effects on the device properties extremely. Then, the second object of the present invention is to improve the beam shape, that is, the aspect ratio in the F.F.P (far-field pattern). If the laser device is applied to the optical disk system or the laser printer, the laser light is corrected and adjusted by each optical system. In this case, if the aspect ratio is large, the correction optical system is a large-scale one, therefore, the design, manufacturing and the loss via the optical system is a large problem. Further, for the nitride semiconductor light emitting device, the measures to control light leakage which has been a problem since a prior time is needed, because the light leakage appears as a ripple in the laser device and causes the problem of noise in the laser device application.

According to the present invention, the above-mentioned second object is accomplished by the effective refractive index type nitride semiconductor laser device comprising an active layer and at least a p-side optical waveguide layer, a p-side cladding layer and a p-side contact layer which are laminated on the active layer, wherein the waveguide region of a stripe structure is provided by etching from the p-side contact layer to above the active layer, characterized in that said p-side optical waveguide layer comprises a projection part of a narrow stripe structure and a p-type nitride semiconductor layer on the projection part and the projection part of the p-side optical waveguide layer has a thickness of not more than 1 µm.

Thus, the p-side optical waveguide layer having a thickness of not more than 1 µm comprises a projection part of a stripe structure and therefore, the horizontal lateral mode which has not yet realized can be controlled, with the result that the laser emission with a good aspect ratio can be obtained. That is, in this laser device, the laser emission of a good beam shape can be obtained under continuous-wave operation in the single mode. And since the projection part of the n-side optical waveguide layer and the p-type nitride semiconductor layer on the projection part is a stripe ridge waveguide formed by etching from the p-type nitride semiconductor layer, the ridge waveguide can be formed highly productively. And the etching depth is the p-side optical waveguide layer in this case, the laser emission of a beam shape can be obtained.

Preferably, the p-side optical waveguide layer in the projection part has a thickness in the range of not less than 1500 angstroms and not more than 4000 angstroms. This is because both the laser emission of a good beam shape and a good output property can be achieved at the same time. Concretely, for the beam shape, F.F.P. in the horizontal direction (x direction) is not less than 10° and good broadening can be achieved. The aspect ratio is within the range where the easy correction by means of the external optical system is possible, so as to make it easy to apply the laser device to optical information equipment.

Further, since the p-side optical waveguide layer has a thickness of not less than 500 angstroms and not more than 1000 angstroms in the region except the projection part, a good stripe waveguide region can be formed and the laser device of a good beam shape can be obtained highly productively. In this case, for the beam shape, F.F.P in the horizontal direction is within 12° to 20° and the aspect ratio is about 2.0 and moreover, about 1.5.

And since the stripe width of the projection part is within the range of not less than 1 µm and not more than 3 µm, the laser device is obtained in which good single lateral mode emission can be observed.

Further, since the height of the projection part in said p-side optical waveguide layer is not less than 100 angstroms, the laser device of a good beam shape can be obtained. Preferably, the height thereof is not less than 500 angstroms. Single mode emission can be observed even at a high output power. Therefore, enough reliability required for the application of the laser device can be secured.

And the p-side optical waveguide may be made of $In_xGa_{1-x}N$ ($0 \leq x<1$), thereby a good waveguide can be formed, resulting in a laser device having good device properties.

Further, viewed in another light, the optical waveguide layer is focused. The third object of the present invention is to provide a laser device of a good beam shape by making the thickness of the p-side optical waveguide layer different from that of the n-side optical waveguide layer.

That is, the third object of the invention is accomplished by the effective refractive index type nitride semiconductor laser device comprising an active layer and at least n- and p-side optical waveguide layers, n- and p-side cladding layers and n- and p-side contact layers which are laminated respectively on both sides of the active layer, wherein the waveguide region of a stripe structure is provided by etching from the p-side contact layer to above the active layer, characterized in that the thickness of said p-side optical waveguide layer is larger than that of the n-side optical waveguide layer.

According to the present invention, good optical confinement can be achieved and ripples can be decreased without increase of threshold current. And in the manufacturing steps, when the stripe waveguide and the like is formed by etching and the etching depth is down to the p-side optical waveguide layer, the etching precision can be enhanced compared with in the past.

Preferably, the p-side optical waveguide layer comprises a projection part of a stripe structure and a p-type nitride semiconductor layer on the projection part, and the thickness of the p-side-optical waveguide layer is not more than 1 µm. Thereby, the stripe waveguide region can be formed and a good control of lateral mode can be achieved. Concretely, the difference of the effective refractive index is formed effectively, and therefore, the beam shape of the light, particularly the spread of the light of the far-field pattern in the direction parallel to the junction plane can be improved compared with in the past. Also, the aspect ratio is good for the application of the device. Further, the enhancement of the optical properties suppresses the threshold current to the same extent or the more than in the prior and enables the long lifetime emission, while conventional various properties relating to the emission is maintained.

Preferably, the projection part of the p-side optical waveguide layer and the p-type nitride semiconductor layer on the projection part is a ridge waveguide of a stripe structure formed by etching from the p-type nitride semiconductor layer. Since the ridge waveguide is formed in the p-side optical waveguide layer, the threshold current can be decreased and a long lifetime and stable single mode emission can be realized. Moreover, the optical confinement in the lateral mode is good and the laser emission having a good aspect ratio can be obtained.

The p-side optical waveguide layer preferably has a thickness of not less than 2500 angstroms. This is because for in guiding waves of the laser emission, the effective refractive index functions more effectively and the optical confinement in the horizontally lateral mode is better, resulting in the laser emission with a stable and good aspect ratio.

The thickness of the region of the p-side optical waveguide layer except the projection part is preferably not more than 500 angstroms and not less than 1000 angstroms. This is because the laser devices can be manufactured in the stable state, the dispersion of devices is small and the yield of manufacture can be increased.

The stripe width of the projection part is preferably not less than 1 μm and not more than 3 μm. Thereby, good control of the lateral mode can be realized, particularly single-mode emission is possible and the occurrence of kinks can be prevented even at high output power.

According to the present invention, preferably, the p-side optical waveguide layer is made of $In_xGa_{1-x}N$ ($0 \leq x < 1$) and a good optical waveguide can be formed.

Further, the fourth object of the present invention is to enhance the output power and reliability of the laser device according to the present invention.

Fourth object of the present invention is to provide an effective refractive index type nitride semiconductor laser device comprising an active layer with at least a p-side first cladding layer, a p-side optical guide layer, a p-side second cladding layer and a p-side contact layer stacked thereon, while the layers from the p-side contact layer to that above the active layer are etched thereby to form a stripe-shaped waveguide region, made by applying the structure of the present invention to a semiconductor laser device having a first cladding layer for carrier confinement and a second cladding layer for light confinement formed from the side near the active layer and an optical guide layer provided between the first cladding layer and the second cladding layer, wherein the p-side optical guide layer has a protruding portion having narrow stripe shape and a p-type nitride semiconductor layer being formed on the protruding portion, and the protruding portion of the p-side optical guide layer has a thickness of 1 μm or less.

While the p-side first cladding layer is a carrier confinement layer made of $Al_yGa_{1-y}N$ ($0<y<0.5$) and the p-side second cladding layer is a light confinement layer made of $Al_zGa_{1-z}N$ ($0<z<0.5$: $y>z$), the p-side first cladding layer is preferably made of $Al_yGa_{1-y}N$ ($0<y<0.35$). The p-side first cladding layer also preferably includes at least two layers, with the first layer being made of $Al_xGa_{1-x}N$ formed in nitrogen atmosphere and the second layer being made of $Al_xGa_{1-x}N$ formed in hydrogen atmosphere.

PREFERRED EMBODIMENTS OF THE INVENTION

Embodiment 1

Figure 1:
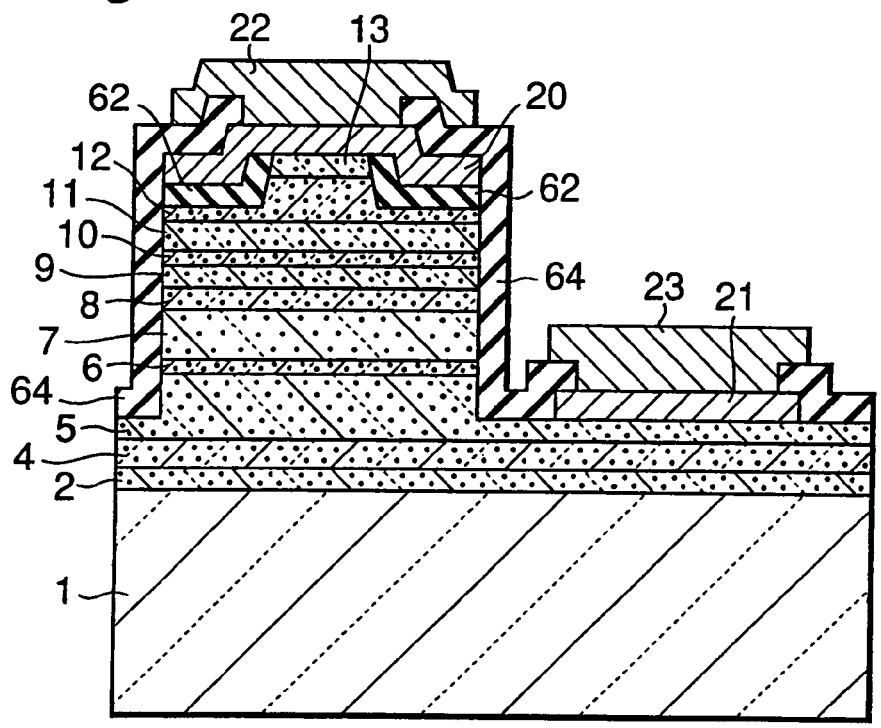
FIG. 1 is a schematic sectional view showing the structure of a laser device according to an example of the first embodiment of the present invention.

The etching operation employed to form the stripe-shaped waveguide region in the present invention is such an etching operation that forms a ridge waveguide having a cross section, for example, as shown in FIG. 1, that will be described in detail below following the p-side cladding layer and the p-side contact layer.

The nitride semiconductor laser device of the present invention comprises an active layer with at least the p-side first cladding layer and the p-side second cladding layer stacked thereon successively, while the layers are etched from the p-side contact layer side thereby to form the stripe-shaped waveguide region.

Figure 10:
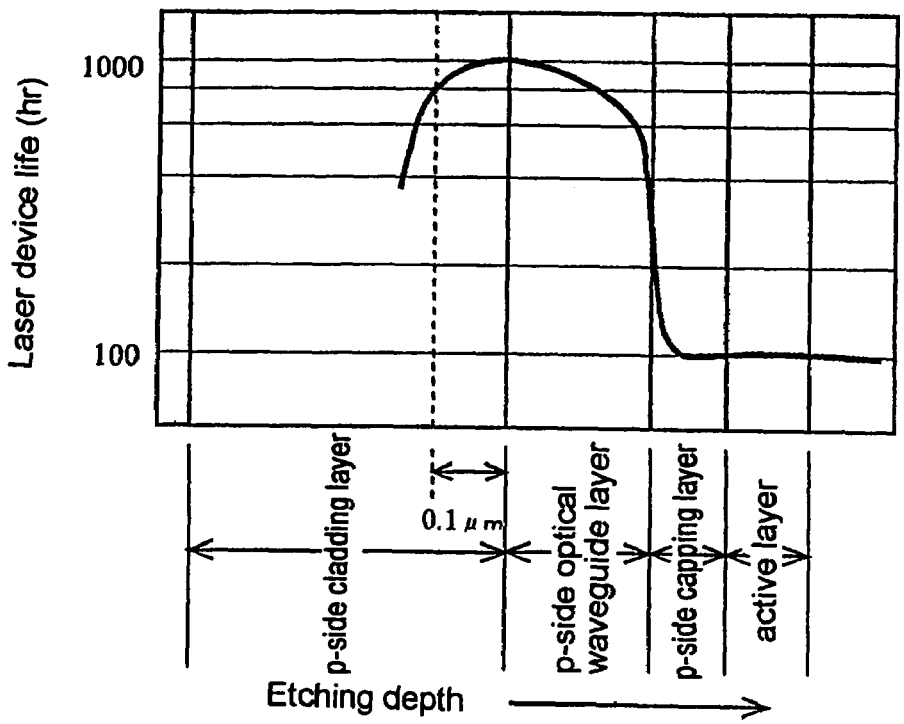
FIG. 10 is a diagram showing the relation between depth of etching and device life in the present invention.

According to the present invention, there is required no particular layer between the active layer and the p-side cladding layer, although a guide layer and/or a cap layer (in case the cap layer is provided separately from-the cladding layer, the cap layer means the first cladding layer for carrier confinement and the cladding layer means the second cladding layer for light confinement) are provided as shown in the example described later. In case the p-side cladding layer is formed directly on the active layer, the p-side cladding layer is etched in a zone ranging from the interface between the p-side cladding layer and the active layer to a position where thickness of the p-side cladding layer is 0.1 μm, thereby to form the stripe-shaped waveguide region. In case the guide layer, the cap layer and the like described above are formed between the p-side cladding layer and the active layer, etching may be effected up to the layer provided between the p-side cladding layer and the active layer as long as it is below the position where thickness of the p-side cladding layer is 0.1 μm and is above the light emitting layer. At this time, in case service life of the device deteriorates abruptly at a position near the active layer as shown in FIG. 10, the waveguide region is preferably formed to such a depth that is capable of avoiding the deterioration, while the waveguide region is formed to such a depth that does not reach the p-side cap layer in the device structure shown in the drawing. The active layer may be of either single or multiple quantum well structure, and the layer may be doped with n-type or p-type impurity. InGaN is preferably used for the active layer or quantum well layer of the quantum well structure that constitutes the active layer.

(P-Side Cladding Layer)

For the p-side cladding layer of the present invention, providing a difference in the refractive index that is enough to confine the light will suffice, and a nitride semiconductor layer that includes Al is preferably used. This layer may also comprise either a single layer or multiple layers, and specifically may have super lattice structure including AlGaN and GaN stacked one on another alternately as described in the examples. Moreover, this layer may be either doped with a p-type impurity or undoped. For a laser device that oscillates at long wavelengths from 430 to 550 nm, the cladding layer is preferably made of GaN doped with a p-type impurity.

(P-Side Contact Layer)

The p-side contact layer of the present invention is formed on the p-side cladding layer so that good ohmic contact with the electrodes is obtained.

The laser device of the present invention becomes capable of oscillating in stable transverse mode in the fundamental (single) mode by controlling the with of the stripe in a range from 1 to 3 µm. Width of the stripe less than 1 µm makes it difficult to form the stripe and a width larger than 3 µm makes the transverse mode oscillation likely to occur in multiple modes. Thus oscillating in stable transverse mode cannot be achieved when the width of the stripe is outside the range described above. The width is preferably controlled within a range from 1.2 to 2 µm, that improves the stability of the transverse mode oscillation in a region of higher optical output.

The waveguide region according to the present invention will be described in detail below. Etching for the formation of the stripe-shaped waveguide region is done to a depth above the active layer and below a position where thickness of the p-side cladding layer from the active layer side is 0.1 µm, More specifically, the stripe-shaped waveguide region is formed by etching and the position of the nitride semiconductor that continues to both side faces of the stripe shows the depth of etching. Thus the plane of the nitride semiconductor exposed by the etching is controlled to be below (direction of active layer) position where thickness of the p-side cladding layer is 0.1 µm in the direction of thickness and above (in the direction of the p-side contact layer) the active layer. In other words, the etching is done in the direction from the bottom end face of the p-side cladding layer toward the p-side contact layer deeper than the position of 0.1 µm (in the direction of active layer) and such a depth that the active layer is not exposed, thereby forming the stripe-shaped waveguide region. In the present invention, the statement of being below a position where thickness of the p-side cladding layer is 0.1 µm means a zone including the position of 0.1 µm. This is because, when the waveguide is formed by etching to a depth that does not reach the active layer, service life of the device is improved greatly, particularly in a region of higher optical output, exceeding 5 mW, and oscillation over a longer period of time is made possible. Also as the stripe is formed by etching in the direction of thickness of the p-side cladding layer (in the direction of the p-side contact layer) to the active layer side beyond 0.1 µm, stable oscillation in the transverse mode can be achieved in a wider range of optical output, specifically in a range up to several tens of milli-watts, providing current-optical output characteristic free of kink in this range.

The laser device of the present invention, that has the stripe-shaped waveguide region with the width of stripe and the etching depth being set as described above, is capable of stable oscillation in the single fundamental transverse mode without kink in a region of relatively high optical output from the moment of starting the laser oscillation, and provides a service life of such a practical level as over ten thousand hours with output of 5 mW, or over one thousand hours with output of 30 mW.

The plane of the nitride semiconductor is exposed by etching to form the stripe-shaped waveguide region, so that the plane of the nitride semiconductor is formed in continuity with the stripe side faces. Therefore, position of the nitride semiconductor plane indicates the depth of etching for forming the stripe-shaped waveguide region.

Also the position where thickness of the p-side cladding layer is 0.1 µm that represents the etching depth described above means a position 0.1 µm away from the bottom end face of the p-side cladding layer (active layer side) in the direction of the p-side contact layer, a position where film thickness is 0.1 µm away from the surface where the p-side cladding layer begins to grow, and meaning that the plane of the nitride semiconductor exposed by the etching is formed at a position where thickness of the p-side cladding layer in the waveguide region is 0.1 µm or less. There is no limitation as to the interface between the active layer and the p-side cladding layer. These layers may be in contact with each other, or separated by a p-side cap layer (first cladding layer for carrier confinement) and a p-side optical guide layer formed therebetween as in an embodiment described later.

The active layer may be of quantum well structure, either single quantum well structure or multiple quantum well structure. Being located above the active layer means such a depth that does not reach a layer to be formed following a barrier layer/well layer formed at the last constituting the quantum well structure.

Resonance wavelength of the nitride semiconductor of the present invention is preferably in a range from 400 to 900 µm which allows it to decrease the drive current by controlling the reflectivity of the mirrors located at both ends.

The nitride semiconductor laser device of the present invention has high reliability, since insulation films made of a material other than Si oxide are formed on both side faces of the stripe exposed by etching and on the plane of the n-side optical guide layer that continues with the side faces, and electrodes are formed via the insulation film on the p-side contact layer surface that is the top layer of the stripe. This is because it has been difficult to form the layer with sufficiently reliable insulation by using an insulation film made of $SiO_2$ that is in common use, thus resulting in a device of lower reliability with increased threshold. Such a problem is solved by the use of the insulation film made of a material other than silicon oxide, with another advantage of having favorable effect on the stability of the transverse mode oscillation. The insulation film made of the material other than silicon oxide may be made of at least one kind of an oxide selected from among a group consisting of Ti, V, Zr, Nb, Hf and Ta and compounds BN, SiC and AlN, which makes it possible to obtain a laser device having high reliability. Also because the stripe is formed in a process to be described later, the stripe-shaped waveguide region with the range described above can be formed with good accuracy. For the insulation film, a thickness in a range from 500 to 5000 Å is sufficient.

The laser device of the present invention achieves good device characteristics by providing the stripe-shaped waveguide region. The stripe-shaped waveguide region of the laser device of the present invention can also be formed accurately and with a high yield of production, by forming the stripe in the process described below. The production process is as follows.

According to the present invention, there is no limitation to the shape of the stripe formed by etching. The stripe may have a cross section of mesa of which width increases with depth as shown in FIG. 1, or inverted mesa of which width decreases with depth, or a rectangle of which width remains substantially constant. Preferably the cross section has a shape of mesa that tends to achieve stable transverse mode with oscillation in the fundamental mode.

Figure 2:
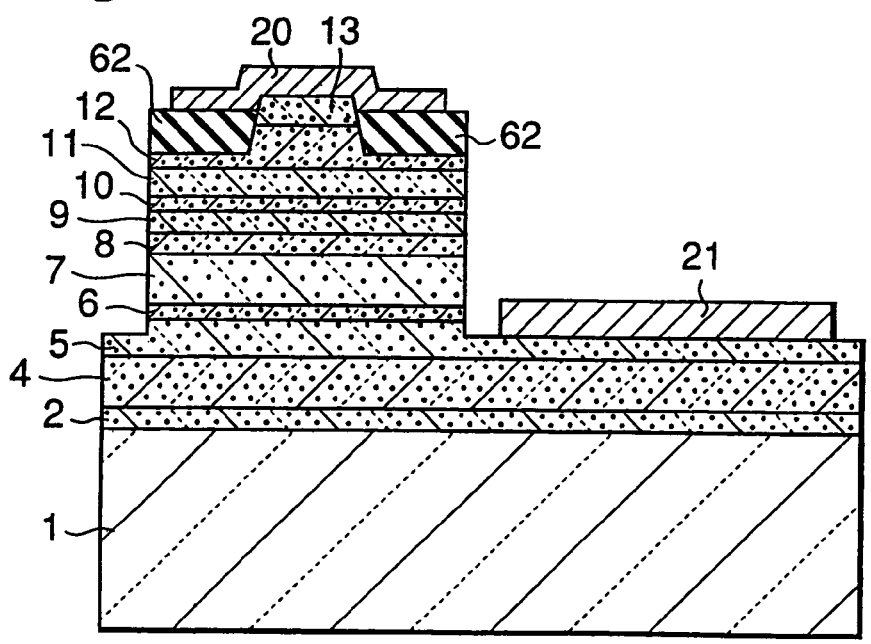
FIG. 2 is a schematic sectional view showing the structure of a laser device according to another example of the present invention.

In case a pair of positive and negative electrodes are formed on the same side of a substrate of different kind as shown in FIGS. 1 and 2, an n-side contact layer that constitutes the negative electrode is exposed by etching to that depth and then etching to form the stripe-shaped waveguide region is carried out.

(Method of Forming Stripe-Shaped Waveguide Region)

FIG. 3 is a schematic sectional view showing a nitride semiconductor wafer for explaining the process of forming the electrodes of the present invention. The sectional view is along a direction perpendicular to the stripe-shaped waveguide region formed by etching, namely parallel to the resonance plane. In the first process of the present invention, as shown in FIG. 3C, a first protective film 61 of a stripe shape is formed on the p-side contact layer 13 that is located at the top.

The first protective film 61 is not required to have insulating property, and may be made of any material that has difference in the etching rate from the nitride semiconductor. For example, Si oxide (including $SiO_2$), photoresist may be used. Preferably, a material that is more easily dissolved in an acid than a second protective film is used, in order to ensure a difference in solubility from the second protective film to be formed later. For the acid, hydrofluoric acid is preferably used, and Si oxide is preferably used as a material that can be easily dissolved in hydrofluoric acid. Stripe width (W) of the first protective film is controlled within a range from 3 μm to 1 μm. Stripe width of the first protective film 61 corresponds substantially to the stripe width in the waveguide region.

Figure 3A:
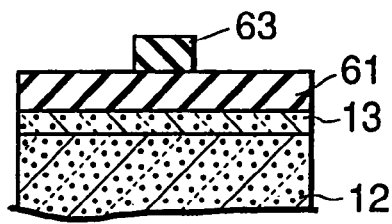
FIGS. 3A to 3G are schematic sectional views showing processes of the method according to the present invention.
Figure 3B:
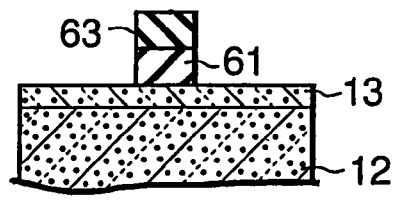

FIGS. 3A and 3B show specific processes of forming the first protective film 61. As shown in FIG. 3A, the first protective film 61 is formed over substantially the entire surface of the p-side contact layer 13, and then a third protective film 63 of stripe shape is formed on the first protective film 61. Then as shown in FIG. 3B, the first protective film 61 is etched with the third protective film 63 left remaining on, followed by the removal of the third protective film 63, thereby forming the first protective film 61 of stripe shape shown in FIG. 3C. The etching may also be done from the p-side contact layer 13 side by changing the gas or the means of etching, with the third protective film 63 left remaining on.

Figure 3C:
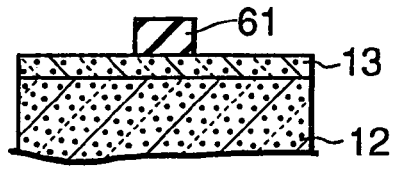

The first protective film 61 of stripe shape shown in FIG. 3C may also be formed by employing lift-off process. That is, a photoresist film having apertures of stripe configuration is formed and the first protective film is formed over the entire surface of the photoresist film, followed by dissolving and removing the photoresist, thereby leaving only the first protective film that is in contact with the p-side contact layer. Compared to the formation of the first protective film of stripe shape by the lift-off process, stripe of better shape with substantially vertical end face can be formed through the etching process shown in FIGS. 3A and 3B.

Figure 3D:
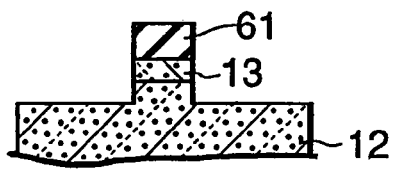

In the second process of the present invention, as shown in FIG. 3D, etching is done via the first protective film 61 from the p-side contact layer 13 in the portion where the first protective film 61 is not formed, thereby forming the stripe-shaped waveguide region that corresponds to the configuration of the protective film right below the first protective film 61. Structure and characteristics of the laser device vary depending on the position where etching is to be stopped.

In case dry etching such as RIE (reactive ion etching) is employed, it is desirable to use a gas of fluorine compound such as $CF_4$ in etching the first protective film made of Si oxide that is used in abundance in the first process. In the second process, use of gas of a chlorine compound such as $Cl_2$, $CCl_4$ and $SiCl_4$ that are frequently used for other III-V group compound semiconductors is desirable because higher selectivity with respect to the Si oxide can be achieved, for etching the nitride semiconductor.

Figure 3E:
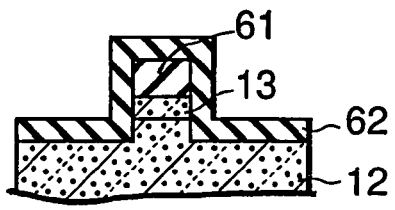
Figure 3F:
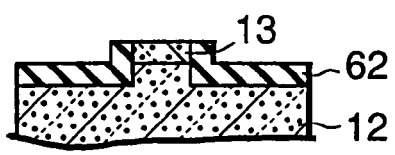

In the third process, as shown in FIG. 3E, the second protective film 62 that is made of a material different from that of the first protective film 61 is formed on the side faces of the stripe-shaped waveguide region and on the plane of the nitride semiconductor (p-side cladding layer 12 in FIG. 3E) that is exposed by etching. Because the first protective film 61 is made of a material different from that of the second protective film 62, the etching proceeds selectively with respect to the first protective film 61. Consequently, when only the first protective film 61 is removed by, for example, hydrofluoric acid, the second protective film 62 can be formed that continues to both the surface of the p-type cladding layer 12 (nitride semiconductor plane exposed by etching) and the side faces of the stripe as shown in FIG. 3F. High insulation performance can be maintained by forming the second protective film continuously. Moreover, since forming the second protective film 62 continuously over the first protective film 61 enables it to form the film with uniform thickness on the p-side cladding layer 12, unevenness in the film thickness is unlikely to occur and current concentration due to unevenness in the film thickness can be prevented from occurring. Also because etching in the second process is stopped amid the p-side cladding layer 12, it needs not to say that the second protective film is formed on the plane of the nitride semiconductor layer where etching is stopped, provided that the etching is stopped below the p-side cladding layer 12 while the second protective film 62 is formed on the plane of the p-side cladding layer 12 in FIG. 3E.

The second protective film is made of a material other than $SiO_2$, preferably made of at least one kind of oxide that includes at least one element selected from among a group consisting of Ti, V, Zr, Nb, Hf and Ta and at least one kind among compounds SiN, BN, SiC and AlN. Among these, it is particularly desirable to use the oxides of Zr and Hf, BN and SiC. Although some of these materials have some solubility to hydrofluoric acid, fairly higher reliability than that of $SiO_2$ can be achieved by forming the insulation layer of the laser device in the form of embedded layer. Thin films formed from oxides in a vapor phase process such as PVD or CVD tend to have lower reliability with respect to the insulation performance of the thin oxide film, since it is difficult to make the element and oxygen react in stoichiometrical proportions in forming an oxide. The oxides of the elements described above, BN, SiC and AlN selected according to the present invention, on the other hand, have reliability with respect to the insulation performance that is higher than that of Si oxide.

Further, when an oxide having a refractive index lower than that of the nitride semiconductor (for example, other than SiC) is selected, an embedded layer that is very favorable for the laser device can be obtained. Moreover, in case Si oxide is used for the first protective film 61, since hydrofluoric acid has selectivity with respect to the Si oxide, when the film is formed continuously on the side faces of the stripe waveguide, on the plane where the stripe is formed thereon (etching stop layer) and on the first protective film 61 as shown in FIG. 3E, the second protective film 62 having uniform thickness can be formed as shown in FIG. 3F by removing the first protective film 61 in the lift-off process.

Figure 3G:
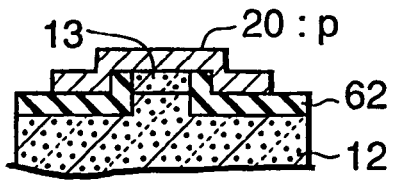

In the fourth process of the present invention, the first protective film 61 is removed as shown in FIG. 3F. Then as shown in FIG. 3G, a p electrode electrically connecting to the p-side contact layer is formed on the second protective film 62 and on the p-side contact layer 13. According to the present invention, since the second protective layer is formed earlier, there is no need to restrict the formation of the p electrode only on the contact layer of small stripe width and, instead, the p electrode may be formed over a large area. In addition, an electrode that combines the functions of ohmic electrode and bonding electrode can be formed together by selecting an electrode material that also provides ohmic contact.

In the nitride semiconductor laser device, when forming the stripe-shaped waveguide region, dry etching is used since it is difficult to form it by wet etching. In dry etching, since selectivity between the first protective film and the nitride semiconductor is important, $SiO_2$ is used for the first protective film. However, since sufficient insulation cannot be achieved by using $SiO_2$ for the second protective film that is formed on the plane where etching is stopped, and it becomes difficult to remove only the first protective film because the two protective films are made of the same material. Therefore, according to the present invention, the second protective film is made of a material other than $SiO_2$ thereby achieving selectivity with respect to the first protective film. Also because the nitride semiconductor is not etched after forming the second protective film, there occurs no problem of difference in the etching rate between the second protective film and the nitride semiconductor.

Embodiment 2

Figure 17:
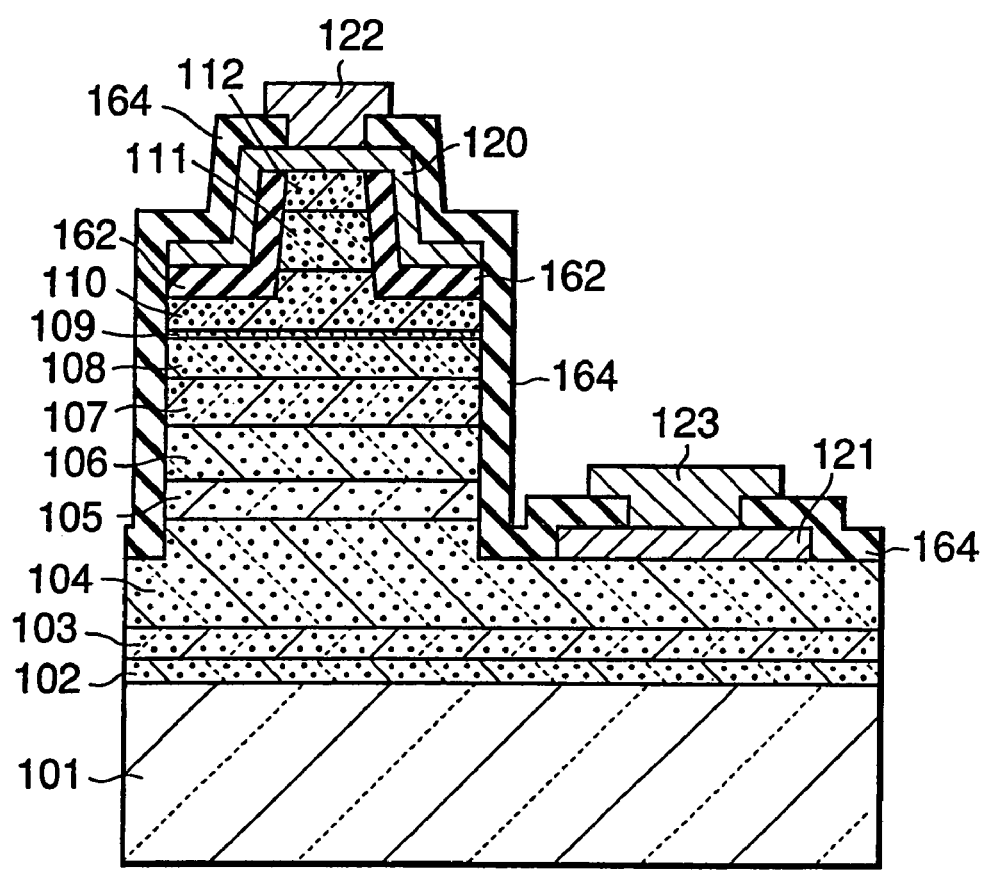
FIG. 17 is a schematic sectional view showing the structure of a laser device according to the second embodiment of the present invention.

An embodiment of the present invention is shown in FIG. 17. Using this example, the present invention will be described in detail. The nitride semiconductor laser device of the present invention comprises an n-type nitride semiconductor layer, an active layer and a p-type nitride semiconductor layer stacked on a substrate, and has ridge structure of stripe shape formed by etching from the p-type nitride semiconductor side.

(Stripe-Shaped Waveguide Region)

The nitride semiconductor laser device of the present invention has a ridge waveguide formed on the p-side optical guide layer upward over the active layer. That is, an n-side optical guide layer made of n-type nitride semiconductor, the active layer and the p-side optical guide layer made of p-type nitride semiconductor are stacked on the substrate, wherein the p-side optical guide layer has a protruding portion of stripe shape and a stripe-shaped waveguide region. The laser device of the present invention is a refractive index guiding type laser device having the stripe-shaped waveguide region.

(Depth of Etching)

The laser device of the present invention is made by stacking the n-side optical guide layer made of the n-type nitride semiconductor, the active layer, the p-side optical guide layer made of the p-type nitride semiconductor and a p-type nitride semiconductor layer, then part of the p-type nitride semiconductor layer and part of the p-side optical guide layer are removed by etching from the p-type nitride semiconductor layer side, thereby forming the stripe structure. Since height of the protruding portion of the p-side optical guide layer is determined by the depth of etching, controllability of the depth of etching is improved over the prior art as will be described later. It is important to carry out etching to such a depth that does not reach the active layer, and etching in the present invention is carried out to the position of the p-side optical guide layer.

According to the present invention, although the shape of the protruding portion of the p-side optical guide layer or the shape of the stripe-shaped ridge waveguide are not limited to mesa or inverted mesa configuration, mesa configuration is preferable because of the tendency thereof to allow better control of the transverse mode oscillation.

(Etching Means)

For etching the nitride semiconductor layer such as the formation of the p-side optical guide layer or the ridge waveguide, such processes as wet etching and dry etching may be employed. For dry etching, for example, there are reactive ion etching, (RIE), reactive ion beam etching, (RIBE), electron cyclotron etching (ECR), ion beam etching and other processes, and the nitride semiconductor layer can be etched by any of these processes by selecting a proper etching gas.

(Optical Guide Layer)

The waveguide is formed by such a structure as the active layer is sandwiched by the n-side optical guide layer and the p-side optical guide layer. The laser device of the present invention has the stripe-shaped waveguide region formed by providing the p-side optical guide layer with the protruding portion of stripe shape.

According to the present invention, the p-side optical guide layer has the protruding portion of stripe shape, and the p-type nitride semiconductor layer is formed on the protruding portion thereby to form the laser device. Specifically, the laser device has the ridge waveguide formed with the p-side optical guide layer. The protruding portion is formed by etching from the p-type nitride semiconductor side as described above, while stopping the etching process in the p-side optical guide layer. According to the present invention, the p-side optical guide layer has the protruding portion of stripe shape and thickness thereof (at the protruding portion) is 1 μm or less. Thickness here refers to the thickness of growing the p-side optical guide layer. In case the protruding portion is formed by the etching process described above after forming the p-side optical guide layer, the protruding portion is formed by removing a part of the p-side optical guide layer of the predetermined thickness, and consequently thickness of the p-side optical guide layer becomes equal to thickness of the protruding portion. At this time, in case thickness of the p-side optical guide layer is greater than 1 μm, the value of threshold greatly increases to make the laser very difficult to oscillate and, even when the laser can oscillate, the laser device has an extremely short service life. Thickness of the p-side optical guide layer, namely thickness of the protruding portion, is preferably in a range from 1500 Å to 4000 Å inclusive. When the thickness is less than 1500 Å, good F.F.P. of laser light cannot be achieved and, when the thickness is larger than 4000 Å, threshold current of oscillation tends to increase. Specifically, when the thickness is less than 1500 Å, horizontal transverse mode cannot be controlled sufficiently, while F.F.P. becomes a beam profile of 10° C. or less in. x direction, resulting in an aspect ratio that is far higher than 2.0 and is around 3.0 or higher.

When forming the ridge waveguide and the protruding portion by etching, productivity must be taken into consideration. As the depth of etching increases, variability among the devices provided on a wafer increases which must be avoided. Specifically, when the protruding portion of stripe shape (ridge structure) is formed by etching to a depth greater than 0.7 µm, the problem described above suddenly becomes predominant, and therefore the etching is preferably restricted to a smaller depth. For this purpose, the ridge height is controlled in the present invention, and the laser device is preferably formed within the range described above. The ridge height refers to the height of the p-type nitride semiconductor, that is formed on the protruding portion, from the plane of the p-side optical guide layer in a region other than the protruding portion, namely the plane being exposed by etching and continuing to the side face of the protruding portion. Height of the protruding portion refers to the height of the top surface of the protruding portion from the plane, while the top surface of the p-type nitride semiconductor layer is the starting position of etching.

(Height of Protruding Portion)

It is preferable to increase the height of the protruding portion in the p-side optical guide layer, since it causes the threshold current of oscillation to decrease. That is, increasing the depth of etching improves the stability of the output, making a great contribution to the application of the laser device. Specifically, even when the output increases, such effects are obtained as achieving stable oscillation in a single mode, suppressing the deterioration of the device because of the favorable threshold current of oscillation and achieving continuous oscillation with a longer service life.

In addition, when forming the layers by etching, it is important to give consideration to the flatness of the plane that is exposed and formed by etching, namely the top surface in the regions other than the protruding portion of the p-side optical guide layer. This is because, when forming the protruding portion of stripe shape by etching, there occurs some variation in the position of the surface of the p-side optical guide layer that is exposed by etching in the direction of thickness, that causes the variability among the devices. That is, when the relatively tiny protruding portion of stripe shape is formed, there occurs variability in the depth (thickness of the p-side optical guide layer in the regions other than the protruding portion) in the wafer over the top surface of the p-side optical guide layer exposed over the entire surface of the wafer, resulting in variability in the output characteristic and the optical characteristic of the laser device. Thus the p-side optical guide layer is etched to such a depth that leaves a region of thickness of 500 Å or more, preferably in a range from 500 Å to 1500 Å to remain, in forming the protruding portion of the p-side optical guide layer. When a region of thickness of 500 Å or more is left to remain, etching hardly reaches deeper than the p-side optical guide layer, leading to the formation of the protruding portion with high accuracy. When a region of thickness of 1500 Å or more is left to remain, the threshold current of oscillation increases as described above, and the controllability of the transverse mode tends to deteriorate. More preferably, the thickness is set to within a range from 500 Å to 1000 Å, which improves the oscillation at the threshold and the controllability of the transverse mode of the laser device.

According to the present invention, there is no limitation to the composition of the p-side optical guide layer, that is required only to be made of nitride semiconductor and have such an energy band gap that is sufficient to form the waveguide, and may have either single layer or multiple layer structure. For example, undoped GaN is used for wavelengths from 370 to 470 nm, and a multiple layer structure of InGaN/GaN is used for longer wavelengths.

For the waveguide formed by sandwiching the active layer with the n-side optical guide layer and the p-side optical guide layer, total thickness thereof, namely thickness of the region interposed between the two guide layers, is preferably 6000 Å or less, or more preferably 4500 Å or less. When the total thickness of the waveguide is greater than 6000 Å, the threshold current of oscillation increases abruptly thereby making it extremely difficult to achieve continuous oscillation in the fundamental mode. When the total thickness of the waveguide is less than 4500 Å, such an increase in the threshold current of oscillation is suppressed thus making it possible to achieve continuous oscillation in the fundamental mode with longer service life.

According to the present invention, although there is no limitation to the structure of the n-side optical guide layer, the n-side optical guide layer may be formed to substantially the same thickness as the p-side optical guide layer in such a structure as to sandwich the active layer with the two guide layers. The n-side optical guide layer is preferably formed by growing GaN, InGaN, and specifically such a multiple layer structure may be employed as undoped GaN, InGaN with the proportion of In decreasing toward the active layer, and GaN are stacked alternately. InGaN means a ternary mixed crystal.

In the nitride semiconductor laser device of the present invention, the p-type nitride semiconductor layer formed on the p-side optical guide layer comprises the p-side cladding layer, the p-side contact layer and the like being stacked one on another as shown in the embodiment. Accordingly, in the present invention, the p-type nitride semiconductor layer formed on the protruding portion of the p-side optical guide layer is formed in the shape of stripe, thereby forming the ridge waveguide.

According to the present invention, a cap layer may be formed between the optical guide layer and the active layer. For example, a p-side cap layer made of $Al_xGa_{1-x}N$ ($0 \leq x < 1$) doped with a p-type impurity is formed between the active layer and the p-side optical guide layer. At this time, it is not desirable to form the ridge waveguide of stripe shape to such a depth that reaches the p-side cap layer since it leads to shorter service life of the device. The structure having the protruding portion of stripe shape provided on the p-side optical guide layer, further the structure having the ridge waveguide is preferable in such a case, too.

According to the present invention, satisfactory control of the transverse mode is made possible by setting the stripe width of the ridge waveguide, or the stripe width of the protruding portion of the p-side optical guide layer in a range from 1 to 3 µm inclusive. Within this range, oscillation in the single transverse mode can be achieved in relatively good condition, and stable control of the beam profile with high accuracy (good F.F.P.) can be achieved as the ridge waveguide is formed with the p-side optical guide layer. When the width is less than 1 µm, it becomes difficult to produce the ridge structure of stripe shape or the protruding portion, resulting in a decreased yield of production. When the width is larger than 3 µm, it becomes difficult to control the horizontal transverse mode.

The nitride semiconductor used to make the nitride semiconductor laser device of the present invention may be $In_xAl_yGa_{1-x-y}N$ ($0 \leq x \leq 1$, $0 \leq y \leq 1$, $0 \leq x+y \leq 1$), in the form of ternary mixed crystal quarternary mixed crystal or the like as well as gallium nitride. According to the present invention, it is preferable to make the laser device formed on the substrate from the nitride semiconductor of the composition described above, since it achieves the best control of the transverse mode and beam profile of the laser beam.

Figure 11:
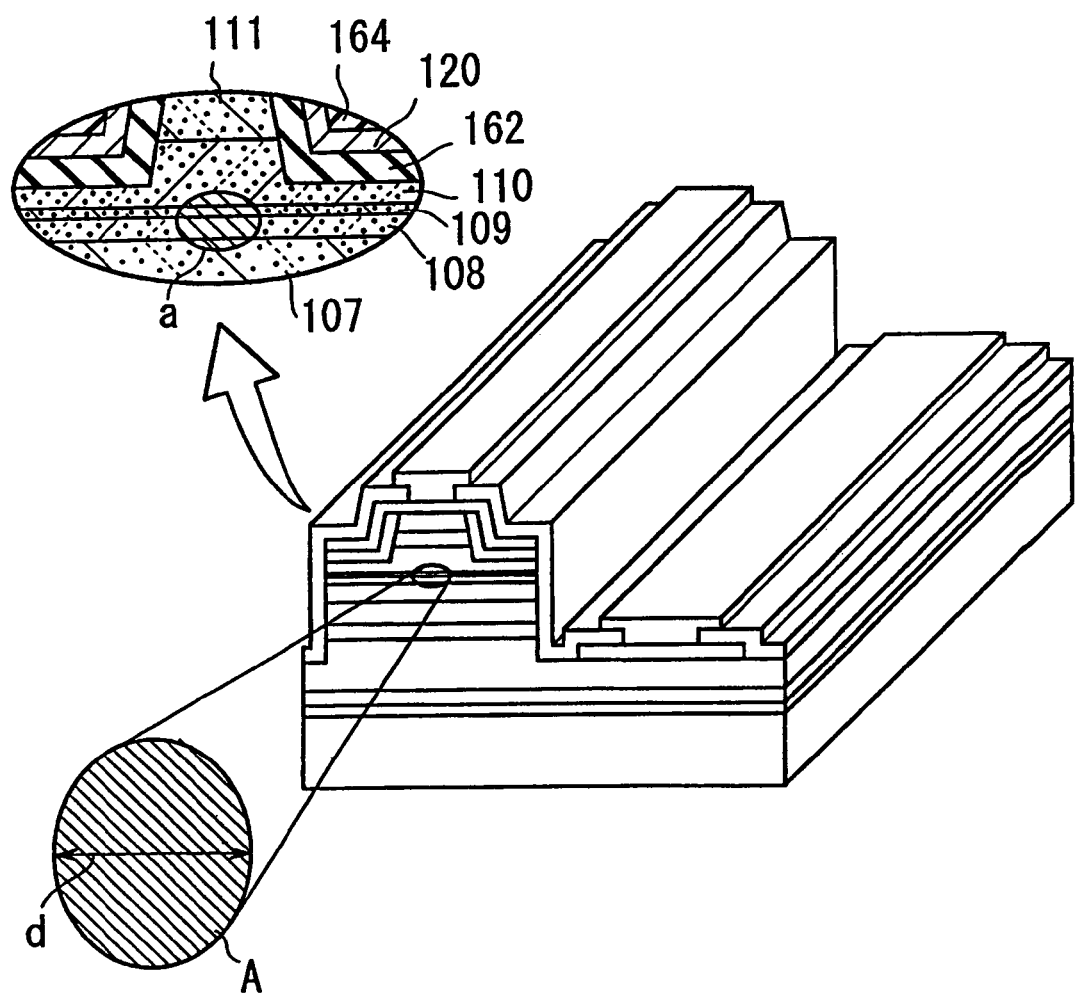
FIG. 11 is a schematic diagram showing a laser device according to the second embodiment of the present invention.

Horizontal direction (x direction) in F.F.P. refers to a direction (direction of arrow d in the drawing) parallel to the junction plane (or pn junction plane) shown in FIG. 11, and the transverse mode in this direction is called the horizontal transverse mode.

FIG. 11 is a schematic diagram for explaining the optical characteristic of the laser device of the present invention, particularly the spot shape at the light emerging plane and the far field image (F.F.P.) (A). In the prior art, the spot shape (a) at the light emerging plane spreads in the direction parallel to the junction plane, with a narrow angle in x direction in F.F.P. within 10° C. and poor aspect ratio. In the present invention, on the contrary, although the longitudinal direction of the spot profile lies in the horizontal direction similarly to the prior art as shown in the drawing, spread in the longitudinal direction is narrower and the angle in x direction in F.F.P. (A) increases to 12° C. or up to 20° C., with satisfactory aspect ratio of around 2.0. The reason for the optical characteristics being improved without affecting the output characteristic and reliability of the device is that the laser device has the stripe-shaped waveguide region that has good effective refractive index embodiment shown in FIG. 17, except that the thickness of the p-side optical guide layer is larger than the thickness of the n-side optical guide layer.

The nitride semiconductor laser device of the present invention is made by sandwiching the active layer with the p-side optical guide layer and the n-side optical guide layer thereby to form the waveguide, while the thickness of the p-side optical guide layer is made larger than the thickness of the n-side optical guide layer, so that good laser beam can be achieved. This is for the purpose of extracting good laser beam by differentiating the thickness between the p-side optical guide layer and the n-side optical guide layer that sandwich the active layer, thereby shifting the light distribution from the gain distribution in the direction of thickness and changing the transverse mode control from that of the prior art. The effect of light confinement is also enhanced thereby suppressing the occurrence of ripple.

(Stripe-Shaped Waveguide Region)

The nitride semiconductor laser device of the present invention has the structure of refractive index guiding type, where control of the transverse mode is enhanced by providing the stripe-shaped waveguide region in addition to such a structural feature that the thickness of the optical guide layers is asymmetrical with respect to the active layer interposed therebetween. That is, the n-side optical guide that is formed by means of the p-side optical guide layer which has the protruding portion of stripe shape, as described above. Moreover, as the thickness of the p-side optical guide layer, or the total thickness of the p-side optical guide layer and the n-side optical guide layer, is increased compared to the prior art, as described above, spread of the beam in direction a (y direction) perpendicular to the junction plane in the drawing is suppressed due to the decreasing effect of diffraction, which also contributes to the improvement of the optical characteristic, particularly the aspect ratio, of the laser device of the present invention. That is, laser beam that is nearer to true circle than the far field pattern of the prior art that is compressed in the vertical direction is obtained, because the spread of light in y direction in F.F.P. is suppressed as well as the control of the horizontal transverse mode described above.

Embodiment 3

One embodiment of the present invention will now be described below by way of: a specific example. The nitride semiconductor laser device of the present invention has such a structure as the n-side optical guide layer made of n-type nitride semiconductor, the active layer and the p-side optical guide layer made of p-type nitride semiconductor are stacked on the substrate, similarly to that of the second layer made of n-type nitride semiconductor, the active layer and the p-side optical guide layer made of p-type nitride semiconductor are stacked on the substrate, wherein the p-side optical guide layer has a protruding portion of stripe shape and the stripe-shaped waveguide region is provided. The laser device of the present invention has the p-type nitride semiconductor layer formed on the protruding portion, and is specifically a refractive index guiding type laser device having the stripe-shaped waveguide region.

(Depth of Etching)

The laser device of the present invention is made by stacking the n-side optical guide layer made of the n-type nitride semiconductor, the active layer, the p-side optical guide layer made of the p-type nitride semiconductor and the p-type nitride semiconductor layer, while a part of the p-type nitride semiconductor layer and a part of the p-side optical guide layer are removed by etching from the p-type nitride semiconductor layer side, thereby forming the stripe structure. Since the height of the protruding portion of the p-side optical guide layer is determined by the depth of etching, controllability of the depth of etching is improved over the prior art as will be described later. It is important to carry out etching to such a depth that does not reach the active layer, and etching in the present invention is carried out to the position of the p-side optical guide layer.

According to the present invention, although the shape of the protruding portion of the p-side optical guide layer or the shape of the stripe-shaped ridge waveguide are not limited to mesa or inverted mesa configuration, mesa configuration is preferable because of the tendency thereof to allow control of good transverse mode.

(Etching Means)

For etching the nitride semiconductor such as the formation of p-side optical guide layer or the ridge waveguide, such processes as wet etching and dry etching may be employed. For dry etching, for example, there are reactive ion etching (RIE), reactive ion beam etching, (RIBE), electron cyclotron etching (ECR), ion beam etching and other processes, and nitride semiconductor can be etched by any of these processes by selecting a proper etching gas.

(Optical Guide Layer)

The waveguide is formed by such a structure as the active layer is sandwiched with the n-side optical guide layer and the p-side optical guide layer. The laser device of the present invention has the stripe-shaped waveguide region formed by providing the p-side optical guide layer with the protruding portion of stripe shape.

(P-Side Optical Guide Layer)

According to the present invention, the n-side optical guide layer and the p-side optical guide layer that sandwich the active layer have different thicknesses, with the p-side optical guide layer being made thicker. More preferably, the p-side optical guide layer has the protruding portion of stripe shape, and the p-type nitride semiconductor is formed on the protruding portion thereby to form the laser device having the stripe-shaped waveguide region. Specifically, the laser device has the ridge waveguide formed with the p-side optical guide layer. The protruding portion is formed by etching from the p-type nitride semiconductor layer side as described above, while stopping the etching process in the p-side optical guide layer. Thickness of the p-side optical guide layer here refers to the thickness of growing the p-side optical guide layer. In case the protruding portion is formed by the etching process described above after forming the p-side optical guide layer, the protruding portion is formed by removing a part of the p-side optical guide layer of the predetermined thickness, and consequently the thickness of the p-side optical guide layer becomes equal to the thickness of the protruding portion. At this time, in case the thickness of the p-side optical guide layer is greater than 1 μm, the value of threshold greatly increases to make laser oscillation very difficult and, even when the laser can oscillate, the laser device has extremely short service life. Therefore the thickness of the p-side optical guide layer is made not larger than 1 μm. More preferably, the thickness of the p-side optical guide layer, namely the thickness of the protruding portion, is in a range from 1500 Å to 5000 Å inclusive. This is because, when the thickness is less than 1500 Å, good F.F.P. of laser light cannot be achieved and, when the thickness is larger than 5000 Å, threshold current of oscillation tends to increase. Specifically, when the thickness is less than 1500 Å, horizontal transverse mode cannot be controlled sufficiently, while F.F.P. becomes a beam profile of 10° C. or larger in x direction, resulting in an aspect ratio that is higher than 2.0. In case thickness of the p-side optical guide layer is 2500 Å or larger in the present invention, there is stronger tendency of suppressing the increase of the threshold current compared to the case where both guide layers that sandwich the active layer have the same thickness, and the structure having the thick p-side optical guide layer and asymmetrical waveguide configuration as in the present invention is advantageous.

When forming the ridge waveguide and the protruding portion by etching, productivity must be taken into consideration. As the depth of etching increases, variability in accuracy among the devices provided on the wafer increases which must be avoided. Specifically, when the protruding portion of stripe shape (ridge structure) is formed by etching to a depth greater than 0.7 μm, the problem described above suddenly becomes predominant, and therefore the etching is preferably restricted to a smaller depth. For this purpose, the ridge height is controlled in the present invention, and the laser device is preferably formed within the range described above. Height of the protruding portion refers to the height of the protruding portion from the plane of the p-side optical guide layer in a region other than the protruding portion, namely the plane being exposed by etching and continuing to the side face of the protruding portion. The ridge height refers to the height of the p-type nitride semiconductor layer formed on the protruding portion from the plane while the top surface of the p-type nitride semiconductor layer is the starting position of etching.

(Height of Protruding Portion)

It is preferable to increase the height of the protruding portion in the p-side optical guide layer, since it causes the threshold current of oscillation to decrease. That is, increasing the depth of etching improves the stability of the output, thereby making a great contribution to the application of the laser device. Specifically, even when the output increases, such effects are obtained as achieving stable oscillation in the single mode, while suppressing the deterioration of the device because of the favorable threshold current of oscillation and achieving continuous oscillation with a longer service life. In the p-side optical guide layer described above, by setting the height of the protruding portion not less than 100 Å, the laser device having satisfactory beam profile is obtained. The height is preferably 500 Å or larger, which makes it possible to oscillate in the single mode even with a high output. Thus reliability required for the applications of the laser device is sufficiently ensured.

In addition, when forming the layers by etching, it is desirable to give consideration to the flatness of the plane exposed and formed by etching. This is because, when forming the protruding portion of stripe shape by etching, there occurs some variation in the position of the surface of the p-side optical guide layer that is exposed by etching in the direction of thickness, that causes the variability among the devices. Thus the p-side optical guide layer is etched to such a depth that leaves a region of thickness of 500 Å or more, preferably in a range from 500 Å to 1000 Å to remain, during formation of the protruding portion of the p-side optical guide layer. When a region of thickness of 500 Å or more is left to remain, etching hardly reaches deeper than the p-side optical guide layer, leading to the formation of the protruding portion with high accuracy. When a region of thickness of 1000 Å or more is left to remain, the threshold current of oscillation increases as described above, and the controllability of the transverse mode tends to deteriorate.

According to the present invention, there is no limitation to the composition of the p-side optical guide layer, that is required only to be made of nitride semiconductor and have an energy band gap sufficient to form the waveguide, and may have either single layer or multiple layer structure. For example, undoped GaN is used for wavelengths from 370 to 470 nm, and a multiple layer structure of InGaN/GaN is used for longer wavelengths.

For the waveguide formed by sandwiching the active layer with the n-side optical guide layer and the p-side optical guide layer, total thickness thereof, namely thickness of the region interposed between the two guide layers, is preferably 5000 Å or less, and more preferably 4500 Å or less. This is because, when the total thickness of the waveguide is greater than 5000 Å, the threshold current of oscillation increases abruptly thereby making it extremely difficult to achieve continuous oscillation in the fundamental mode. When the total thickness of the waveguide is less than 4500 Å, such an increase in the threshold current of oscillation is suppressed thus making it possible to achieve continuous oscillation in the fundamental mode with longer service life.

According to the present invention, although there is no limitation except that the n-side optical guide layer is thinner than the p-side optical guide layer, and what is required is only that the waveguide has such a structure as the active layer is sandwiched with the two guide layers. The n-side optical guide layer is preferably formed by growing GaN, InGaN, and specifically such a multiple-layer structure may be employed as undoped GaN, InGaN wile the proportion of In in the mixed crystal decreases toward the active layer, and GaN are stacked alternately. InGaN refers to a ternary mixed crystal where In is included in GaN.

In the nitride semiconductor laser device of the present invention, the p-type nitride semiconductor layer formed on the p-side optical guide layer comprises the p-side cladding layer, the p-side contact layer and the like stacked one on another as shown in the embodiment. Accordingly, in the present invention, the p-type nitride semiconductor layer formed on the protruding portion of the p-side optical guide layer is formed in the shape of stripe, thereby forming the ridge waveguide.

According to the present invention, a cap layer may be formed between the optical guide layer and the active layer. For example, a p-side cap layer made of $Al_xGa_{1-x}N$ ($0 \leq x \leq 1$) doped with a p-type impurity is formed between the active layer and the p-side optical guide layer. At this time, it is not desirable to form the ridge waveguide of stripe shape to such a depth that reaches the p-side cap layer since it leads to shorter service life of the device. The ridge waveguide is preferably formed in such a structure that has the protruding portion of stripe shape being provided on the p-side optical guide layer.

According to the present invention, satisfactory control of the transverse mode is made possible by setting the stripe width of the ridge waveguide, or the stripe width of the protruding portion of the p-side optical guide layer, in a range from 1 to 3 µm inclusive. Within this range, oscillation in the single transverse mode can be achieved in relatively good condition, and stable control of the beam profile with high accuracy (good F.F.P.) can be achieved as the ridge waveguide is formed with the p-side optical guide layer. When the width is less than 1 µm, it becomes difficult to produce the ridge structure of stripe shape or the protruding portion, resulting in a decreased yield of production. When the width is larger than 3 µm, it becomes difficult to control the horizontal transverse mode.

The nitride semiconductor used to make the nitride semiconductor laser device of the present invention may be $In_xAl_yGa_{1-x-y}N$ ($0 \leq x \leq 1$, $0 \leq y \leq 1$, $0 \leq x+y \leq 1$), in the form of ternary mixed crystal, quarternary mixed crystal or the like as well as gallium nitride. According to the present invention, it is preferable to make the laser device formed on the substrate from the nitride semiconductor of the composition described above, since it achieves the best control of the transverse mode and beam profile of the laser beam.

Horizontal direction (x direction) in F.F.P. refers to a direction parallel to the junction plane (or pn junction plane), and x direction (d) of far field image (F.F.P.) (A) shown in FIG. 20, while the transverse mode in this direction is called the horizontal transverse mode.

In this embodiment, the optical guide layers that sandwich the active layer are made in such an asymmetrical structure as the p-side optical guide layer is made thicker than the n-side optical guide layer, wherein light distribution in the waveguide region sandwiched by the two optical guide layers is shifted from that of the laser device of the prior art, namely the light distribution and the gain distribution are shifted thereby to control the transverse mode by a method different from that of the prior art, thereby to obtain the laser beam of the desired beam profile.

Figure 20:
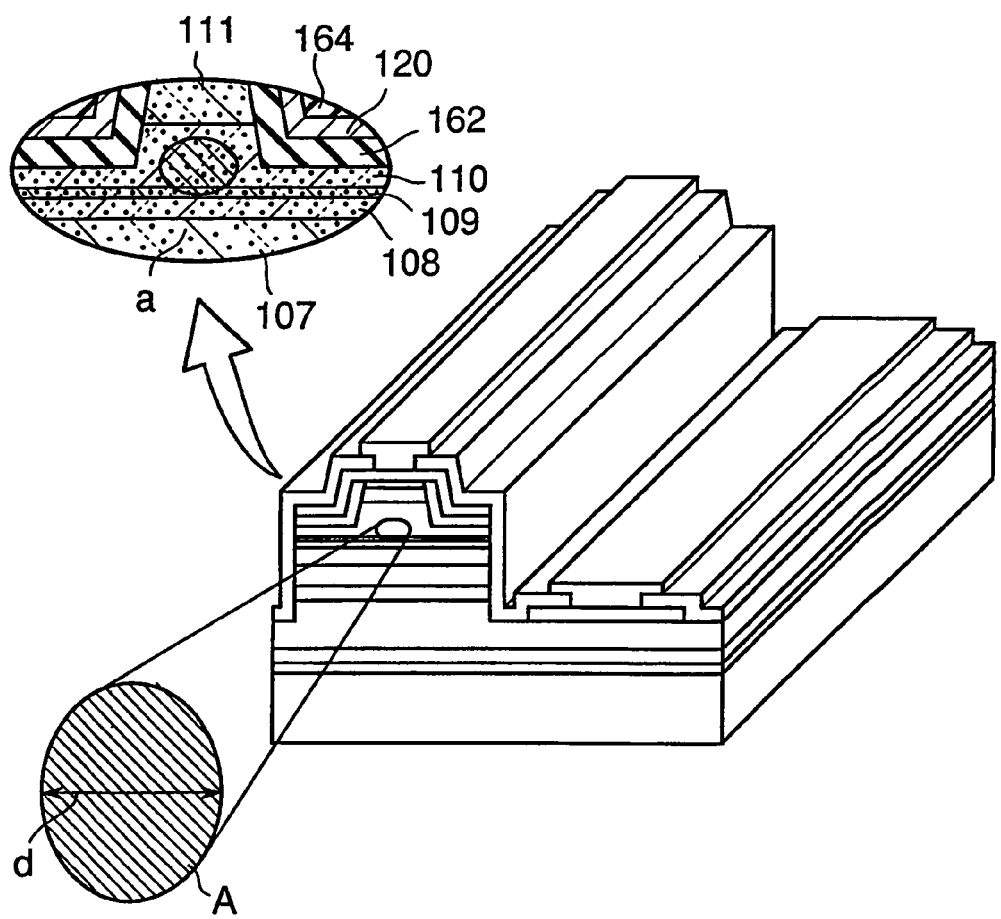
FIG. 20 is a schematic diagram explaining the laser device according to the third embodiment of the present invention.

Preferably, the p-side optical guide layer has the protruding portion of stripe shape, thereby to form the stripe-shaped waveguide region and achieve the effective refractive index distribution as described above. Specifically, laser spot (a) that is the emerging light is shifted to the side of the p-side optical guide layer 109 that has the protruding portion of stripe shape, thereby achieving satisfactory control of the horizontal transverse mode, as shown in FIG. 20. With this configuration, the aspect ratio is greatly improved over that of the prior art because of the satisfactory control of the horizontal transverse mode in the present invention, compared to the laser device of stripe structure of the prior art having narrow F.F.P. in the horizontal direction (x direction) and aspect ratio of 3 or higher.

According to the present invention, in case the active layer is made of nitride semiconductor that includes In, for example ternary mixed crystal of InGaN, consideration must be given to the fact that light emitted in the active layer is diffused by In included in the active layer. That is, light emitted in the active layer is diffused by In which is a light diffusing substance included in the active layer, resulting in a loss that hinders the improvement of output power. In the laser device of the present invention, since laser light is obtained through waveguide that is different from that of the prior art because of the p-side optical guide layer being thicker among the optical guide layers sandwiching the active layer as described above, loss by the light diffusive substance is decreased so as to compensate for the increase in the threshold current due to the increased thickness of the optical guide layer. This is mainly because the light distribution in the waveguide shifts from the gain distribution in the direction of thickness, so that light is distributed and guided in a place offset from the region (active layer) including the light diffusive substance. As a consequence, it is believed that the loss due to the diffusion of light decreases thus making it possible to oscillate with threshold current similar to or less than that of the prior art. Thus the tendency of the threshold current to increase is restricted by increasing the thickness of the optical guide layer, particularly the thickness of the p-side optical guide layer over the prior art, thereby decreasing the loss due to the diffusion of light in the present invention, so that the laser device of good beam profile can be obtained with a threshold current similar to that of the prior art.

In FIG. 20, the spot (a) in the emerging surface is spread in the direction parallel to the junction plane and the angle in x direction (d) in F.F.P. is as small as 10° C. or less with poor aspect ratio. In the present invention, on the contrary, although the longitudinal direction of the spot profile lies in the horizontal direction similarly to the prior art as shown in the drawing, spread in the longitudinal direction is narrower and the angle in x direction in F.F.P. (A) increases to 12° C. or up to 20° C., with satisfactory aspect ratio of around 2.0. The reason for the optical characteristics being improved without affecting the output characteristic and reliability of the device is that the laser device has the stripe-shaped waveguide region that has good effective refractive index which is formed by means of the p-side optical guide layer having the protruding portion of stripe shape, as described above. Moreover, as the thickness of the p-side optical guide layer, or the total thickness of the p-side optical guide layer and the n-side optical guide layer is increased compared to the prior art, as described above, spread of the beam in a direction (y direction) perpendicular to the junction plane in the drawing is suppressed due to the decreasing effect of diffraction, which also contributes to the improvement of the optical characteristic, particularly the aspect ratio, of the laser device of the present invention. That is, laser beam that is nearer to the true circle than the far field pattern (A) of the prior art which is compressed in the vertical direction is obtained, because the spread of light in y direction in F.F.P. is suppressed as well as the control of the horizontal transverse mode described above. As described above, contribution to the improvement in the beam profile in y direction as well as in x direction in F.F.P. made by making the thickness of the p-side optical guide layer greater than that of the n-side optical guide layer is important for achieving the effects of the present invention.

Embodiment 4

In this embodiment, the p-type cap layer, namely the first cladding layer for light confinement is formed on the active layer. The p-type first cladding layer is preferably made of $Al_dGa_{1-d}N$ ($0<d\leq 1$) doped with Mg, with the value of d being set in a range from 0.1 to 0.5 inclusive, and more preferably 0.35 or less. Crystal mixing proportion described above is used for the first cladding layer of the present invention, of which detail will be described later.

Total thickness of the p-type first cladding layer is set in a range from 10 to 1000 Å inclusive, and preferably in a range from 20 to 400 Å inclusive. The reason for setting the thickness of the p-type first cladding layer in this range is as follows.

Although the carrier confinement function can be effectively achieved when the p-type first cladding layer is made of AlGaN, the AlGaN layer has larger bulk resistance than gallium nitride semiconductor that does not include Al. Thus it is necessary to suppress the increase in the resistance of the light emitting device due to the formation of the p-type first cladding layer, which is the reason for setting the thickness within 1000 Å and preferably within 400 Å.

Major function of the p-type first cladding layer is to confine the carriers as described above. To achieve this function effectively, thickness of the layer is set to 10 Å or more, and preferably 20 Å or more.

When the thickness is in the range described above, the carriers can be effectively confined within the active layer 6, and the bulk resistance can be restricted to a low level.

Concentration of Mg with which the p-type first cladding layer is doped is preferably in a range from $1\times10^{19}/cm^3$ to $1\times10^{21}/cm^3$. With the doping concentration being set within this range, Mg diffuses into the p-type guide layer that is grown in the undope process described later, in addition to a decrease in the bulk resistance, and Mg can be included with a concentration from $1\times10^{16}/cm^3$ to $1\times10^{18}/cm^3$ in the p-type guide layer that is a relatively thin layer.

Although the p-type first cladding layer of this embodiment may be formed from two layers of a first p-type nitride semiconductor layer made of $Al_aGa_{1-a}N$ and a second p-type nitride semiconductor layer made of $Al_bGa_{1-b}N$ formed thereon, the present invention is not limited to this configuration. The p-type first cladding layer may also be formed from more than two layers or, for example, the second nitride semiconductor layer may comprise a plurality of layers stacked one on another.

Also there is no limitation to the proportion of Al included in the mixed crystal of the layers. In the first p-type nitride semiconductor layer made of $Al_aGa_{1-a}N$, however, decomposition of the active layer can be effectively suppressed by setting the proportion a of Al included in the mixed crystal to 0 or larger in the first p-type nitride semiconductor. In order to achieve this function, it is preferable to form the $Al_aGa_{1-a}N$ layer with a>0, that makes it possible to form a layer, which is chemically stable and has a relatively high melting point among nitride semiconductors, at a position near (preferably on) the active layer, thereby effectively suppressing the decomposition of the active layer. Also according to the present invention, good offset from the active layer can be provided (potential barrier can be formed) and satisfactory injection of carriers without carrier overflow can be achieved by setting the proportions a and b of Al included in the mixed crystal preferably larger than 0.1, more preferably 0.2 or larger in the first p-type nitride semiconductor layer and the second p-type nitride semiconductor layer. At this time, it is desirable that the first p-type nitride semiconductor and the second p-type nitride semiconductor have the same composition, namely a=b. Under this condition, since the quantities of the source gases and impurity gas supplied to the production process can be easily controlled, the first p-type nitride semiconductor layer and the second p-type nitride semiconductor layer can be formed under stable condition with high accuracy.

Now the conditions of growing the first p-type nitride semiconductor layer and the second p-type nitride semiconductor layer will be described below.

It is preferable to grow the second p-type nitride semiconductor layer at a temperature higher than that for the first p-type nitride semiconductor layer.

The first p-type nitride semiconductor layer is preferably grown at 800° C. or higher temperature, more preferably around 850 to 950° C., similar to the temperature at which the active layer is grown.

Growing temperature of the second p-type nitride semiconductor layer is set preferably about 100° C. higher than the growing temperature of the active layer, for example, which makes it possible to form the AlGaN layer of good crystallinity.

It is preferable to grow the first p-type nitride semiconductor layer and the second p-type nitride semiconductor layer in different atmospheres. That is, the first p-type nitride semiconductor layer is preferably grown in substantially the same atmosphere as that for the active layer, which makes it possible to prevent the active layer from being decomposed. The second p-type nitride semiconductor layer is grown in such an atmosphere that is favorable for forming a good offset. When the growing conditions are set as described above, the first p-type nitride semiconductor layer can have the function to prevent the active layer from being decomposed, and the second p-type nitride semiconductor layer can achieve good offset, due to the difference in the conditions of growing the crystals in the two layers. Specifically, the layers having the functions described above can be formed by growing the first p-type nitride semiconductor layer in $N_2$ atmosphere and the second p-type nitride semiconductor layer in $H_2$ atmosphere, resulting in the device having good light emitting characteristic.

In case the p-type first cladding layer is formed from at least two layers, it is preferable that thickness of the first p-type nitride semiconductor layer is set in a range from 10 to 100 Å, and thickness of the second p-type nitride semiconductor layer is set in a range from 10 to 300 Å, for the purpose of restricting the increase in Vf (forward voltage) of the light emitting element due to the formation of the p-type first cladding layer. In order to restrict the increase in Vf further, it is more preferable that thickness of the first p-type nitride semiconductor layer is set in a range from 10 to 30 Å, and thickness of the second p-type nitride semiconductor layer is set in a range from 10 to 100 Å

Then the p-type guide layer is grown on the p-type first cladding layer. The p-type guide layer is preferably formed by growing a nitride semiconductor layer made of undoped GaN. Thickness is preferably in a range from 0.1 to 0.07 μm. When the thickness is in this range, the threshold can be decreased. While the p-type guide layer is grown as an undoped layer as described above, Mg included as the dopant in the p-type first cladding layer 7 diffuses so that Mg is included with a concentration in a range from $1\times10^{16}/cm^3$ to $1\times10^{18}/cm^3$.

The p-type second cladding layer is formed on the p-type guide layer similarly to the embodiment described above, thereby achieving light confinement.

The present invention will now be described more specifically by way of examples.

The present invention will be described more concretely in the following examples.

EXAMPLE 1

FIG. 2 is a sectional view showing the structure of the laser device according to an example of the present invention. In this drawing, the device which is cut in the perpendicular direction to the stripe waveguide is shown. Example 1 will be described with reference to FIG. 1.

(Buffer Layer 2)

An auxiliary substrate made of C-face sapphire of one-inch φ was set in the MOVPE reactor and the temperature was adjusted to 500° C. A buffer layer made of GaN which had a thickness of about 200 angstroms was grown using trimethylgallium (TMG) and ammonia ($NH_3$)

(Nitride Semiconductor Layer (Underlying Layer) 4)

After growing the buffer layer, at 1050° C., using ammonia and TMG, a nitride semiconductor layer 4 made of undoped GaN was grown to the thickness of 4 μm. This layer acts as an underlying layer for growth of each layer which constitutes a device structure.

(N-Side Contact Layer 5)

Next, using ammonia and TMG, and silane gas as an impurity gas, an n-side contact layer 5 made of GaN doped with Si to $3 \times 10^{18}/cm^3$ was grown to the thickness of 4 μm at 1050° C.

(Crack Preventing Layer 6)

Next, using TMG, TMI (trimethylindium) and ammonia, a crack preventing layer 6 made of $In_{0.06}Ga_{0.94}N$ was grown to the thickness of 0.15 μm. This crack preventing layer may be omitted.

(N-Side Cladding Layer 7)

Subsequently, at 1050° C., a layer made of undoped $Al_{0.16}Ga_{0.84}N$ was grown to the thickness of 25 angstroms using TMA (trimethylaluminium), TMG and ammonia. Subsequently, TMA was stopped and the silane gas was flown. A layer made of n-type GaN doped with Si to $1 \times 10^{19}/cm^3$ was grown to the thickness of 25 angstroms. These layers were laminated alternately to form a super lattice layer, resulting in an n-side cladding layer 7 in a super lattice structure with a total thickness of 1.2 μm.

(N-Side Optical Waveguide Layer 8)

Next, the silane gas was stopped and an n-side optical waveguide layer 8 made of undoped GaN was grown to the thickness of 0.1 μm at 1050 ° C. The n-side optical waveguide layer 8 may be doped with an n-type impurity.

(Active Layer 9)

Next, at 800° C., a barrier layer made of $In_{0.05}Ga_{0.95}N$ doped with Si was grown to the thickness of 100 angstroms. Subsequently, at the same temperature, a well layer made of undoped $In_{0.2}Ga_{0.8}N$ was grown to the thickness of 40 angstroms. Two barrier layers and two well layers were laminated alternately and at the last, a barrier layer was laminated, with the result that the active layer in the multiple quantum well structure (MQW) having a total thickness of 380 angstroms was obtained. The active layer may be undoped like in this example and may be doped with an n-type impurity and/or a p-type impurity. Both of the well layer and the barrier layer may be doped with an impurity, or either one may be doped. And when only barrier layer is doped with an n-type impurity, the threshold tends to decrease.

(P-Side Capping Layer 10)

Next, the temperature was raised to 1050° C. A p-side capping layer 7 made of $Al_{0.3}Ga_{0.7}N$ doped with Mg to $1 \times 10^{20}/cm^3$ and having a band gap energy larger than that of the p-side optical waveguide layer 11 was grown to the thickness of 300 angstroms, using TMG, TMA, ammonia and Cp2Mg (cyclopentadienyl magnesium).

(P-Side Optical Waveguide Layer 11)

Next, Cp2Mg and TMA were stopped and 1050° C., a p-side optical waveguide layer 11 made of undoped GaN and having a band gap energy lower than that of the p-side capping layer 10 was grown to the thickness of 0.1 μm.

This p-side optical waveguide layer 8 was undoped, that is, intentionally undoped, but due to the diffusion of Mg from the adjacent p-side first cladding layer and p-side second cladding layer, the real concentration of Mg was $5 \times 10^{16}/cm^3$, resulting in the layer doped with Mg.

(P-Side Cladding Layer 12)

Subsequently, at 1050° C., a layer made of undoped $Al_{0.16}Ga_{0.84}N$ was grown to the thickness of 25 angstroms. Subsequently, Cp2Mg and TMA were stopped and a layer made of undoped GaN was grown to the thickness of 25 angstroms. Thus, a p-side cladding layer 12 in a super lattice structure was grown to a total thickness of 0.6 μm. If the p-side cladding layer is a super lattice layer formed by laminating nitride semiconductor layers at least one of which contains Al and which have different band gap energies from each other, either one layer may be doped with an impurity in a larger amount, what is called modulation doping, with the result that the crystallinity tends to increase. But both layers may be doped in the same amount. The cladding layer 12 is preferably in the super lattice structure including a nitride semiconductor layer containing Al, preferably $Al_XGa_{1-X}N$ (0<X<1). More preferably, the cladding layer 12 is in the super lattice structure formed by laminating GaN and AlGAN. For the p-side cladding layer 12 in the super lattice structure, the mixing proportion of Al in the entire cladding layer can be increased and then, the refractive index of the cladding layer itself decreases. Moreover, the band gap energy, becomes large, resulting in the decrease of the threshold. Further, the number of the pits occurring in the cladding layer in the super lattice structure is smaller than that not in the super lattice structure, resulting in the decrease of the provability of the short circuit.

(P-Side Contact Layer 13)

Finally, at 1050° C., on the p-side cladding layer 9, a p-side contact layer 13 made of p-type GaN doped with Mg to $1 \times 10^{20}/cm^3$ was grown to the thickness of 150 angstroms. The p-side contact layer may be made of p-type $In_XAl_YGa_{1-X-Y}N$ (0≦X, 0≦Y, X+Y≦1) and preferably, the p-side contact layer may be made of GaN doped with Mg, thereby most preferable ohmic contact with the p-electrode 20 can be obtained. Since the contact layer 13 is a layer where an electrode is formed, it is desirable that the carrier concentration is as high as not less than $1 \times 10^{17}/cm^3$. If the carrier concentration is less than $1 \times 10^{17}/cm^3$, it is difficult to obtain a good ohmic contact with the electrode. If the composition of the contact layer is GaN, it is easy to obtain a good ohmic contact with the electrode material.

The resulting wafer on which the nitride semiconductor had been grown was removed out of the reactor. A protective film of $SiO_2$ was formed on the top surface of the p-side contact layer which was an uppermost layer and etching was conducted with $SiC_{l4}$ gas by RIE (reactive ion etching), to expose the surface of the n-side contact layer 5 on which an n-electrode was to be formed, as shown in FIG. 1. Thus, $SiO_2$ is most preferable as a protective film so as to etch the nitride semiconductor deeply.

A method for forming a waveguide region in the stripe geometry as described above will be described in details in the following part. First, as shown in FIG. 3A, a first protective film 61 made of Si oxide (mainly, SiO$_2$) was formed to the thickness of 0.5 µm on the almost entire surface of the uppermost p-side contact layer 13 with PVD apparatus. Thereafter, a mask of a predetermined shape was placed on the first protective film 61 and a third protective film 63 made of photo resist having a stripe width of 2 µm and a thickness of 1 µm was formed.

Next, as shown in FIG. 3B, after the third protective film 63 was formed, said first protective film was etched by CF$_4$ gas with a RIE (reactive ion etching) apparatus to have a stripe structure using the third protective film 63 as a mask. Thereafter, only the photo resist was removed by the treatment with an etchant to form a first protective film 61 having a stripe width of 2 µm on the p-side contact layer 13, as shown in FIG. 3C.

Further, as shown in FIG. 3D, after the first protective film 61 of a stripe geometry was formed, the p-side contact layer 13 and the p-side cladding layer 12 were again etched using SiCl$_4$ gas with the RIE to form a ridge stripe as a stripe waveguide region having such a thickness that the thickness of the p-side cladding layer was 0.01 µm.

After formation of the ridge stripe, the wafer was transferred into the PVD apparatus, and as shown in FIG. 3E, a second protective film 62 made of Zr oxide (mainly ZrO$_2$) having thickness of 0.5 µm a was formed continuously on the first protective film 61 and on the p-side cladding layer 12 which had been exposed by etching.

After the formation of the protective film 62, the wafer was treated at 600° C. Thus, in the case that the second protective film is made of a material other than SiO$_2$, the heat treatment may be conducted at the temperature of not less than 300° C., preferably not less than 400° C. and not more than the decomposition temperature of the nitride semiconductor (1200° C.), with the result that the second protective film becomes difficult to dissolve in the material (hydrofluoric acid) for dissolving the first protective film. Therefore, the heat treatment step is further desirably added.

Next, the wafer was soaked in hydrofluoric acid and as shown in FIG. 3F, the first protective film 61 was removed using a lift-off method.

Next, as shown in FIG. 3G, a p-electrode 20 made of Ni/Au was formed on the surface of the p-side contact layer which had been exposed by removing the first protective film 61 on said p-side contact layer 13. The p-electrode 20 had a stripe width of 100 µm and was formed in a manner to extend over the second protective film 62, as shown in this drawing. After the second protective film was formed, an n-electrode 21 made of Ti/Al was formed parallel to the stripe on the exposed surface of the n-side contact layer 5.

Next, a mask was placed in the desired region on the surface which had been exposed by etching to form an n-electrode to provide an output electrode for the p- and n-electrodes and a dielectric multi-layered film 64 made of SiO$_2$ and TiO$_2$ was formed. Thereafter, output (pad) electrode 22 and 23 made of Ni—Ti—Au (1000 angstroms-1000 angstroms-8000 angstroms) were formed, respectively, on the p- and n-electrode.

The sapphire substrate of the resulting wafer on which an n-electrode and a p-electrode were formed in the above-mentioned manner was polished to the thickness of about 70 µm. Thereafter, the wafer was cleaved into bars perpendicularly with respect to the stripe electrode from the substrate to fabricate a resonator on the cleaved facet ((11-00) face, which corresponds to the side face of the crystal in a hexagonal system=M face). A dielectric multi-layered film made of SiO$_2$ and TiO$_2$ was formed on the facet of the resonator and finally, the bar was cut parallel to the p-electrode, resulting in a laser device as shown in FIG. 1. The length of the resonator was 800 µm.

Figure 5:
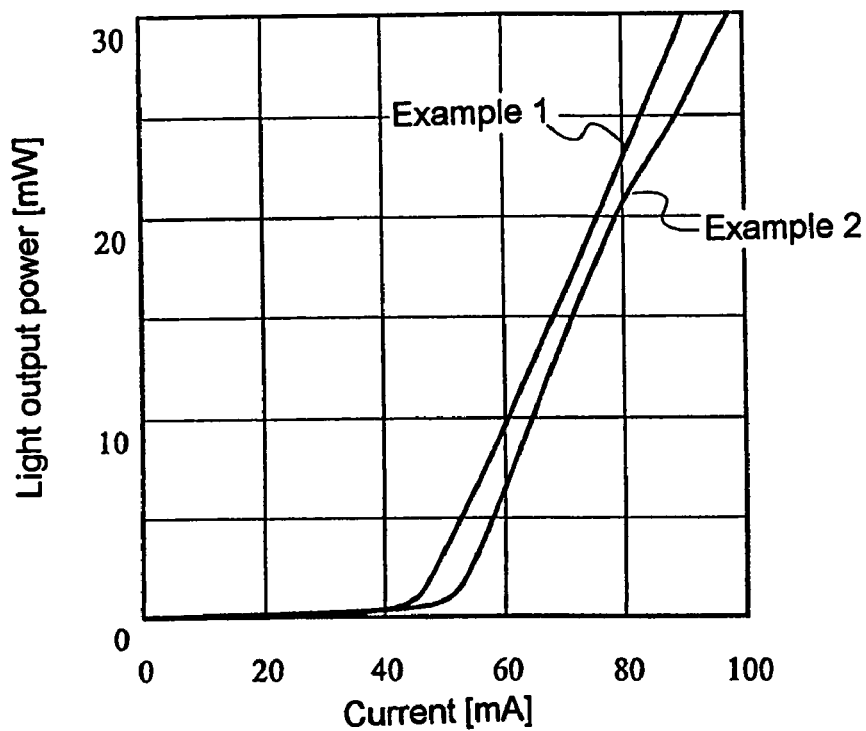
FIG. 5 is a current-optical output characteristic diagram of a laser device according to an example of the present invention.

The resulting laser device was set on the heat sink and each pad electrode was connected by wire-bonding. The laser oscillation was tried at room temperature. The continuous oscillation at a wavelength of 400 nm to 420 nm was observed at the threshold current density of 2.9 kA/cm$^2$ at room temperature. Further the current was raised and thereby, the light output power was raised. The current-light output power characteristics were obtained under the condition that the transverse mode was a basic mode (a single mode). As shown in FIG. 5, no kinks occurred even at 5 mW and further, no kinks occurred even when the light output power was raised to 30 mW, the transverse mode being stable. And also, the device lifetime was tested. The continuous oscillation of not less than ten thousand hours was observed at 5 mW of the output power. In some devices, the continuous oscillation of more than one thousand hours was also observed even at 30 mW of the light output power. Thus, even when the light output power was increased in the single transverse mode (basic mode), the stable transverse mode could be obtained. Therefore, such a laser can be applied to the optical disk for recording and reproducing.

EXAMPLE 2

The laser device was fabricated in the same manner as in Example 1, except that the etching depth for the formation of the stripe waveguide region was such that the thickness of the p-side cladding layer was 0.1 µm, that is, the flat surface of the nitride semiconductor which had been exposed by etching (the exposed surface of the p-side cladding layer) was at 0.1 µm from the interface between the p-side cladding layer and the p-side optical waveguide layer in the direction toward the p-side contact layer. The resulting laser device had a similar property to that in Example 1 at relatively lower light output power, as shown in FIG. 5 which shows the current—light output power properties. But kinks were observed near 20 mW. The transverse mode was unstable in the high output region as compared with in Example 1. The device lifetime was more than ten thousand hours at the output of 5 mW.

EXAMPLE 3

Figure 6:
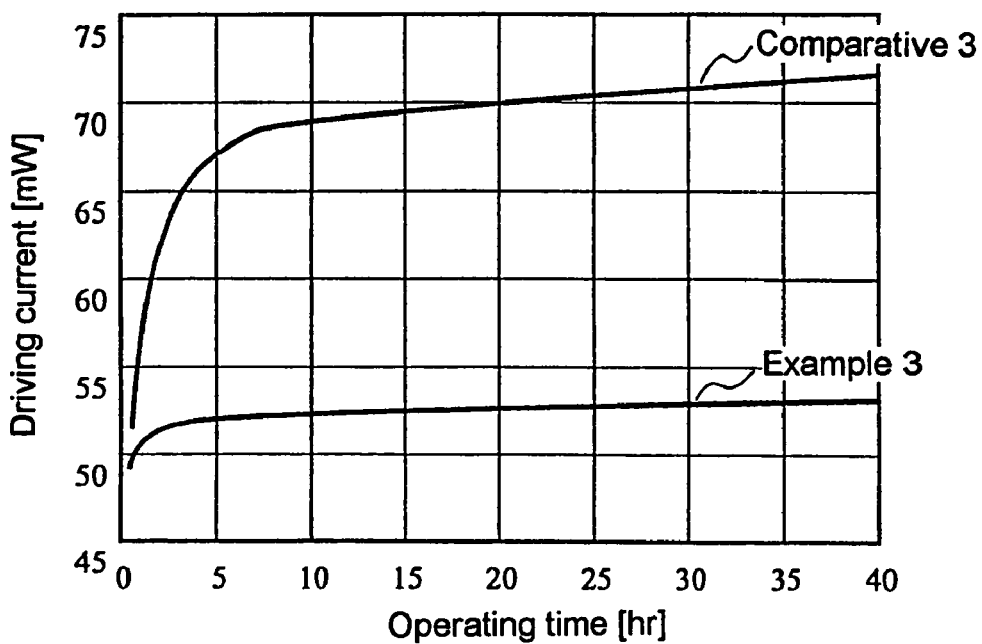
FIG. 6 is a diagram showing changes in drive current due to deterioration of a laser device according to an example of the present invention.
Figure 7:
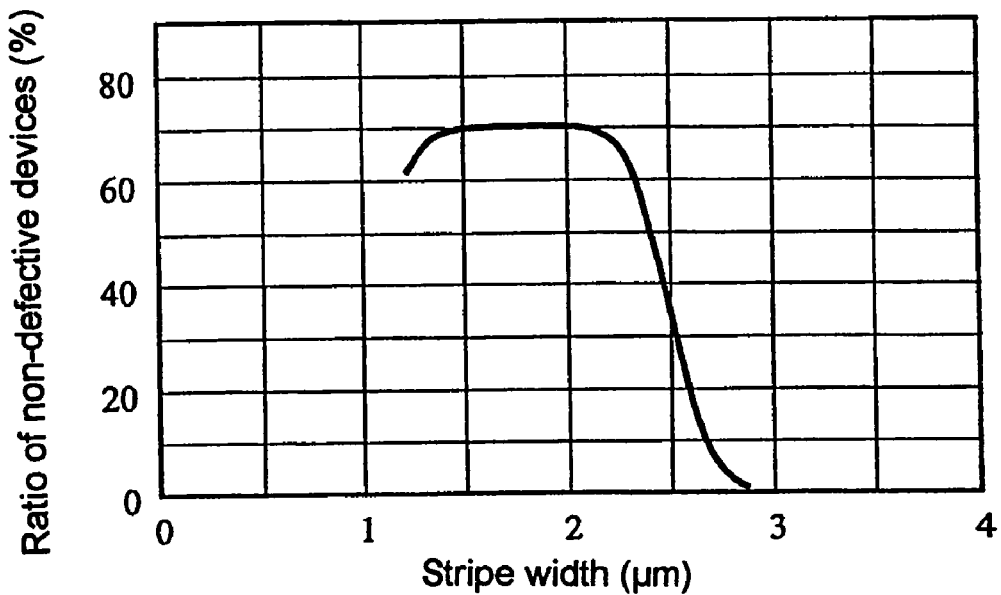
FIG. 7 is a diagram showing the relation between stripe width and single transverse mode oscillation in the present invention.
Figure 8:
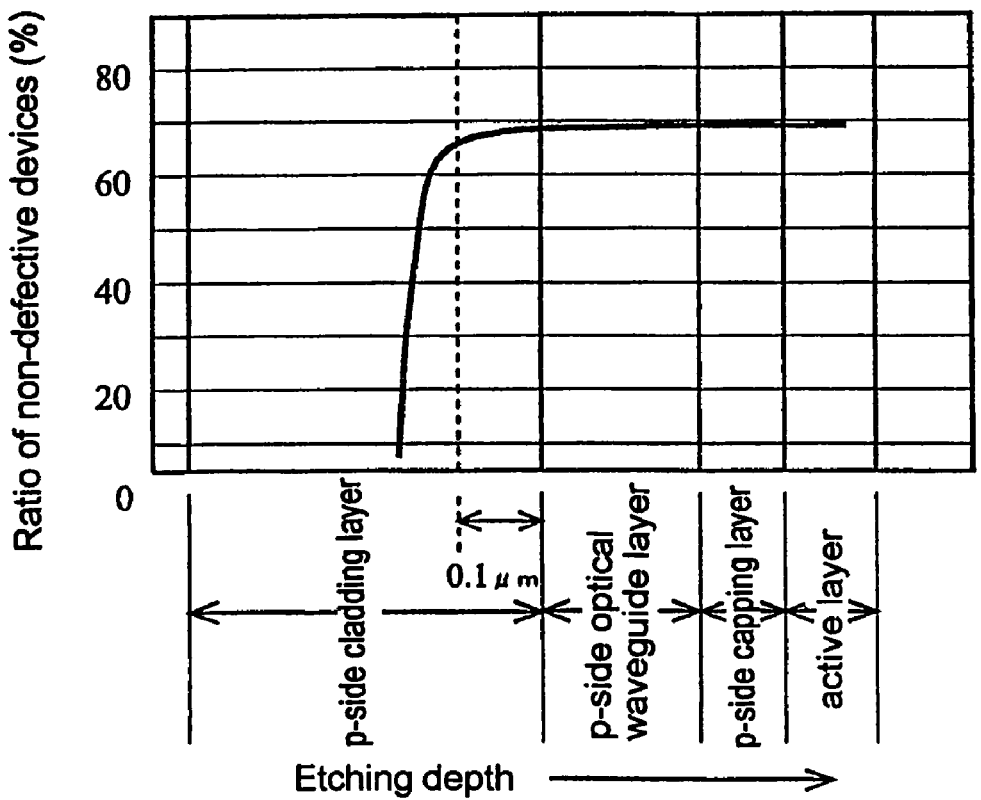
FIG. 8 is a diagram showing the relation between depth of etching and single transverse mode oscillation in the present invention.
Figure 9:
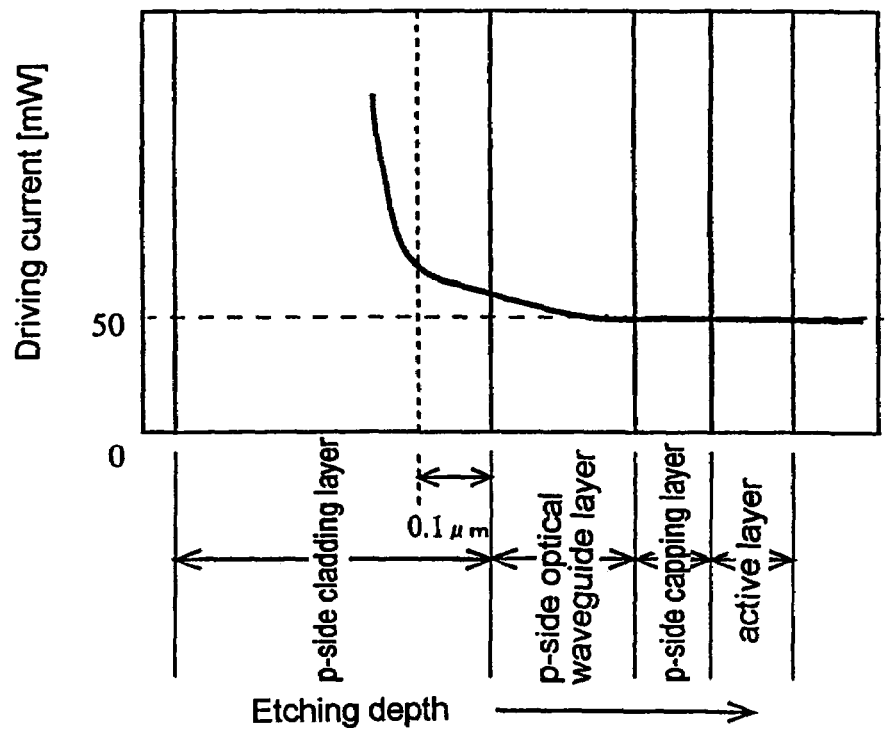
FIG. 9 is a diagram showing the relation between depth of etching and drive current in the present invention.

The laser device was fabricated in the same manner as in Example 1, except that the etching depth for the formation of the stripe waveguide region was such that the thickness of the p-side cladding layer was 0.05 µm, that is, the flat surface of the nitride semiconductor which had been exposed by etching (the exposed surface of the p-side cladding layer) was at 0.05 µm from the interface between the p-side cladding layer and the p-side optical waveguide layer in the direction toward the p-side contact layer. The resulting laser device showed a little less stability in the transverse mode, particularly in the output power region of not less than 20 mW, as compared with in Example 1. The stability in the transverse mode was better than in Example 2. The device lifetime was more than ten thousand hours at 5 mW of the output, like in Examples 1 and 2. Some devices had a lifetime of more than one thousand hours at 30 mW, but the ratio thereof was small as compared with in Example 1. FIG. 6 shows the change of the driving current with respect to the operating time at 5 mW and at 70° C. As shown in FIG. 6, the change of the driving current in Example 3 is largely different form that in Comparative Example 3 in the transition region of from the initial deterioration to the point where the deterioration rate is constant. The driving current value at which the deterioration rate is constant is lower and the deterioration rate (the slop of the linear part in the drawing) is also lower than in Comparative Example 3.

EXAMPLE 4

The laser device, as shown in FIG. 1, was fabricated in the same manner as in Example 1, except that the etching depth was such that the thickness of the p-side cladding layer was 0.1 μm, that is, the flat surface of the nitride semiconductor which had been exposed by etching was at the point where the almost entire p-side optical waveguide layer was removed, that is, at 0.03 μm from the interface between the p-side capping layer and the active layer and the second protective film was not formed.

The resulting laser device had a similar stability of the transverse mode during the increase of the optical output power to that in Example 3. There were no kinks occurring in the relatively wide region. The device lifetime was more than ten thousand hours at 5 mW of output power.

EXAMPLE 5

The laser device was fabricated in the same manner as in Example 4, except that the etching depth was such that the thickness of the p-side cladding layer was 0.05 μm The resulting laser device had a similar stability of the transverse mode to that in Example 4. The laser device had a long lifetime.

EXAMPLE 6

The laser device was fabricated in the same manner as in Example 1, except that the ridge width was 1.2 μm.

The resulting laser had almost similar properties to those in Example 1. There were no kinks occurring in the wide region of a few mW to a few tens mW and the device lifetime was long.

COMPARATIVE EXAMPLE 1

The laser device was fabricated in the same manner as in Example 4, except that the etching depth was such that the thickness of the p-side cladding layer was 0.2 μm For the resulting laser device, the transverse mode was unstable. The devices were of uneven stability. Small number of devices had no kinks at the output power up to 5 mW. The device lifetime was good to some extent, but the lifetime was not long as compared with in Example 2.

COMPARATIVE EXAMPLE 2

The laser device was fabricated in the same manner as in Example 1, except that the etching depth was such that the etching reached the active layer, that is, that the etching reached the part in the active layer at a slight distance from the interface between the active layer and the p-side capping layer.

The resulting devices ware of uneven lifetime. But the lifetime of most devices was decreased largely as compared with in each example. Most devices had a lifetime of about 100 hours at 5 mW operation.

COMPARATIVE EXAMPLE 3

Figure 4:
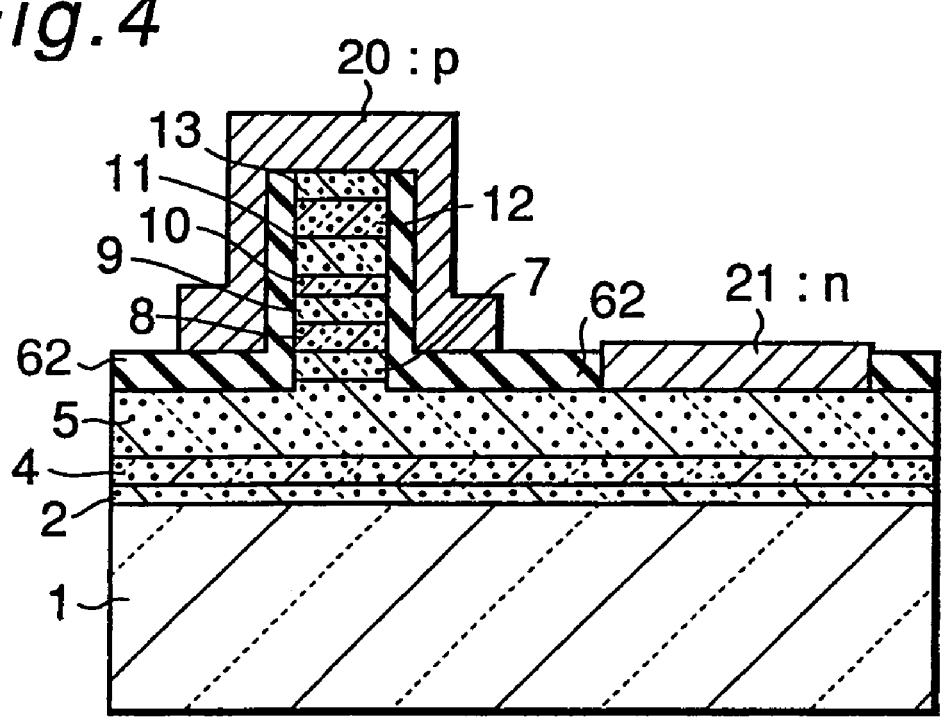
FIG. 4 is a schematic sectional view showing a laser device for comparison.

As shown in FIG. 4, The laser device was fabricated in the same manner as in Example 1, except that the etching reached the n-side contact layer 7.

The resulting laser device had a short lifetime like in Comparative Example 2. The results were shown in FIG. 6. FIG. 6 showed that at 70° C. and at the output power of 5 mW, the driving current increased largely before the deterioration rate was stabilized and the deterioration rate was high, showing that the lifetime properties were not good. The transverse mode was unstable and the devices were of uneven properties. Such a trend became remarkable as the optical output power increased.

COMPARATIVE EXAMPLE 4

The laser device was fabricated in the same manner as in Example 1, except that the ridge width was 3.5 μm.

For the resulting laser device, the transverse mode was unstable and the devices were of uneven stability in the transverse mode. Kinks occurred in the range of 3 to 10 mW in the almost all devices.

EXAMPLE 7

FIG. 17 is a sectional view showing the structure of the laser device according to an example of the present invention. In this drawing, the layered structure which is cut in the perpendicular direction to the projected stripe region is shown. Example 7 will be described with reference to FIG. 17.

A sapphire substrate having its principal surface represented by a C-face was used as a substrate. The orientation flat face was represented by an A-face. The substrate on which the nitride semiconductor is to be grown may be an auxiliary substrate made of the material other than nitride semiconductor, such as SiC, ZnO, spinel ($MgAl_2O_4$), GaAs and the like, as well as sapphire (its principal surface represented by C-face, R-face and A-face), which are known to be used for growing the nitride semiconductor. The nitride semiconductor may be grown directly on the substrate made of nitride semiconductor such as GaN.

(Buffer Layer 102)

An auxiliary substrate 101 made of C-face sapphire of one-inch φ was set in the MOVPE reactor and the temperature was adjusted to 500° C. A buffer layer made of GaN which had a thickness of about 200 angstroms was grown using trimethylgallium (TMG) and ammonia ($NH_3$).

(Underlying Layer 103)

After growing the buffer layer, at 1050° C., using ammonia and TMG, an underlying layer 103 made of undoped GaN was grown to the thickness of 4 μm. This layer acts as a substrate for growth of each layer which constitutes a device structure. Thus, in the case that the device structure made of nitride semiconductor is formed on the auxiliary substrate, the underlying layer is preferably formed which acts a low-temperature grown buffer layer and a substrate for nitride semiconductor.

(N-Side Contact Layer 104)

Next, using ammonia and TMG, and silane gas as an impurity gas, an n-side contact layer 104 made of GaN doped with Si to $3 \times 10^{18}/cm^3$ was grown to the thickness of 4 μm on the nitride semiconductor substrate 101 at 1050° C.

(Crack Preventing Layer 105)

Next, using TMG, TMI (trimethylindium) and ammonia, at 800° C., a crack preventing layer 105 made of $In_{0.06}Ga_{0.94}N$ was grown to the thickness of 0.15 μm. This crack preventing layer may be omitted.

(N-Side Cladding Layer 106)

Subsequently, at 1050° C., a layer made of undoped $Al_{0.16}Ga_{0.84}N$ was grown to the thickness of 25 angstroms using TMA (trimethylaluminium), TMG and ammonia. Subsequently, TMA was stopped and the silane gas was flown. A layer made of n-type GaN doped with Si to $1\times10^{19}/cm^3$ was grown to the thickness of 25 angstroms. These layers were laminated alternately to form a super lattice layer, resulting in an n-side cladding layer 106 in a super lattice structure with a total thickness of 1.2 μm.

(N-Side Optical Waveguide Layer 107)

Next, the silane gas was stopped and an n-side optical waveguide layer 107 made of undoped GaN was grown to the thickness of 0.2 μm at 1050° C. The n-side optical waveguide layer 107 may be doped with an n-type impurity.

(Active Layer 108)

Next, at 800° C., a barrier layer made of $In_{0.05}Ga_{0.95}N$ doped with Si was grown to the thickness of 100 angstroms. Subsequently, at the same temperature, a well layer made of undoped $In_{0.2}Ga_{0.8}N$ was grown to the thickness of 40 angstroms. Two barrier layers and two well layers were laminated alternately and at the last, a barrier layer was laminated, with the result that the active layer in the multiple quantum well structure (MQW) having a total thickness of 380 angstroms was obtained. The active layer may be undoped like in this example and may be doped with an n-type impurity and/or a p-type impurity. Both of the well layer and the barrier layer may be doped with an impurity, or either one may be doped. And when only barrier layer is doped with an n-type impurity, the threshold tends to decrease.

(P-Side Capping Layer 109)

Next, the temperature was raised to 1050° C. A p-side capping layer 109 made of $Al_{0.3}Ga_{0.7}N$ doped with Mg to $1\times10^{20}/cm^3$ and having a band gap energy larger than that of the p-side optical waveguide layer 11 was grown to the thickness of 300 angstroms, using TMG, TMA, ammonia and Cp2Mg (cyclopentadienylmagnesium).

(P-Side Optical Waveguide Layer 110)

Subsequently, Cp2Mg and TMA were stopped and at 1050° C., a p-side optical waveguide layer 110 made of undoped GaN and having a band gap energy lower than that of the p-side capping layer 10 was grown to the thickness of 0.2 μm.

This p-side optical waveguide layer 110 is undoped, that is, intentionally undoped, but due to the diffusion of Mg from the adjacent p-side first cladding layer and p-side second cladding layer, the real concentration of Mg is $5\times10^{16}/cm^3$, resulting in the layer doped with Mg.

(P-Side Cladding Layer 111)

Subsequently, at 1050° C., a layer made of undoped $Al_{0.16}Ga_{0.84}N$ was grown to the thickness of 25 angstroms. Subsequently, Cp2Mg and TMA were stopped and a layer made of undoped GaN was grown to the thickness of 25 angstroms. Thus, a p-side cladding layer 111 in a super lattice structure was grown to a total thickness of 0.6 μm. If the p-side cladding layer is a super lattice layer formed by laminating nitride semiconductor layers at least one of which contains Al and which have different band gap energies from each other, either one layer may be doped with an impurity in a larger amount, what is called modulation doping, with the result that the crystallinity tends to increase. But both layers may be doped in the same amount. The cladding layer 111 is preferably in the super lattice structure including a nitride semiconductor layer containing Al, preferably $Al_XGa_{1-X}N$ ($0<X<1$). More preferably, the cladding layer 12 is in the super lattice structure formed by laminating GaN and AlGAN. For the p-side cladding layer 11 in the super lattice structure, the mixing proportion of Al in the entire cladding layer can be increased and then, the refractive index of the cladding layer itself decreases. Moreover, the band gap energy becomes large, resulting in the decrease of the threshold. Further, the pits occurring in the cladding layer in the super lattice structure decreases, as compared with not in the super lattice structure, resulting in the decrease of the provability of the short circuit.

(P-Side Contact Layer 112)

Finally, at 1050° C., on the p-side cladding layer 111, a p-side contact layer 112 made of p-type GaN doped with Mg to $1\times10^{20}/cm^3$ was grown to the thickness of 150 angstroms. The p-side contact layer may be made of p-type $In_XAl_YGa_{1-X-Y}N$ ($0\leq X, 0\leq Y, X+Y\leq 1$) and preferably, the p-side contact layer may be made of GaN doped with Mg, thereby most preferable ohmic contact with the p-electrode 20 can be obtained. Since the contact layer 112 is a layer where an electrode is formed, it is desirable that the carrier concentration is as high as not less than $1\times10^{17}/cm^3$. If the carrier concentration is less than $1\times10^{17}/cm^3$, it is difficult to obtain a good ohmic contact with the electrode. If the composition of the contact layer is GaN, it is easy to obtain a good ohmic contact with the electrode material.

The resulting wafer on which the nitride semiconductor had been grown was removed out of the reactor. A protective film of $SiO_2$ was formed on the top surface of the p-side contact layer which was an uppermost layer and etching was conducted with $SiC_{14}$ gas using RIE (reactive ion etching), to expose the surface of the n-side contact layer 104 on which an n-electrode was to be formed, as shown in FIG. 17. Thus, $SiO_2$ is most preferable as a protective film so as to etch the nitride semiconductor deeply.

Figure 19A:
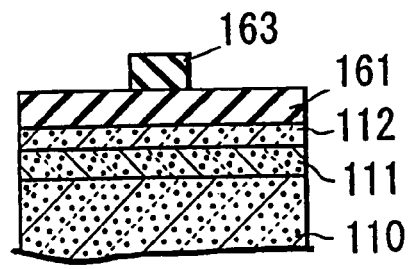
FIGS. 19A through 19G are schematic sectional views showing processes of a method for producing the laser devices according to the second and third embodiments of the present invention.

A method for forming a waveguide region in the stripe geometry will be described in details in the following part. First, as shown in FIG. 19A, a first protective film 161 made of Si oxide (mainly, $SiO_2$) was formed to the thickness of 0.5 μm on the almost entire surface of the uppermost p-side contact layer 112 with PVD apparatus. Thereafter, a mask of a predetermined shape was placed on the first protective film 161 and a third protective film 163 made of photo resist having a stripe width of 2 μm and a thickness of 1 μm was formed. The insulting properties of the first protective film are of no importance. The first protective film 161 may be made of any material which has a different etching rate from that of the nitride semiconductor. For example, the first protective film may be made of Si oxide (including $SiO_2$), photo resist and the like. Preferably, the material which has an acid solubility larger than that of the second protective film to be formed later may be selected, so as to provide the solubility difference between the first and second protective films. The acid may be preferably hydrofluoric acid and therefore, Si oxide may preferably be used as a material that is easy to dissolve in hydrofluoric acid.

Figure 19B:
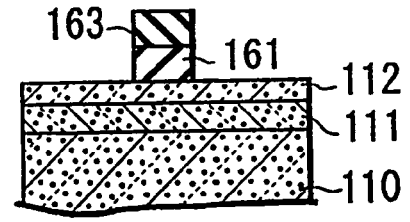
Figure 19C:
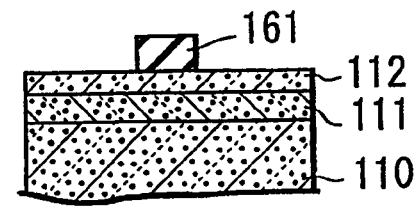

Next, as shown in FIG. 19B, after the third protective film 163 was formed, said first protective film was etched by $CF_4$ gas with a RIE (reactive ion etching) apparatus to have a stripe structure using the third protective film 163 as a mask. Thereafter, only the photo resist was removed by the treatment with an etchant to form a first protective film 161 having a stripe width of 2 μm on the p-side contact layer 112, as shown in FIG. 19C.

Figure 19D:
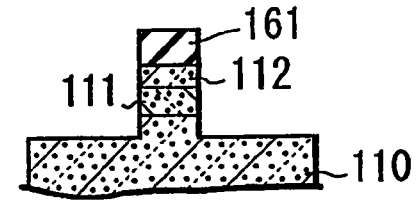

Further, as shown in FIG. 19D, after the first protective film 161 of a stripe geometry was formed, the p-side contact layer 112, the p-side cladding layer 111 and the p-side optical waveguide layer 110 were again etched using SiCl$_4$ gas with the RIE to form a ridge stripe as a stripe waveguide region having such a thickness that the thickness of the etched region (the region except the projected portion) of the p-side optical waveguide layer was 1000 angstroms.

Figure 19E:
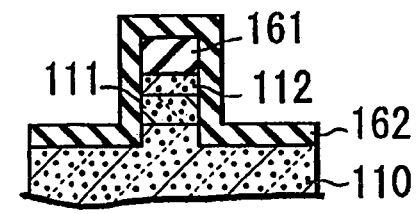

After formation of the ridge stripe, the wafer was transferred into the PVD apparatus, and as shown in FIG. 19E, a second protective film 162 made of Zr oxide (mainly ZrO$_2$) was formed to the thickness of 0.5 µm continuously on the first protective film 161 and on the p-side optical waveguide layer 111 which had been exposed by etching (the region except the projected portion).

It is desirable that the second protective film may be made of the material other than SiO$_2$, preferably at least one selected from oxide containing at least one element selected from the group consisting of Ti, V, Zr, Nb, Hf and Ta, SiN, BN, SiC and AlN. Most preferably, the second protective film may be made of oxide of Zr or Hf, BN, or SiC. Some of these materials may dissolve a little in hydrofluoric acid. If these materials are used as an insulating layer of the laser device, they act as a buried layer in a more reliable manner than SiO$_2$. When the oxide thin films are formed in gas phase like PVD and CVD, it is difficult to obtain oxides in which the element and oxygen are reacted in equivalent amounts. In such a case, the insulting properties of the oxide thin film tend to be insufficient in reliability. The oxides of said element selected in the above-mentioned manner by means of PVD or CVD, BN, SiC, AlN tend to have a better reliability to the insulating property than that of Si oxides. Further, it is extremely advantageous that an oxide having a refractive index smaller than that of the nitride semiconductor (for example, one other than SiC) is selected and used as a buried layer of the laser device. Further, when the first protective film 61 is made of Si oxide, the Si oxide is selectively dissolved in hydrofluoric acid. Therefore, when, as shown in FIG. 19E, the second protective film is formed continuously on the side surface of the stripe waveguide, on the flat surface where the stripe is formed (etch stopping layer), and on the surface of the first protective film 161, the second film having an even thickness with respect to the flat surface can be formed by removing only the first protective film 161 by means of lift-off method.

After the formation of the protective film 162, the wafer was treated at 600° C. Thus, in the case that the second protective film is made of a material other than SO$_2$, the heat treatment may be conducted at the temperature of not less than 300° C., preferably not less than 400° C. and not more than the decomposition temperature of the nitride semiconductor (1200° C.), with the result that the second protective film becomes difficult to dissolve in the material (hydrofluoric acid) for dissolving the first protective film. Therefore, the heat treatment step is further desirably added.

Figure 19F:
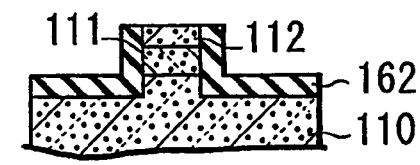

Next, the wafer was soaked in hydrofluoric acid and as shown in FIG. 19F, the first protective film 161 was removed using a lift-off method.

Figure 19G:
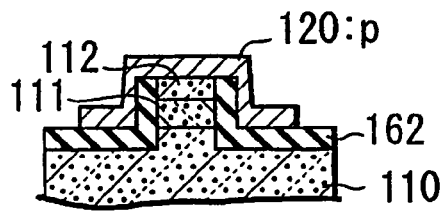

Next, as shown in FIG. 19G, a p-electrode 120 made of Ni/Au was formed on the surface of the p-side contact layer which had been exposed by removing the first protective film 161 on said p-side contact layer 112. The p-electrode 120 had a stripe width of 100 µm and was formed in a manner to extend over the second protective film 162, as shown in this drawing. After the second protective film was formed, an n-electrode 121 made of Ti/Al was formed parallel to the stripe on the exposed surface of the n-side contact layer 5.

Next, a mask was placed in the desired region on the surface which had been exposed by etching to form an n-electrode to provide an output electrode for the p- and n-electrodes and a dielectric multi-layered film 164 made of SiO$_2$ and TiO$_2$ was formed. Thereafter, output (pad) electrode 122 and 123 made of Ni—Ti—Au (1000 angstroms-1000 angstroms-8000 angstroms) were formed, respectively, on the p- and n-electrode.

The sapphire substrate of the resulting wafer on which an n-electrode and a p-electrode had been formed in the above-mentioned manner was polished to the thickness of about 70 µm. Thereafter, the wafer was cleaved into bars perpendicularly with respect to the stripe electrode from the substrate to fabricate a resonator on the cleaved facet (11-00 face, which corresponds to the side face of the crystal in a hexagonal system=M face). A dielectric multi-layered film made of SiO$_2$ and TiO$_2$ was formed on the facet of the resonator and finally, the bar was cut parallel to the p-electrode, resulting in a laser device as shown in FIG. 17. The length of the resonator was 800 µm.

The resulting laser device was set on the heat sink and each electrode was connected by wire-bonding. The laser oscillation was tried at room temperature. The continuous oscillation in the single transverse mode at a wavelength of 400 nm to 420 nm was observed at the threshold current density of 2.9 kA/cm$^2$ at room temperature. Next, F.F.P. of the laser emission was measured. The horizontal transverse mode of 15 to 25° was obtained in the horizontal direction. The horizontal transverse mode was as good as in Comparative Example 5. The aspect ratio was about 1.5. Moreover, the light confinement was enhanced due to the optical waveguide layer having a large thickness and the occurrence of ripples could be prevented drastically as compared with in Comparative Example 5.

EXAMPLE 8

The laser device was fabricated in the same manner as in Example 7, except that the thickness of the n-side optical waveguide layer and the p-side optical waveguide layer was 2500 angstroms.

The horizontal transverse mode of the resulting device could be controlled to the same extent as in Example 7. F.F.P. was 18° in the horizontal direction. The occurrence of ripples could be prevented to-the same extent as in Example 7. But the emission properties were a little worse than those in Example 7. And the device lifetime was also shortened. It is supposed that this is because the total thickness of the waveguide comprising both optical waveguide layers on the either side of an active layer exceeds 4500 angstroms by far and approaches 6000 angstroms. However, since both optical waveguide layers, particularly the p-side optical waveguide layer is thickened, the etching is easier to be controlled and the yield of manufacturing can be enhanced. And also, unevenness in the output properties of the laser devices can be decreased and good laser devices can be manufactured. The output properties of the resulting laser device became worse, but the emission which was a little worse than that in Example 1 was possible at the driving time. Further, when the thickness of both optical waveguide layer is increased to 3000, 3500 and 4000 angstroms, the oscillation threshold current tends to increase. Particularly, when the thickness exceeds 3500 angstroms, such an ascending tendency is remarkable and the device lifetime tends to decrease. Therefore, the thickness of the p-side optical waveguide layer is preferably not more than 3500 angstroms, more preferably not more than 2500 angstroms, with the result that a good laser emission can be realized and the oscillation properties can be sufficient.

And the laser device was fabricated in the same manner as in Example 7, except that the thickness of both optical waveguide layers was 1500 angstroms. An expanse of beam in x direction in F.F.P. was about 13°, which was a little narrower than that in Example 7, and the aspect ratio was 1.8, which was a little worse than that in Example 7. However, the threshold current was almost same value and the output properties were preferable. And the lifetime was long. And the laser device was fabricated in the same manner as in Example 7, except that the etching depth at the time when the projected portion was formed by etching was such that the thickness of the p-side optical waveguide layer was 500 angstroms. The threshold current of the resulting device decreased as compared in Example 7. The output properties of the device were good. An expanse of beam of the laser was 14° and the value was almost the same. The effective refractive index difference could function in a good manner.

EXAMPLE 9

The laser device was fabricated in the same manner as in Example 7, except that the etching was conducted in a such a manner that the height of the projected portion of the p-side optical waveguide layer was 500 angstroms, that is, the thickness of the p-side optical waveguide layer to be etched (the region except the projected portion) was 1500 angstroms. For the resulting laser device, the threshold current increased and the output properties were worse as compared with in Example 7. But the increase of the threshold current was a little and the laser device could be used in practice. On the contrary, since the region except the projected portion had a large thickness, the yield of the manufacturing increased and the unevenness in the output properties among devices decreased.

EXAMPLE 10

The laser device was fabricated in the same manner as in Example 7, except that the stripe width of the p-side optical waveguide layer was 3 µm. For the resulting laser device, the control of the horizontal transverse mode was worse than in Example 1. The aspect ratio in F.F.P. was about 2 and worse than that in Example 7. The stability of oscillation in the single transverse mode was worse and the ratio of defective devices in which kinks occurred was increased as compared with in Example 7. Thus, the stripe width is more preferably in the range of 2 µm±0.5 µm (between 1.5 µm and 2.5 µm), with the result that the unevenness in the control of the transverse mode among devices can be decreased, the aspect ratio of the laser emission is good and the oscillation in a single mode can be realized.

EXAMPLE 11

The laser device having a longer wavelength than that in Example 11, in the concrete, not less than 470 nm will be described in the following part, as an embodiment of the present invention. On an auxiliary substrate 1 made of C-face sapphire, a buffer layer 2 made of GaN was grown the thickness of 200 angstroms and an underlying layer 103 made of undoped GaN was grown to the thickness of 4 µm in the same manner as in Example 7. And then an n-side contact layer 104 made of GaN doped with Si to $3 \times 10^{18}/cm^3$ was grown to the thickness of 4.5 µm and the middle layer made of Si doped $In_{0.3}Ga_{0.7}N$ was grown instead of the crack preventing layer 105. This middle layer may be omitted.

(N-Side Cladding Layer 106)

Subsequently, at 1050° C., a layer made of undoped $Al_{0.15}Ga_{0.85}N$ was grown to the thickness of 25 angstroms using TMA (trimethylaluminium), TMG and ammonia. Subsequently, TMA was stopped and the silane gas was flown. A layer made of n-type GaN doped with Si to $1 \times 10^{19}/cm^3$ was grown to the thickness of 25 angstroms. These layers were laminated alternately to form a super lattice layer, resulting in an n-side cladding layer 106 in a super lattice structure with a total thickness of 0.2 to 1.5 m, preferably 0.7 µm. It is desirable that the n-side cladding layer is in the super lattice structure including the nitride semiconductor containing Al, preferably $Al_XGa_{1-X}N$ (0<X<1), more preferably formed by laminating GaN and AlGaN. In the super lattice structure, either one layer is doped with an impurity in a larger amount, that is, modulation doping is conducted, with the result that the crystallinity tends to increase. But both layers may be doped in the similar amount.

(N-Side Optical Waveguide Layer 107)

Next, the silane gas was stopped and TMI is flown. An undoped $In_{0.1}Ga_{0.9}N$ layer was grown to to the thickness of 10 angstroms at 850° C. to 950° C., preferably at 880° C. Subsequently, TMI was stopped and an undoped GaN layer was grown to the thickness of 10 angstroms. These layers were laminated alternately, resulting in the n-side optical waveguide layer 107 in a super lattice structure having a total thickness of 50 to 2500 angstroms, preferably 500 to 800 angstroms, more preferably 750 angstroms.

(Active Layer 108)

Next, TMI was flown and at 750 to 800° C., preferably 820° C., an well layer made of undoped $In_{0.3}Ga_{0.7}N$ was grown to the thickness of 30 angstroms and the capping layer made of undoped $In_{0.3}Ga_{0.7}N$ was grown to the thickness of 10 angstroms. And then, a barrier layer made of undoped $In_{0.1}Ga_{0.9}N$ was grown to the thickness of 60 angstroms at 850 to 950° C., preferably at 880° C. These three layers were referred to as one set. The active layer 108 was formed by laminating 6 sets of layers.

(P-Side Capping Layer 109)

Next, TMI was stopped and TMA was flown. At 850 to 950° C., preferably at 880° C., a capping layer 109 made of p-type $Al_{0.3}Ga_{0.7}N$ doped with Mg to $1 \times 10^{20}/cm^3$ was grown to the thickness of not less than 10 angstroms and not more than 0.1 µm, preferably 100 angstroms.

(P-Side Optical Waveguide Layer 110)

Next, TMA was stopped and TMI was flown. At 850 to 950° C., preferably at 880° C., an undoped $In_{0.1}Ga_{0.9}N$ layer was grown to the thickness of 10 angstroms. Subsequently, TMI was stopped and a layer made of GaN doped with Mg to $1 \times 10^{18}/cm^3$ to $3 \times 10^{18}/cm^3$ was grown to the thickness of 10 angstroms. These layers were laminated alternately to form an super lattice layer, resulting in a p-side optical waveguide layer 110 in a super lattice structure having a total thickness of 50 to 2500 angstroms, preferably 500 to 800 angstroms, more preferably 750 angstroms.

(P-Side Cladding Layer 111)

Subsequently, TMA was flown and at 850 to 1050° C., a layer made of undoped $Al_{0.16}Ga_{0.84}N$ was grown to the thickness of 25 angstroms. Subsequently, TMA was stopped and a layer made of GaN doped with Mg to $3 \times 10^{18}/cm^3$ to $5 \times 10^{18}/cm^3$ was grown to the thickness of 25 angstroms. Thus, these layers were laminated alternately to form a p-side cladding layer 111 in a super lattice structure having a total thickness of 0.6 to 1.5 µm, preferably 0.7 µm.

(P-Side Contact Layer 112)

Finally, at 850 to 1050° C., on the p-side cladding layer 111, a p-side contact layer 112 made of p-type GaN doped with Mg to $1\times10^{20}$/cm$^3$ was grown to the thickness of 150 angstroms. The p-side contact layer may be made of p-type In$_X$Al$_Y$Ga$_{1-X-Y}$N ($0 \leq X$, $0 \leq Y$, $X+Y \leq 1$) and preferably, the p-side contact layer may be made of GaN doped with Mg or InGaN, thereby most preferable ohmic contact with the p-electrode 20 can be obtained. Since the contact layer 112 is a layer where an electrode is formed, it is desirable that the carrier concentration is as high as not less than $1\times10^{18}$/cm$^3$. If the carrier concentration is less than $1\times10^{18}$/cm$^3$, it is difficult to obtain a good ohmic contact with the electrode. If the composition of the contact layer is GaN or InGaN, or the contact layer is a super lattice layer containing GaN or InGanN, it is easy to obtain a good ohmic contact with the electrode material.

After each above-mentioned layer was laminated, the etching was conducted in the same manner as in Example 7 to expose the surface of the n-side contact layer 104. Further, the stripe ridge waveguide was formed. And an n-electrode 121, p-electrode 120, dielectric multi-layered film 164, output electrodes 122 and 123 were formed to fabricate the laser device. For the resulting laser device, the continuous oscillation at a wavelength of 470 nm was observed at the threshold current density of 2.0 kA/cm$^2$ and the threshold voltage of 4.0 V. The lifetime was not less than 1000 hours. An expansion in the horizontal direction (x direction) of the beam was as large as about 17° and the aspect ratio was as good as about 1.5. Even the laser device having a long wavelength could emit a good laser light and have an low oscillation threshold current and a long lifetime.

EXAMPLE 12

Each layer of the laser device structure was laminated in the same manner as in Example 11, except that the thickness of the p-side optical waveguide layer was 1000 angstroms. Subsequently, the ridge waveguide was formed by etching in the same manner as in Example 7 to obtain a laser device. The etching depth was such that the etched region of the p-type optical waveguide layer (region except the projected portion) had a thickness of 500 angstrom. The ridge stripe was formed by providing a projected portion on the p-side optical waveguide layer.

For the resulting laser device, the continuous oscillation at a wavelength of 470 nm was observed at the threshold current density of 2.0 kA/cm$^2$ and the threshold voltage of 4.0 V. The lifetime was not less than 1000 hours. An expansion in the horizontal direction (x direction) of the beam was as large as about 17° and the aspect ratio was as good as about 1.5. Even the laser device having a long wavelength could emit a good laser light and have an low oscillation threshold current and a long lifetime.

COMPARATIVE EXAMPLE 5

The laser device was fabricated in the same manner as in Example 7; except that the thickness of the p-side optical waveguide layer and the n-side optical waveguide layer was 1000 angstroms. The resulting laser device had an oscillation-threshold current similar to that in Example 7. But an expanse in the x direction in F.F.P. was as narrow as about 8° and the aspect ratio was about 3.

COMPARATIVE EXAMPLE 6

The laser device was fabricated in the same manner as in Example 7, except that after each layer was laminated, the stripe ridge waveguide was formed by etching-down to the point where the thickness of the p-side cladding layer was 0.1 µm and providing the stripe projected portion on the p-side cladding layer. The resulting laser device showed worse output properties and a much shorter lifetime as compared with in Example 7.

Figure 12:
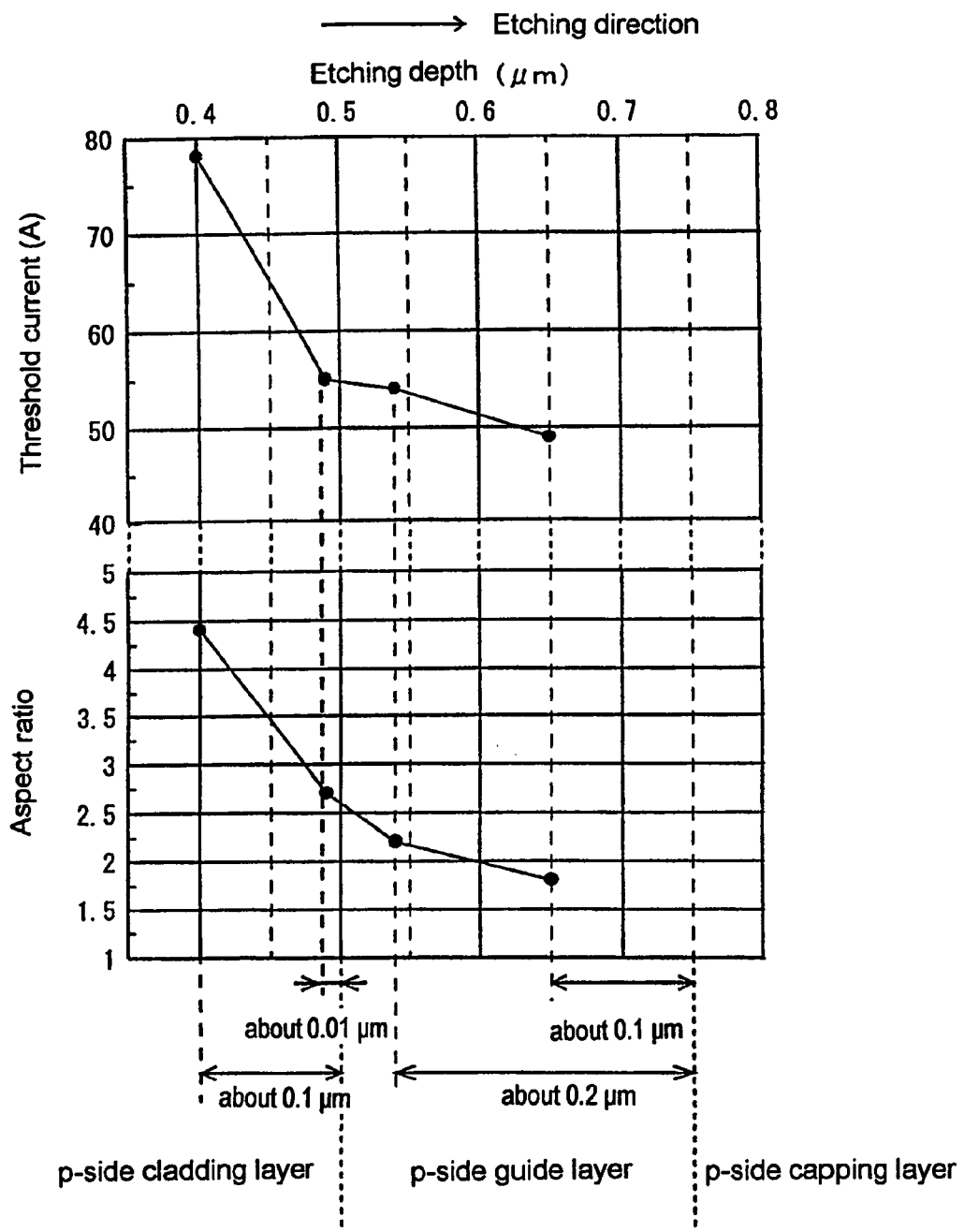
FIG. 12 is a diagram showing the relation between depth of etching and device characteristic of a laser device according to the present invention.

FIG. 12 shows the change in device properties with respect to the etching depth or the height of the stripe projected portion of the p-side optical waveguide layer, based on the laser device of Example 13. In this case, the p-side optical waveguide layer has a larger thickness between both optical waveguide layers on the either side of the active layer.

FIG. 12 shows the change in the threshold current and in the aspect ratio with the respect to the etching depth, on the basis of the structure in which a p-side capping layer, p-side waveguide layer and p-side optical waveguide layer are laminated. As shown in FIG. 12, when the ridge structure is formed by etching down to the point in the p-side optical waveguide layer, that is, when there is provided a stripe projected portion in the p-side optical waveguide layer, the oscillation can be realized at a good threshold current and the aspect ratio of the laser beam tends to approach 1. This is because, as shown in FIG. 20, the emitted light moves to the side of the stripe projected portion of the p-side optical waveguide layer and thereby, a good effective refractive index can be realized. Therefore, the confinement in the horizontal transverse mode can function effectively. As a result, the laser device in which the beam shape in the x direction in F.F.P. is not less than 10°, preferably 12 to 20° and the aspect ratio is good can be obtained. As the thickness of the region except the projected portion of the p-side optical waveguide layer decreases, that is, as the height of the projected portion increases, the threshold current and the aspect ratio tend to decrease. Therefore, the height of the projected portion is preferably controlled to be within the above-mentioned range.

EXAMPLE 13

Figure 18:
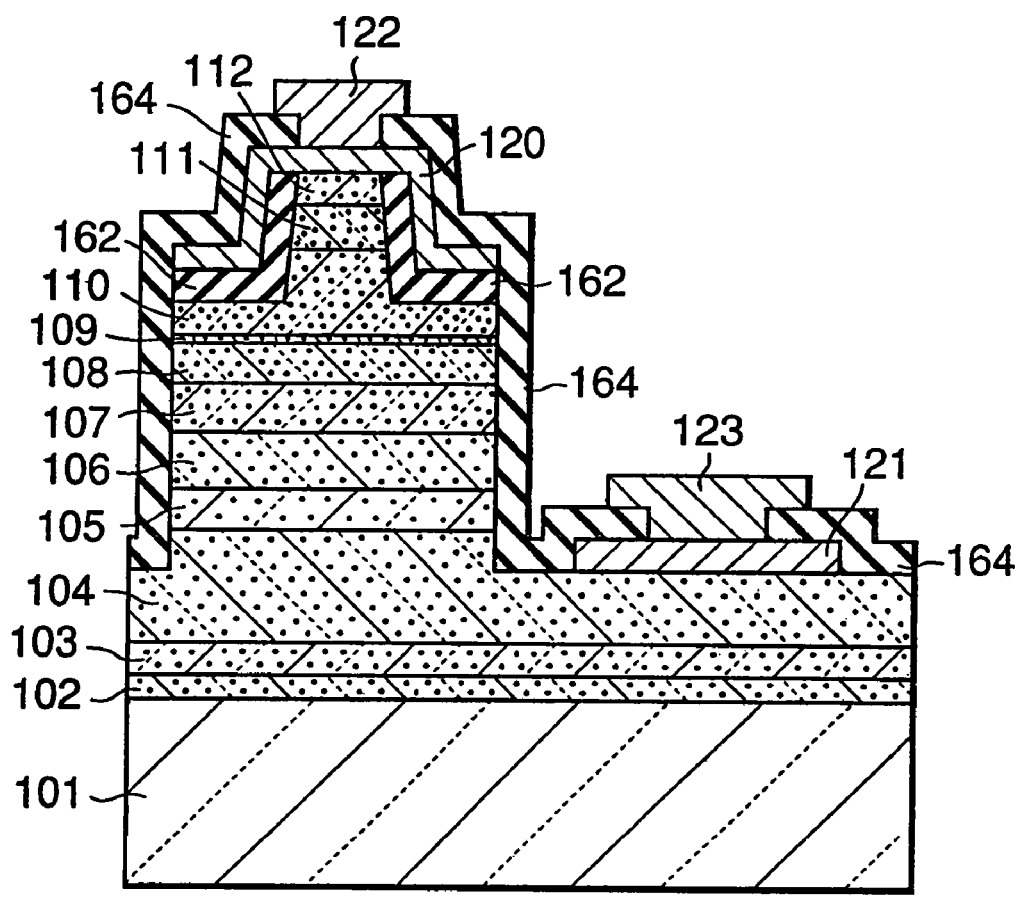
FIG. 18 is a schematic sectional view showing the structure of a laser device according to the third embodiment of the present invention.

FIG. 18 is a sectional view showing the structure of the laser device according to an example of the present invention. In this drawing, the layered structure which is cut in the perpendicular direction to the projected stripe region is shown. Example 13 will be described with reference to FIG. 18.

A sapphire substrate having its principal surface represented by a (0001)C-face was used as a substrate. The orientation flat face was represented by an A-face. The substrate on which the nitride semiconductor is to be grown may be an auxiliary substrate made of the material other than nitride semiconductor, such as SiC, ZnO, spinel (MgAl$_2$O$_4$), GaAs and the like, as well as sapphire (its principal surface represented by C-face, R-face and A-face), which are known to be used for growing the nitride semiconductor. The nitride semiconductor may grown directly on the substrate made of nitride semiconductor.

(Buffer Layer 102)

An auxiliary substrate 1 made of C-face sapphire of one-inch ϕ was set in the MOVPE reactor and the temperature was adjusted to 500° C. A buffer layer made of GaN which had a thickness of about 200 angstroms was grown using trimethylgallium (TMG) and ammonia (NH$_3$).

(Underlying Layer 103)

After growing the buffer layer, at 1050° C., using TMG and ammonia, an underlying layer 103 made of undoped GaN was grown to the thickness of 4 µm. This layer acts as a substrate for growth of each layer that constitutes a device structure.

Thus, in the case that the device structure made of nitride semiconductor is formed on the auxiliary substrate, the underlying layer is preferably formed which acts a low-temperature grown buffer layer and a substrate for nitride semiconductor.

(N-Side Contact Layer 104)

Next, using ammonia and TMG, and silane gas as an impurity gas, an n-side contact layer 104 made of GaN doped with Si to $3 \times 10^{18}/cm^3$ was grown to the thickness of 4 μm on the nitride semiconductor substrate 101 at 1050° C.

(Crack Preventing-Layer 105)

Next, using TMG, TMI (trimethylindium) and ammonia, at 800° C., a crack preventing layer 105 made of $In_{0.06}Ga_{0.94}N$ was grown to the thickness of 0.15 μm. This crack preventing layer may be omitted.

(N-Side Cladding Layer 106)

Subsequently, at 1050° C., a layer made of undoped $Al_{0.16}Ga_{0.84}N$ was grown to the thickness of 25 angstroms using TMA (trimethylaluminium), TMG and ammonia. Subsequently, TMA was stopped and the silane gas was flown. A layer made of n-type GaN doped with Si to $1 \times 10^{19}/cm^3$ was grown to the thickness of 25 angstroms. These layers were laminated alternately to form a super lattice layer, resulting in an n-side cladding layer 106 in a super lattice structure with a total thickness of 1.2 μm.

(N-Side Optical Waveguide Layer 107)

Next, the silane gas was stopped and an n-side optical waveguide layer 107 made of undoped GaN was grown to the thickness of 1000 angstroms at 1050° C. The n-side optical waveguide layer 107 may be doped with an n-type impurity.

(Active Layer 108)

Next, at 800° C., a barrier layer made of $In_{0.05}Ga_{0.95}N$ doped with Si was grown to the thickness of 100 angstroms. Subsequently, at the same temperature, a well layer made of undoped $In_{0.2}Ga_{0.8}N$ was grown to the thickness of 40 angstroms. Two barrier layers and two well layers were laminated alternately and at the last, a barrier layer was laminated, with the result that the active layer in the multiple quantum well structure (MQW) having a total thickness of 380 angstroms was obtained. The active layer may be undoped like in this example and may be doped with an n-type impurity and/or a p-type impurity. Both of the well layer and the barrier layer may be doped with an impurity, or either one may be doped. And when only barrier layer is doped with an n-type impurity, the threshold tends to decrease.

(P-Side Capping Layer 109)

Next, the temperature was raised to 1050° C. A p-side capping layer 109 made of $Al_{0.3}Ga_{0.7}N$ doped with Mg to $1 \times 10^{20}/cm^3$ and having a band gap energy larger than that of the p-side optical waveguide layer 111 was grown to the thickness of 300 angstroms, using TMGL TMA, ammonia and Cp2Mg (cyclopentadienyl magnesium).

(P-Side Optical Waveguide Layer 110)

Subsequently, Cp2Mg and TMA were stopped and at 1050° C., a p-side optical waveguide layer 110 made of undoped GaN and having a band gap energy lower than that of the p-side capping layer 10 was grown to the thickness of 2500 angstroms.

(P-Side Cladding Layer 111)

Subsequently, at 1050° C., a layer made of undoped $Al_{0.16}Ga_{0.84}N$ was grown to the thickness of 25 angstroms. Subsequently, Cp2Mg and TMA were stopped and a layer made of undoped GaN was grown to the thickness of 25 angstroms. Thus, a p-side cladding layer 111 in a super lattice structure was grown to a total thickness of 0.6 μm. If the p-side cladding layer is a super lattice layer formed by laminating nitride semiconductor layers at least one of which contains Al and which have different band gap energies from each other, either one layer may be doped with an impurity in a larger amount, what is called modulation doping, with the result that the crystallinity tends to increase. But both layers may be doped in the same amount. The cladding layer 111 is preferably in the super lattice structure including a nitride semiconductor layer containing Al, preferably $Al_xGa_{1-x}N$ (0<X<1). More preferably, the cladding layer 111 is in the super lattice structure formed by laminating GaN and AlGAN. For the p-side cladding layer 11 in the super lattice structure, the mixing proportion of Al in the entire cladding layer can be increased and then, the refractive index of the cladding layer itself decreases. Moreover, the band gap energy becomes large, resulting in the decrease of the threshold. Further, the pits occurring in the cladding layer in the super lattice structure decreases, as compared with not in the super lattice structure, resulting in the decrease of the provability of the short circuit.

(P-Side Contact Layer 112)

Finally, at 1050° C., on the p-side cladding layer 111, a p-side contact layer 112 made of p-type GaN doped with Mg to $1 \times 10^{20}/cm^3$ was grown to the thickness of 150 angstroms. The p-side contact layer may be made of p-type $In_XAl_YGa_{1-X-Y}N$ ($0 \leq X$, $0 \leq Y$, $X+Y \leq 1$) and preferably, the p-side contact layer may be made of GaN doped with Mg, thereby most preferable ohmic contact with the p-electrode 20 can be obtained. Since the contact layer 112 is a layer where an electrode is formed, it is desirable that the carrier concentration is as high as not less than $1 \times 10^{17}/cm^3$. If the carrier concentration is less than $1 \times 10^{17}/cm^3$, it is difficult to obtain a good ohmic contact with the electrode. If the composition of the contact layer is GaN, it is easy to obtain a good ohmic contact with the electrode material.

The resulting wafer on which the nitride semiconductor had been grown was removed out of the reactor. A protective film of $SiO_2$ was formed on the top surface of the p-side contact layer which was an uppermost layer and etching was conducted with $SiCl_4$ gas using RIE (reactive ion etching), to expose the surface of the n-side contact layer 4 on which an n-electrode was to be formed, as shown in FIG. 18. Thus, $SiO_2$ is most preferable as a protective film so as to etch the nitride semiconductor deeply.

A method for forming a ridge waveguide in the stripe geometry will be described in details in the following part. First, as shown in FIG. 19A, a first protective film 161 made of Si oxide (mainly, $SiO_2$) was formed to the thickness of 0.5 μm on the almost entire surface of the uppermost p-side contact layer 112 with PVD apparatus. Thereafter, a mask of a predetermined shape was placed on the first protective film 161 and a third protective film 163 made of photo resist having a stripe width of 2 μm and a thickness of 1 μm was formed. The insulting properties of the first protective film are of no importance. The first protective film 161 may be made of any material that has a different etching rate from that of the nitride semiconductor. For example, the first protective film may be made of Si oxide (including $SiO_2$), photo resist and the like. Preferably, the material that has an acid solubility larger than that of the second protective film to be formed later may be selected, so as to provide the solubility difference between the first and second protective films. The acid may be preferably hydrofluoric acid and therefore, Si oxide may preferably be used as a material that is easy to dissolve in hydrofluoric acid.

Next, as shown in FIG. 19B, after the third protective film 163 was formed, said first protective film was etched by $CF_4$ gas with a RIE (reactive ion etching) apparatus using the third protective film 163 as a mask to have a stripe structure. Thereafter, only the photo resist was removed by the treatment with an etchant to form a first protective film 161 having a stripe width of 2 μm on the p-side contact layer 112, as shown in FIG. 19C.

Further, as shown in FIG. 19D, after the first protective film 161 of a stripe geometry was formed, the p-side contact layer 112, the p-side cladding layer 111 and the p-side optical waveguide layer 110 were again etched using $SiCl_4$ gas with the RIE to form a ridge stripe as a stripe waveguide region having such a thickness that the thickness of the etched region (the region except the projected portion) of the p-side optical waveguide layer was 1000 angstroms.

After formation of the ridge stripe, the wafer was transferred into the PVD apparatus, and as shown in FIG. 19E, a second protective film 162 made of Zr oxide (mainly $ZrO_2$) was formed to the thickness of 0.5 μm continuously on the first protective film 161 and on the p-side optical waveguide layer 111 which had been exposed by etching (the region except the projected portion).

It is desirable that the second protective film may be made of the material other than $SO_2$, preferably at least one selected from oxide containing at least one element selected from the group consisting of Ti, V, Zr, Nb, Hf and Ta, SiN, BN, SiC and AlN. Most preferably, the second protective film may be made of oxide of Zr or Hf, BN, or SiC. Some of these materials may dissolve a little in hydrofluoric acid. If these materials are used as an insulating layer of the laser device, they act as a buried layer in a more reliable manner than $SiO_2$. When the oxide thin films are formed in gas phase like PVD and CVD, it is difficult to obtain oxides in which the element and oxygen are reacted in equivalent amounts. In such a case, the insulting properties of the oxide thin film tend to be insufficient in reliability. The oxides of said element selected in the above-mentioned manner by means of PVD or CVD, BN, SiC, AlN tend to have a better reliability to the insulating property than that of Si oxides. Further, it is extremely advantageous that an oxide having a refractive index smaller than that of the nitride semiconductor (for example, one other than SiC) is selected and used as a buried layer of the laser device. Further, when the first protective film 61 is made of Si oxide, the Si oxide is selectively dissolved in hydrofluoric acid. Therefore, when, as shown in FIG. 19E, the second protective film is formed continuously on the side surface of the stripe waveguide, on the flat surface where the stripe is formed (etch stopping layer), and on the surface of the first protective film 161, the second film having an even thickness with respect to the flat surface can be formed by removing only the first protective film 161 by means of lift-off method.

After the formation of the protective film 162, the wafer was treated at 600° C. Thus, in the case that the second protective film is made of a material other than $SiO_2$, the heat treatment may be conducted at the temperature of not less than 300° C., preferably not less than 400° C. and not more than the decomposition temperature of the nitride semiconductor (1200° C.), with the result that the second protective film becomes difficult to dissolve in the material (hydrofluoric acid) for dissolving the first protective film. Therefore, the heat treatment step is further desirably added.

Next, the wafer was soaked in hydrofluoric acid and as shown in FIG. 19F, the first protective film 161 was removed using a lift-off method.

Next, as shown in FIG. 19G, a p-electrode 120 made of Ni/Au was formed on the surface of the p-side contact layer which had been exposed by removing the first protective film 161 on said p-side contact layer 112. The p-electrode 120 had a stripe width of 100 μm and was formed in a manner to extend over the second protective film 162, as shown in this drawing. After the second protective film was formed, an n-electrode 121 made of Ti/Al was formed parallel to the stripe on the exposed surface of the n-side contact layer 105.

Next, a mask was placed in the desired region on the surface which had been exposed by etching to form an n-electrode to provide an output electrode for the p- and n-electrodes and a dielectric multi-layered film 164 made of $SiO_2$ and $TiO_2$ was formed. Thereafter, output (pad) electrodes 122 and 123 made of Ni—Ti—Au (1000 angstroms-1000 angstroms-8000 angstroms) were formed, respectively, on the p- and n-electrode.

The sapphire substrate of the resulting wafer on which an n-electrode and a p-electrode had been formed in the above-mentioned manner was polished to the thickness of about 70 μm. Thereafter, the wafer was cleaved into bars perpendicularly with respect to the stripe electrode from the substrate to fabricate a resonator on the cleaved facet (11-00 face, which corresponds to the side face of the crystal in a hexagonal system=M face). A dielectric multi-layered film made of $SiO_2$ and $TiO_2$ was formed on the facet of the resonator and finally, the bar was cut parallel to the p-electrode, resulting in a laser device as shown in FIG. 1. The length of the resonator was 800 μm.

The resulting laser device was set on the heat sink and each electrode was connected by wire-bonding. The laser oscillation was tried at room temperature. The continuous oscillation in the single transverse mode at a wavelength of 400 nm to 420 nm was observed at the threshold current density of 2.9 $kA/cm^2$ at room temperature. Next, F.F.P. of the laser emission was measured. The horizontal transverse mode of 16 to 20° was obtained in the horizontal direction. The horizontal transverse mode was as good as in Comparative Example 5. The aspect ratio was about 2. Moreover, the light confinement was enhanced due to the optical waveguide layer having a large thickness and the occurrence of ripples could be prevented drastically as compared with in Comparative Example 1.

EXAMPLE 14

The laser device was fabricated in the same manner as in Example 13, except that the n-side optical waveguide layer had a thickness of 2000 angstroms. For the resulting laser device, the control in the transverse mode was a little worse than that in Example 13. F.F.P. was 14° in the x direction. And the aspect ratio was 2. However, the device characteristics were enhanced extremely as compared in Comparative Example 7. Since the aspect ratio was not more than 2.5, it was easier to apply the resulting laser device to the optical information equipment. The light confinement was as good as in Example 13. The occurrence of ripples could be prevented drastically. As concerns the output characteristics, since the waveguide region between the p-side optical waveguide layer and an n-side optical waveguide layer had a thickness of not less than 5000 angstroms, the threshold current increased as compared with in Example 13. The device was worse than that in Example 13.

EXAMPLE 15

The laser device was fabricated in the same manner as in Example 13, except that the thickness of the p-side optical waveguide layer was 3000 angstroms and the thickness of the region except the projected portion was 1000 angstroms, that is, the etching was conducted in such a manner that the p-side optical waveguide layer had a thickness of 1000 angstroms. For the resulting laser device, as good a laser emission as in Example 13 was obtained. The expansion of the bean in the x direction of F.F.P. was 18°. The aspect ratio was 1.4 and was enough to put to the practical use. Further, when the thickness of the p-side optical waveguide layer was 3500 angstroms and the height of the projected portion of the p-side optical waveguide layer was 2500 angstroms (the thickness of the region except the projected portion was 1000 angstroms), the threshold current increased and the device lifetime tended to decrease. However, the beam shape of the emitted light was as good as that in Example 13. It is supposed that this is because the sum of the thickness of both optical waveguide layers between which the active layer was sandwiched exceeded 5000 angstroms.

EXAMPLE 16

The laser device was fabricated in the same manner as in Example 13, except that the stripe width of the projected portion of the p-side optical waveguide layer, that is, the width of the ridge waveguide in the stripe structure was 3 µm. For the resulting laser device, the control in the horizontal transverse mode was worse than that in Example 13. The aspect ration of F.F.P. was 2 and was worse than that in Example 13. The stability of the emission in the single transverse mode was worse than that in Example 13 and the ratio of the defective devices in which kinks occurred tended to increase. Therefore, the stripe width is more preferably within the range of 2 µm±0.5 µm (between 1.5 µm and 2.5µm), with the result that devices are of a little uneven controllability in the transverse mode, the aspect ratio of the laser emission is good and the laser device can emit in the single mode.

EXAMPLE 17

As an embodiment of the present invention, the laser device having a wavelength longer than that in Example 13, concretely of not less than 480 nm will be described in the following part. A buffer layer 2 having a thickness of 200 angstroms, an underlying layer 103 made of undoped GaN which had a thickness of 4 µm, an n-side contact layer 104 made of GaN doped with Si to $1 \times 10^{18}/cm^3$ which had a thickness of 4.5 µm and a middle layer 105 made of Si doped $In_{0.3}Ga_{0.7}N$ were grown on the auxiliary substrate 101 made of c-face sapphire. The middle layer may be omitted.

(n-side Cladding Layer 106)

Next, at 1050° C., a layer made of undoped $Al_{0.15}Ga_{0.85}N$ was grown to the thickness of 25 angstroms using TMG, ammonia and TMA (trimethylaluminium). Subsequently, TMA was stopped and the silane gas was flown. A layer made of n-type GaN doped with Si to $1 \times 10^{19}/cm^3$ was grown to the thickness of 25 angstroms. These layers were laminated alternately to form a super lattice layer, resulting in an n-side cladding layer 106 in a super lattice structure with a total thickness of 1.2 µm. The n-side cladding layer may be preferably in the super lattice structure including a layer made of nitride semiconductor containing Al, preferably $Al_xGa_{1-x}N$ (0<X<1). More preferably, the n-side cladding layer may be in the super lattice structure formed by laminating GaN and AlGaN. In the super lattice structure, either one layer may be doped with an impurity in a larger amount, what is called modulation doping, with the result that the crystallinity tends to increase. Both layers may be doped in the similar amount.

(n-side Optical Waveguide Layer 107)

Subsequently, the silane gas was stopped and TMI was flown. An undoped $In_{0.1}Ga_{0.9}N$ layer was grown to the thickness of 10 angstroms at 850° C. to 950° C., preferably at 880° C. Then, TMI was stopped and an undoped GaN layer was grown to the thickness of 10 angstroms. These layers were laminated alternately to form a super lattice layer. Thus, an n-side optical waveguide layer 107 in the super lattice structure having a total thickness of 50 to 2500 angstroms, preferably 500 to 800 angstroms, more preferably 750 angstroms.

(Active Layer 108)

Subsequently, TMI was flown and a well layer made of undoped $In_{0.4}Ga_{0.6}N$ was grown to the thickness of 30 angstroms at 750 to 850° C., preferably at 820° C. Then, a capping layer made of undoped $In_{0.3}Ga_{0.7}N$ was grown to the thickness of 10 angstroms. Thereafter, a barrier layer made of undoped $In_{0.1}Ga_{0.9}N$ was grown to the thickness of 60 angstroms at 850° C. to 950° C., preferably at 880° C. These three layers were referred to as one set. The active layer 108 was formed by laminating 6 sets of layers.

(p-side Capping Layer 109)

Next, TMI was stopped and TMA was flown. At 850 to 950° C., preferably at 880° C., a capping layer 109 made of p-type $Al_{0.3}Ga_{0.7}N$ doped with Mg to $1 \times 10^{20}/cm^3$ was grown to the thickness of not less than 10 angstroms and not more than 0.1 µm, preferably 100 angstroms.

(p-side Optical Waveguide Layer 110)

Next, TMA was stopped and TMI was flown. At 850 to 950° C., preferably at 880° C., an undoped $In_{0.1}Ga_{0.9}N$ layer was grown to the thickness of 10 angstroms. Subsequently, TMI was stopped and a layer made of GaN doped with Mg to $1 \times 10^{18}/cm^3$ to $3 \times 10^{18}/cm^3$ was grown to the thickness of 10 angstroms. These layers were laminated alternately to form an super lattice layer, resulting in a p-side optical waveguide layer 110 in a super lattice structure having a total thickness of 50 to 2500 angstroms, preferably 500 to 800 angstroms, more preferably 750 angstroms.

(p-side Cladding Layer 111)

Subsequently, TMA was flown and at 850 to 1050° C., a layer made of undoped $Al_{0.15}Ga_{0.85}N$ was grown to the thickness of 25 angstroms. Subsequently, TMA was stopped and a layer made of GaN doped with Mg to $3 \times 10^{18}/cm^3$ to $5 \times 10^{18}/cm^3$ was grown to the thickness of 25 angstroms. Thus, these layers were laminated alternately to form a p-side cladding layer 111 in a super lattice structure having a total thickness of 0.2 to 1.5 µm, preferably 0.7 µm.

(p-side Contact Layer 112)

Finally, at 850 to 1050° C., on the p-side cladding layer 111, a p-side contact layer 112 made of p-type GaN doped with Mg to $1 \times 10^{20}/cm^3$ was grown to the thickness of 150 angstroms. The p-side contact layer may be made of p-type $In_xAl_yGa_{1-X-Y}N$ (0≦X, 0≦Y, X+Y≦1) and preferably, the p-side contact layer may be made of GaN doped with Mg or InGaN, thereby most preferable ohmic contact with the p-electrode 20 can be obtained. Since the contact layer 112 is a layer where an electrode is formed, it is desirable that the carrier concentration is as high as not less than $1 \times 10^{18}/cm^3$. If the carrier concentration is, less than $1 \times 10^{18}/cm^3$, it is difficult to obtain a good ohmic contact with the electrode. If the composition of the contact layer is GaN or InGaN, or the contact layer is a super lattice layer containing GaN or InGanN, it is easy to obtain a good ohmic contact with the electrode material.

After each above-mentioned layer was laminated, the etching was conducted in the same manner as in Example 13 to expose the surface of the n-side contact layer 4. Further, the stripe ridge waveguide was formed. And an n-electrode 121, p-electrode 120, dielectric layered film 164, output electrodes 122 and 123 were formed to fabricate the laser device. For the resulting laser device, the continuous oscillation at a wavelength of 480 nm was observed at the threshold current density of 2.0 kA/cm$^2$ and the threshold voltage of 4.0 V. The lifetime was not less than 1000 hours. An expansion in the horizontal direction (x direction) of the beam was as large as about 17° and the aspect ratio was as good as about 1.5. Even the laser device having a long wavelength could emit a good laser light and have an low oscillation threshold current and a long lifetime.

EXAMPLE 18

Each layer of the laser device structure was laminated in the same manner as in Example 17, except that the thickness of the p-side optical waveguide layer was 2000 angstroms. Subsequently, the ridge waveguide was formed by etching in the same manner as in Example 13 to obtain a laser device. The etching depth was such that the etched region of the p-type optical waveguide layer (region except the projected portion) had a thickness of 1500 angstrom. The ridge stripe was formed by providing a projected portion on the p-side optical waveguide layer.

For the resulting laser device, the continuous oscillation at a wavelength of 470 nm was observed at the threshold current density of 2.0 kA/cm$^2$ and the threshold voltage of 4.0 V. The lifetime was not less than 1000 hours. An expansion in the horizontal direction (x direction) of the beam was as large as about 17° and the aspect ratio was as good as about 1.5. Even the laser device having a long wavelength could emit a good laser light and have an low oscillation threshold current and a long lifetime.

COMPARATIVE EXAMPLE 7

The laser device was fabricated in the same manner as in Example 13, except that the thickness of the p-side optical waveguide layer and the n-side optical waveguide layer was 1000 angstroms. The resulting laser device had an oscillation threshold current similar to that in Example 7. But an expanse in the x direction in F.F.P. was as narrow as about 8° and the aspect ratio was about 3.2.

The modified examples will be described in the following part with reference to FIG. 13 to FIG. 16. Parts similar to those previously described are denoted by the same reference numerals.

MODIFIED EXAMPLE 1

(n-side Cladding Layer—Active Layer—p-side Second Cladding Layer)

Figure 13:
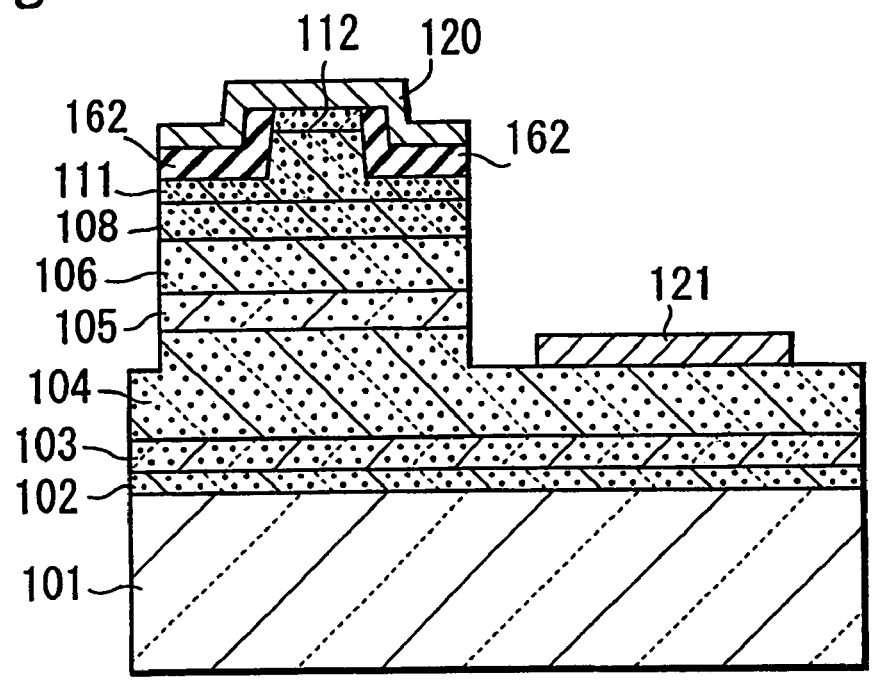
FIG. 13 is a schematic sectional view of a laser device according to first modified embodiment of the present invention.

The layers of an n-side contact layer to a p-side contact layer which are listed in Table 1 were laminated sequentially on the substrate. The stripe waveguide was formed by etching. Further, the n-side contact layer was exposed and the p- and n-electrodes were formed on the contact layer, so as to fabricate a laser device as shown in FIG. 13. In this case, the etching depth for the formation of the stripe waveguide was below the point where the thickness of the p-side second cladding layer was less than 0.1 μm (in the direction getting closer to the active layer) and above the active layer (the depth not reaching the active layer).

For the resulting laser device, the driving current tended to increase drastically as compared with a laser device comprising an optical waveguide layer and a p-side first cladding layer. In some devices, the driving current was near 100 mA.

TABLE 1

|  | composition and thickness |
|---|---|
| n-side contact layer 104 | Si (1 × 10$^{18}$/cm$^3$) doped GaN thickness: 4.5 μm |
| crack preventing layer 105 | Si doped In$_{0.06}$Ga$_{0.94}$N thickness: 0.15 μm |
| n-side cladding layer 106 | an undoped Al$_{0.16}$Ga$_{0.84}$N layer having a thickness of 25 angstroms and a Si (1 × 10$^{19}$/cm$^3$) doped GaN layer having a thickness of 25 angstroms are laminated alternately total thickness: 1.2 μm |
| active layer 108 | a barrier layer (B) made of Si-doped GaN and a well layer made (W) of undoped In$_{0.2}$Ga$_{0.8}$N having a thickness of 40 angstroms are laminated in the order of (B)-(W)-(B)-(W)-(B)-(W)-(B). The uppermost barrier layer and the lowermost barrier layer have a thickness of 300 angstroms and the other barrier layers have a thickness of 150 angstroms. total thickness: 1020 angstroms |
| p-side second cladding layer 111 | a Al$_{0.16}$Ga$_{0.84}$N layer having a thickness of 25 angstroms and a Mg (1 × 10$^{19}$/cm$^3$) doped GaN layer having a thickness of 25 angstroms are laminated alternately total thickness: 0.6 μm |
| p-side contact layer 112 | Mg (1 × 10$^{19}$/cm$^3$) doped GaN |

MODIFIED EXAMPLE 2

(n-side Cladding Layer—Active Layer—p-side First Cladding Layer—p-side Second Cladding Layer)

Figure 14:
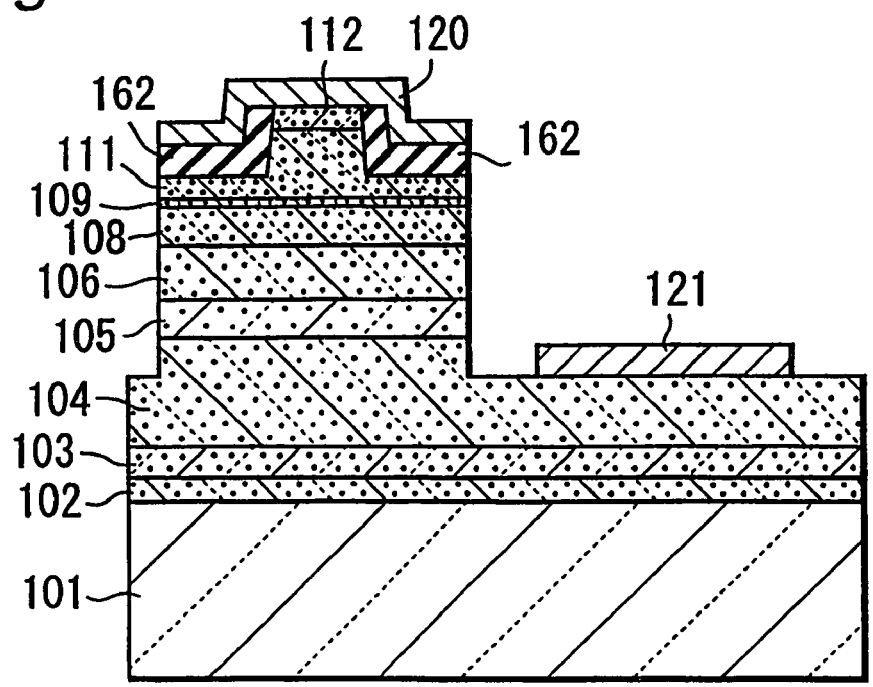
FIG. 14 is a schematic sectional view of a laser device according to the second modified embodiment of the present invention.

The layers of an n-side contact layer to a p-side contact layer which are listed in Table 2 were laminated sequentially on the substrate. The stripe waveguide was formed by etching. Further, the n-side contact layer was exposed and the p- and n-electrodes were formed on the contact layer, so as to fabricate a laser device as shown in FIG. 14. In this case, the etching depth for the formation of the stripe waveguide was below the point where the thickness of the p-side second cladding layer was less than 0.1 μm (in the direction getting closer to the active layer) and above the active layer (the depth not reaching the active layer).

For the resulting laser device, the driving current tended to decrease by 10 to 20 mA as compared with in Modified Example 1.

TABLE 2

|  | composition and thickness |
|---|---|
| n-side contact layer 104 | Si (1 × 10$^{18}$/cm$^3$) doped GaN thickness: 4.5 μm |

TABLE 2-continued

| | composition and thickness |
|---|---|
| crack preventing layer 105 | Si doped $In_{0.06}Ga_{0.94}N$ thickness: 0.15 μm |
| n-side cladding layer 106 | an undoped $Al_{0.16}Ga_{0.84}N$ layer having a thickness of 25 angstroms and a Si ($1 \times 10^{19}/cm^3$) doped GaN layer having a thickness of 25 angstroms are laminated alternately total thickness: 1.2 μm |
| active layer 108 | a barrier layer (B) made of Si-doped GaN and a well layer made (W) of Si ($5 \times 10^{18}/cm^3$) doped $In_{0.2}Ga_{0.8}N$ having a thickness of 40 angstroms are laminated in the order of (B)-(W)-(B)-(W)-(B)-(W)-(B). The uppermost barrier layer and the lowermost barrier layer have a thickness of 300 angstroms and the other layers have a thickness of 150 angstroms. total thickness: 1020 angstroms |
| p-side first cladding layer 109 | Mg ($1 \times 10^{20}/cm^3$) doped $Al_{0.3}Ga_{0.7}N$ thickness: 100 angstroms |
| p-side second cladding layer 111 | a $Al_{0.16}Ga_{0.84}N$ layer having a thickness of 25 angstroms and a Mg ($1 \times 10^{19}/cm^3$) doped GaN layer having a thickness of 25 angstroms are laminated alternately total thickness: 0.6 μm |
| p-side contact layer 112 | Mg ($1 \times 10^{19}/cm^3$) doped GaN |

MODIFIED EXAMPLE 3

(n-side Cladding Layer—n-side Optical Waveguide Layer—Active Layer—p-side Optical Waveguide Layer—p-side Second Cladding Layer)

Figure 15:
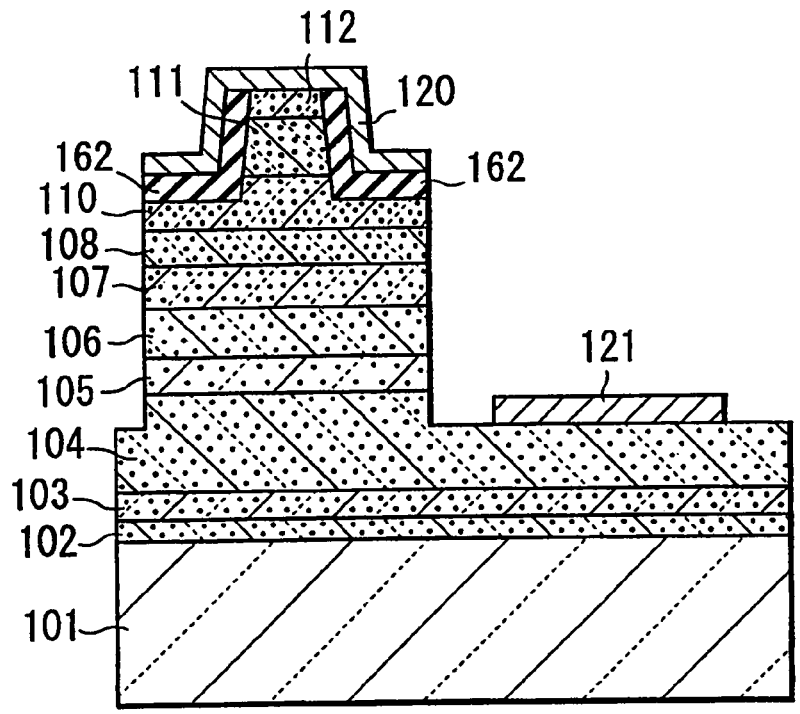
FIG. 15 is a schematic sectional view of a laser device according to the third modified embodiment of the present invention.
Figure 16:
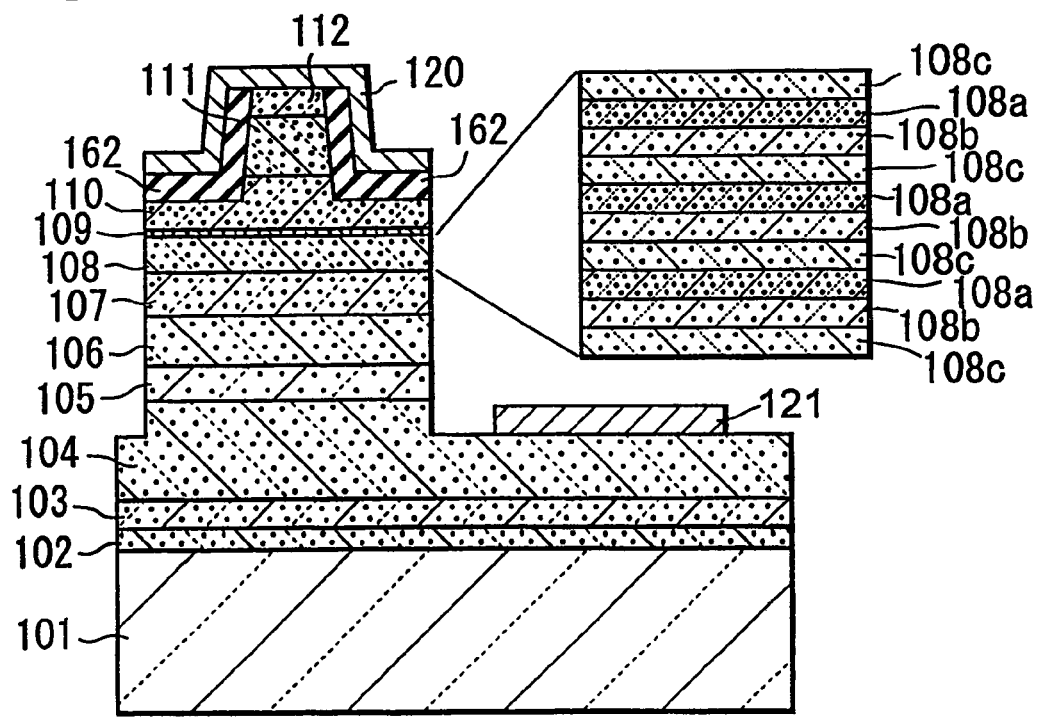
FIG. 16 is a schematic sectional view of laser device according to the fourth and fifth modified embodiments of the present invention.

The layers of an n-side contact layer to a p-side contact layer which are listed in Table 2 were laminated sequentially on the substrate. The stripe waveguide was formed by etching. Further, the n-side contact layer was exposed and the p- and n-electrodes were formed on the contact layer, so as to fabricate a laser device as shown in FIG. 15. In this case, the etching depth for the formation of the stripe waveguide was below the point where the thickness of the p-side second cladding layer was less than 0.1 μm (in the direction getting closer to the active layer) and above the active layer (the depth not reaching the active layer). In this drawing, the stripe ridge waveguide was formed in such a manner that the etching depth reached the optical waveguide layer 110.

For the resulting laser device, the driving voltage Vf tended to decrease as compared with for the laser device comprising a p-side first cladding layer, but the threshold current tended to increase 5 to 6 times higher. Therefore, most laser devices tended to show no oscillation.

TABLE 3

| | composition and thickness |
|---|---|
| n-side contact layer 104 | Si ($1 \times 10^{18}/cm^3$) doped GaN thickness: 4.5 μm |
| crack preventing layer 105 | Si doped $In_{0.06}Ga_{0.94}N$ thickness: 0.15 μm |
| n-side cladding layer 106 | an undoped $Al_{0.16}Ga_{0.84}N$ layer having a thickness of 25 angstroms and a Si ($1 \times 10^{19}/cm^3$) doped GaN layer having a thickness of 25 angstroms are laminated alternately total thickness: 1.2 μm |
| n-side optical waveguide layer 107 | undoped GaN thickness: 0.2 μm |
| active layer 108 | a barrier layer (B) made of Si-doped GaN having a thickness of 100 angstroms and a well layer (W) made of Si ($5 \times 10^{18}/cm^3$) doped $In_{0.2}Ga_{0.8}N$ having a thickness of 40 angstroms are laminated in the order of (B)-(W)-(B)-(W)-(B)-(W)-(B). total thickness: 420 angstroms |
| p-side optical waveguide layer 110 | Mg ($5 \times 10^{16}/cm^3$) doped GaN thickness: 0.2 μm |
| p-side second cladding layer 111 | a $Al_{0.15}Ga_{0.85}N$ layer having a thickness of 25 angstroms and a Mg ($1 \times 10^{19}/cm^3$) doped GaN layer having a thickness of 25 angstroms are laminated alternately total thickness: 0.7 μm |
| p-side contact layer 112 | Mg ($1 \times 10^{20}/cm^3$) doped GaN |

(Laser Device at a Longer Wavelength)

According to the present invention, the following layer construction may be preferable for the emission at a wavelength of not less than 450 nm, concretely of 450 to 520 nm, that is, at a long wavelength of blue to green color. However, the present invention is not limited to this wavelength range.

It is preferable to provide a middle layer between the well layer and the barrier layer in the active layer to enhance the oscillation characteristics at a longer wavelength.

For the emission at a shorter wavelength, concretely at a wavelength of not more than 450 nm, the active layer is in the quantum well structure comprising an well layer made of InGaN and barrier layers on the either side of said well layer, which have a band gap energy larger than that of the well layer. Concretely, a well layer made InGaN and a barrier layer made of AlGaInN having a mixed crystal ratio or a composition different from that of the well layer are used. As such a structure, a single quantum well structure (SQW) of barrier layer/well layer/barrier layer or a multi quantum well structure (MQW) formed by laminating a well layer and a barrier layer repeatedly have been used. But since the mixed crystal ratio or the composition is different between the well layer and the barrier layer, the temperature suitable to grow the layer is different between said layers, with the resulted that the growth tends to be difficult. In this case, the barrier layer is grown on the well layer at a higher temperature than that when the well layer is grown. In the case of a well layer containing In, when the temperature is raised for growth of the barrier layer, In is decomposed, resulting in a broad emission peak. Even when the barrier layer is grown at the same temperature as that when the well layer is grown, the temperature must be raised to grow the other layers (a cladding layer and a waveguide layer) having a good crystallinity after the formation of the active layer. As the oscillation wavelength becomes long, such a growth difficulty tends to be obvious. It is preferable to provide a middle layer in the above-mentioned wavelength range.

Therefore, the above-mentioned middle layer can resolve the problem due to the raise of temperature. When the middle layer is provided, the above-mentioned decomposition of In becomes partial. And the middle layer shows an uneven surface. These are the reasons why the driving voltage and the threshold voltage decreases drastically. This middle layer may be provided between the well layer and the barrier layer and may have a band gap energy larger than that of the barrier layer. If the active layer is in the MQW structure, it is necessary that the middle layer is formed on at least one well layer. It is preferable that the middle layers are formed on the all well layers, so as to solve the above-mentioned problem about the all barrier layers formed on the well layers.

The thickness of the middle layer may be preferably smaller than that of the barrier layer and be within the range of one atomic layer to 100 angstroms. When the thickness of the middle layer exceeds 100 angstroms, a mini-band is formed between the middle layer and the barrier layer and the oscillation characteristics tend to become worse. In this case, the thickness of the barrier layer is within the range of 10 angstroms to 400 angstroms. Further, the composition of the middle layer may be preferably $Al_uGa_{1-u}N$ ($0 \leq u \leq 1$), thereby the above-mentioned partial decomposition of In and the surface state of the middle layer can induce the drastic decrease of the driving voltage and threshold voltage. More preferably, the middle layer may be made of $Al_vGa_{1-v}N$ ($0.3 \leq v \leq 1$) to decrease the above-mentioned driving voltage and threshold voltage more drastically.

MODIFIED EXAMPLE 4

The layers of an n-side contact layer to a p-side contact layer which are listed in Table 4 were laminated sequentially on the substrate. Next, The stripe ridge waveguide having a stripe width of 1.8 μm was formed by etching from the p-side contact layer side to the depth where the thickness of the p-side first cladding layer was 500 angstroms. The other constructions were the same as in Examples. Further, the n-side contact layer was exposed and the p- and n-electrodes were formed on the contact layer. Then, the chip was removed out so as to obtain a laser device.

For the resulting laser device, the wavelength was 450 nm and the continuous oscillation of not less than 1000 hours was observed-at the threshold current density of 2.0 kA/cm² at room temperature. Thus, the device lifetime and the controllability in the transverse mode were superior to those in the laser device in which the etching depth during the formation of the stripe waveguide was over the point where the thickness of the p-side second cladding layer was 1 μm. And the controllability in the transverse mode and the aspect ratio in F.F.P. of the resulting laser device were also superior to those of the laser device in which the etching depth was below the point where the thickness of the p-side second cladding layer was 1 μm and did not reach the p-side optical waveguide layer.

TABLE 4

|  | composition and thickness |
|---|---|
| n-side contact layer 104 | Si ($1 \times 10^{18}$/cm³) doped GaN thickness: 4.5 μm |
| crack preventing layer 105 | Si doped $In_{0.06}Ga_{0.94}N$ thickness: 0.15 μm |
| n-side cladding layer 106 | an undoped $Al_{0.16}Ga_{0.84}N$ layer having a thickness of 25 angstroms and a Si ($1 \times 10^{19}$/cm³) doped GaN layer having a thickness of 25 angstroms are laminated alternately total thickness: 1.2 μm |
| n-side optical waveguide layer 107 | undoped GaN thickness: 750 angstroms |

TABLE 4-continued

|  | composition and thickness |
|---|---|
| active layer*[1] 108 | a barrier layer (B) made of undoped $In_{0.01}Ga_{0.99}N$ having a thickness of 100 angstroms, a middle layer (M) made of undoped $Al_{0.3}Ga_{0.7}N$ having a thickness of 10 angstroms and a well layer (W) made of undoped $In_{0.3}Ga_{0.7}N$ having a thickness of 50 angstroms are laminated in the order of (B)-(W)-(M)-(B)-(W)-(M)-(B)-(W)-(M)-(B). total thickness: 580 angstroms |
| p-side first cladding layer 109 | Mg ($1 \times 10^{20}$/cm³) doped GaN thickness: 100 angstroms |
| p-side optical waveguide layer 110 | Mg ($5 \times 10^{16}$/cm³) doped GaN thickness: 0.1 μm |
| p-side second cladding layer 111 | an undoped $Al_{0.2}Ga_{0.8}N$ layer having a thickness of 25 angstroms and a Mg ($1 \times 10^{19}$/cm³) doped GaN layer having a thickness of 25 angstroms are laminated alternately total thickness: 0.6 μm |
| p-side contact layer 112 | Mg ($1 \times 10^{20}$/cm³) doped GaN thickness: 150 angstroms |

*[1]The well layer (W) is grown at 820° C. and the middle layer (M) and the barrier layer (B) are grown at 880° C.

In the drawing, 108a designates a middle layer, 108b a well layer and 108c a barrier layer.

MODIFIED EXAMPLE 5

The laser device was fabricated in the same manner as in Modified Example 4, except that the device structure laminated on the substrate was in the following one.

For the resulting laser device, the oscillation wavelength was 510 nm. And a good laser device was obtained. The device characteristics tended to decrease a little as compared with in Modified Example 4, since the active layer in the MQW structure was change into that in the SQW structure. However, since the middle layer of the active layer was made of GaN, the effect due to the provided middle layer tended to decrease.

TABLE 5

|  | composition and thickness |
|---|---|
| n-side contact layer 104 | Si ($1 \times 10^{18}$/cm³) doped GaN thickness: 4.5 μm |
| crack preventing layer 105 | Si doped $In_{0.06}Ga_{0.94}N$ thickness: 0.15 μm |
| n-side cladding layer 106 | an undoped $Al_{0.16}Ga_{0.84}N$ layer having a thickness of 25 angstroms and a Si ($1 \times 10^{19}$/cm³) doped GaN layer having a thickness of 25 angstroms are laminated alternately total thickness: 1.2 μm |
| n-side optical waveguide layer 107 | undoped GaN thickness: 750 angstroms |
| active layer*[2] 108 | a barrier layer (B) made of $In_{0.28}Ga_{0.72}N$ having a thickness of 150 angstroms, a middle layer (M) made of undoped GaN having a thickness of 10 angstroms and a well layer (W) made of Si ($5 \times 10^{18}$/cm³) doped |

TABLE 5-continued

| | composition and thickness | |
|---|---|---|
| | $In_{0.50}Ga_{0.50}N$ having a thickness of 50 angstroms are laminated in the order of (B)-(W)-(M)-(B). total thickness: 360 angstroms | |
| p-side first cladding layer 109 | Mg ($1 \times 10^{20}/cm^3$) doped GaN thickness: 100 angstroms | |
| p-side optical waveguide layer 110 | Mg ($5 \times 10^{16}/cm^3$) doped GaN thickness: 0.1 μm | |
| p-side second cladding layer 111 | a $Al_{0.2}Ga_{0.8}N$ layer having a thickness of 25 angstroms and a Mg ($1 \times 10^{19}/cm^3$) doped GaN layer having a thickness of 25 angstroms are laminated alternately total thickness: 0.6 μm | |
| p-side contact layer 112 | Mg ($1 \times 10^{20}/cm^3$) doped GaN thickness: 150 angstroms | |

*[2] The well layer (W) is grown at 820° C. and the middle layer (M) and the barrier layer (B) are grown at 880° C.

INDUSTRIAL APPLICABILITY

According to the present invention, the laser device of a short wavelength can be realized. The laser devices according to the present invention can be applied to write and read light sources for DVD, CD and the like and light sources for communication such as optical fiber and the industrial applicability is very wide.

The invention claimed is:

1. A nitride semiconductor laser device comprising:
an n-type semiconductor layer;
an active layer having a multi-quantum well (MQW) structure, including a plurality of well layers, each containing In, and a plurality of barrier layers, the active layer being provided on the n-type semiconductor layer; and
a p-type semiconductor layer provided on the active layer;
wherein the active layer comprises at least one three-layered structure, each said three-layered structure having one of the well layers, a middle layer having a band gap energy larger than that of one of the barrier layers, the middle layer being adjacent to said one of the well layers residing on the side of the p-type semiconductor layer, said one of the barrier layers being adjacent to the middle layer residing on the side of the p-type semiconductor layer.

2. The nitride semiconductor laser device according to claim 1, wherein a thickness of the middle layer is smaller than that of the barrier layer.

3. The nitride semiconductor laser device according to claim 1, wherein a thickness of the middle layer is within a range of one atomic layer to 100 angstroms.

4. The nitride semiconductor laser device according to claim 1, wherein said middle layer is composed of $Al_uGa_{1-u}N$ ($0 \leq u \leq 1$).

5. The nitride semiconductor laser device according to claim 1, wherein said middle layer is composed of $Al_uGa_{1-u}N$ ($0.3 \leq u \leq 1$).

6. The nitride semiconductor laser device according to claim 1, wherein a stripe-shaped waveguide region is provided in the p-type semiconductor layer.

7. The nitride semiconductor laser device according to claim 1, wherein an oscillation wavelength of the laser device is within a range of 450 nm to 520 nm.

8. The nitride semiconductor laser device according to claim 1, wherein another one of the barrier layers is adjacent to the n-type semiconductor layer.

* * * * *